(12) United States Patent
Yagishita et al.

(10) Patent No.: US 6,465,823 B1
(45) Date of Patent: Oct. 15, 2002

(54) DYNAMIC THRESHOLD VOLTAGE METAL INSULATOR SEMICONDUCTOR EFFECT TRANSISTOR

(75) Inventors: Atsushi Yagishita; Tomohiro Saito; Toshihiko Iinuma, all of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/609,713

(22) Filed: Jun. 30, 2000

(30) Foreign Application Priority Data

Jun. 30, 1999 (JP) .............................. 11-186995
Jun. 12, 2000 (JP) ........................ 2000-175512

(51) Int. Cl.[7] .......................................... H01L 21/336
(52) U.S. Cl. ...................... 257/288; 257/353; 257/642; 257/901
(58) Field of Search ................. 257/288, 353, 257/642, 901; 438/284, FOR 190, FOR 193

(56) References Cited

U.S. PATENT DOCUMENTS 4,996,574 A * 2/1991 Shirasaki
6,165,828 A * 12/2000 Forbes et al.
6,177,299 B1 * 1/2001 Hsu et al.

FOREIGN PATENT DOCUMENTS

| JP | 03205869 A | * | 9/1991 |
| JP | 09162302 A | * | 6/1997 |
| JP | 10-242477 | | 9/1998 |

OTHER PUBLICATIONS

Wong et al., "A 1V CMOS Digital Circuits With Double-Gate-Driven MOSFET", IEEE International Solid-State Circuits Conference Digest of Technical Papers, Feb. 1997, pp. 292, 293, and 473.

* cited by examiner

Primary Examiner—George Fourson
Assistant Examiner—Thanh V Pham
(74) Attorney, Agent, or Firm—Finnegan, Henderson, Farabow, Garrett & Dunner, L.L.P.

(57) ABSTRACT

In a semiconductor device in which the gate electrode of a MISFET formed on a semiconductor substrate is electrically connected to a well region under the channel of the MISFET, the MISFET is formed in an island-shaped element region formed on the semiconductor substrate, and electrical connection between the gate electrode of the MISFET and the well region in the semiconductor substrate is done on the side surface of the island-shaped element region.

5 Claims, 55 Drawing Sheets

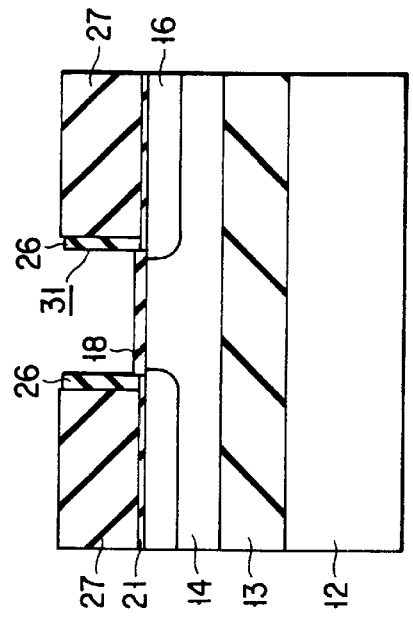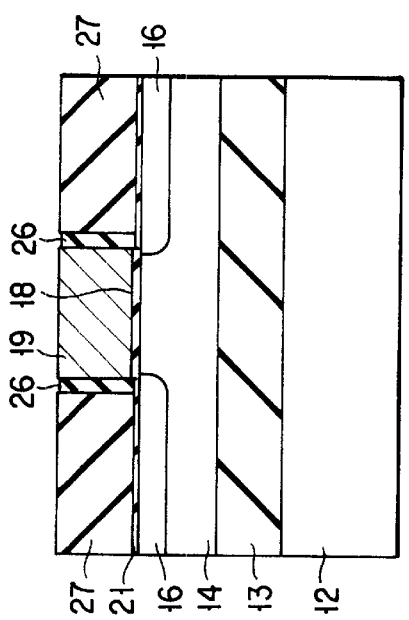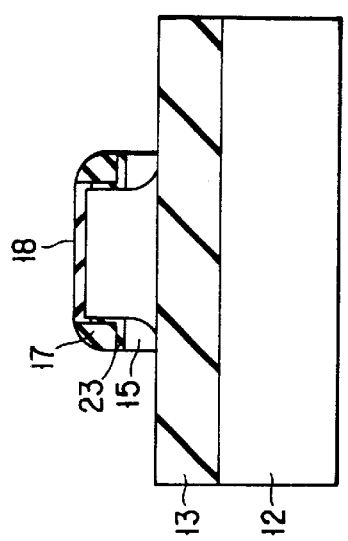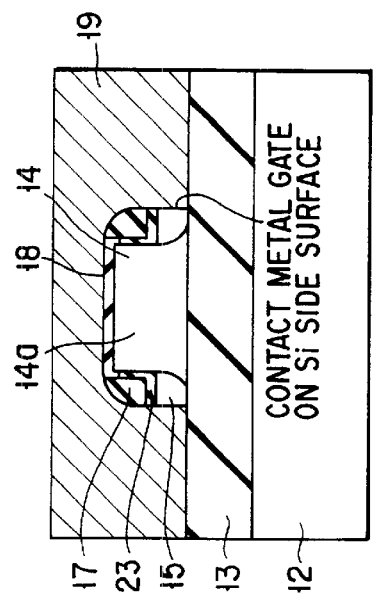

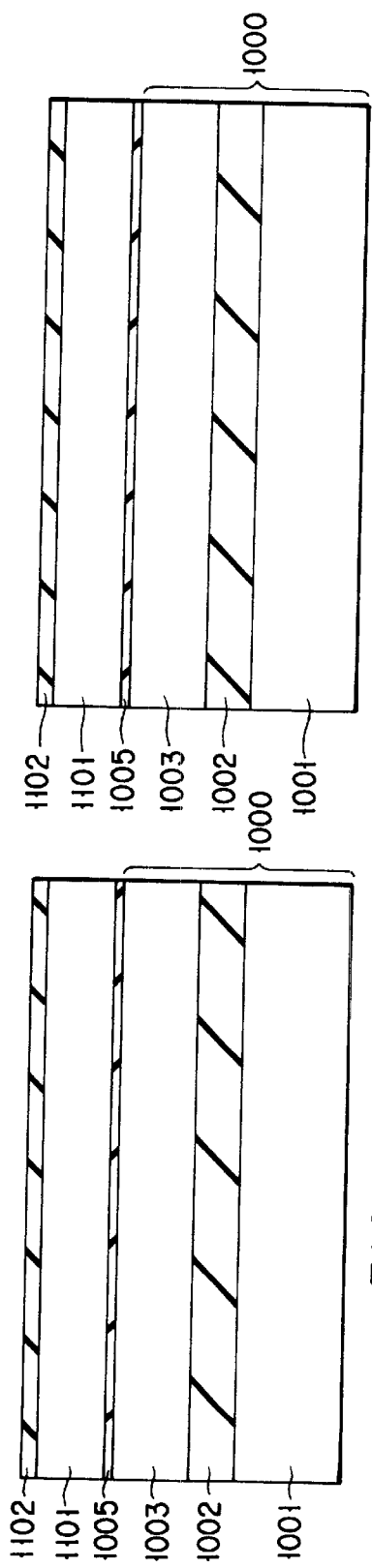
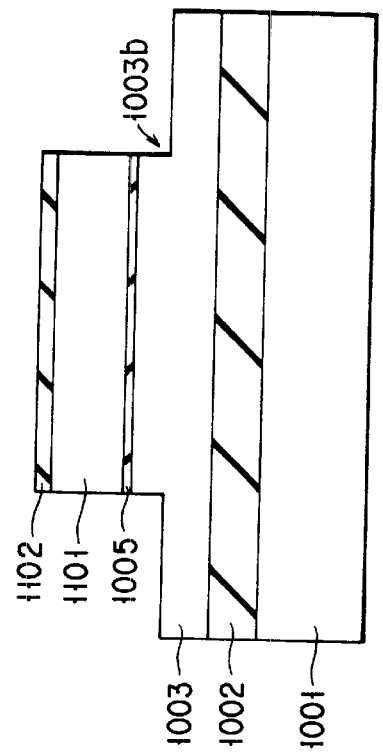
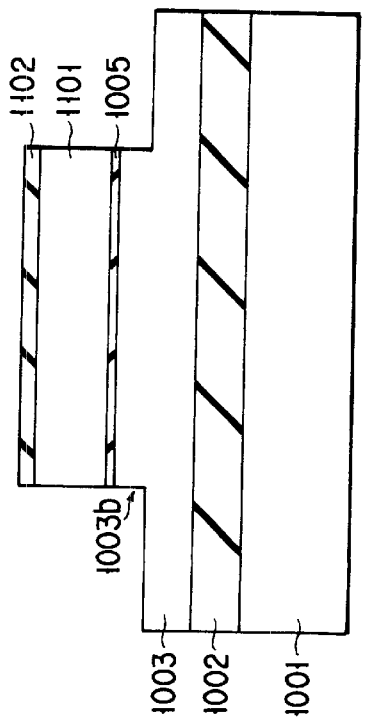
FIG. 8A
FIG. 8B
FIG. 9A
FIG. 9B

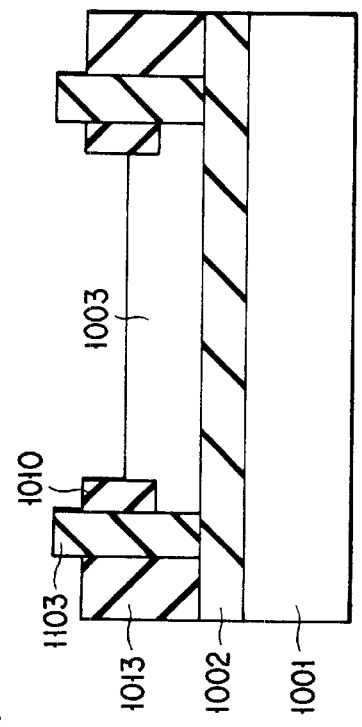
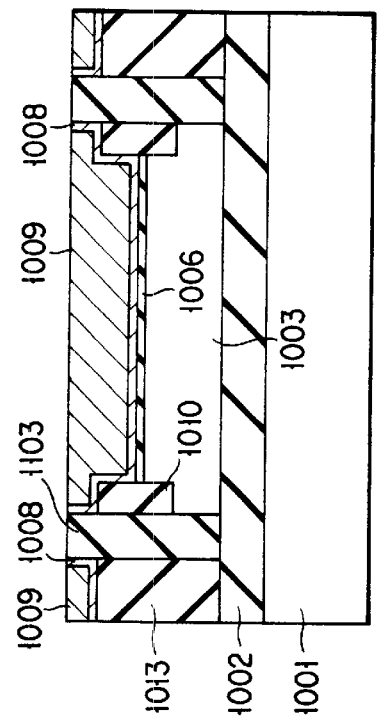
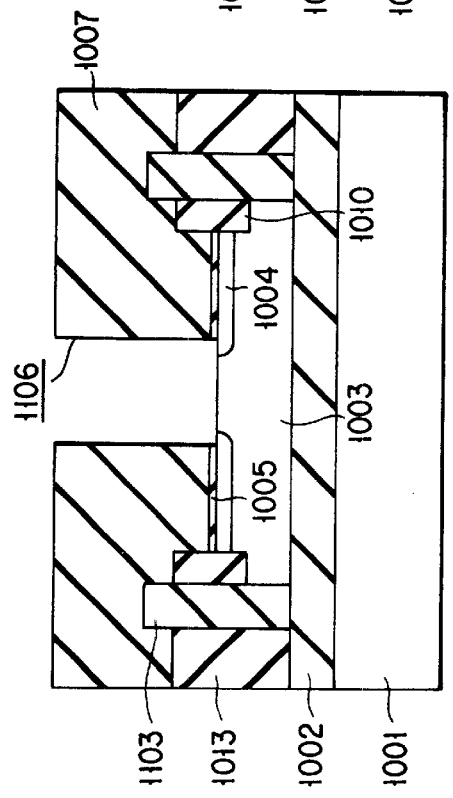
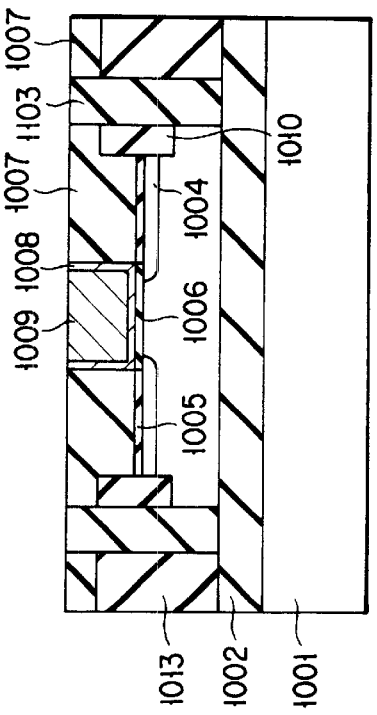

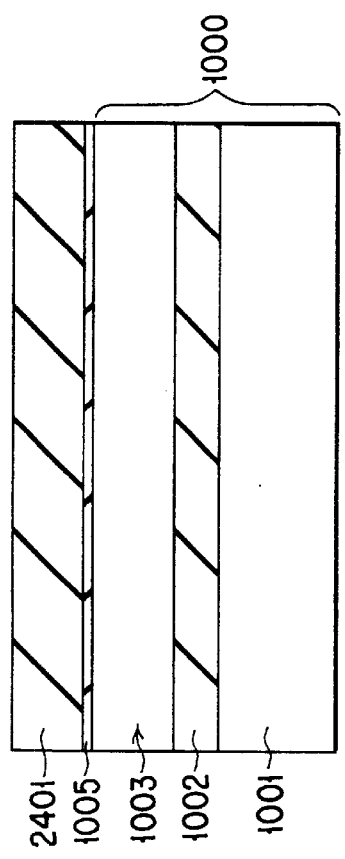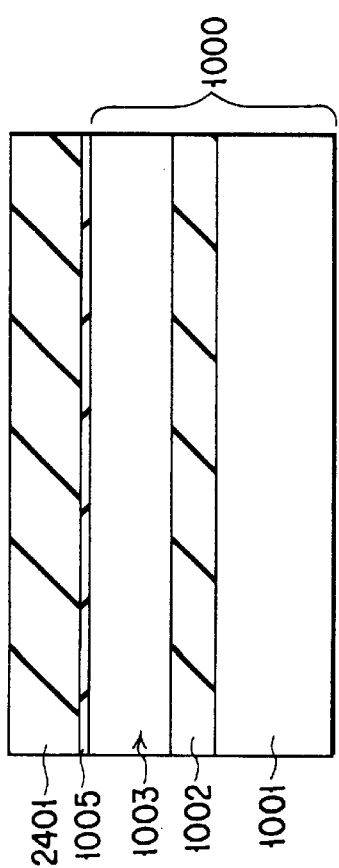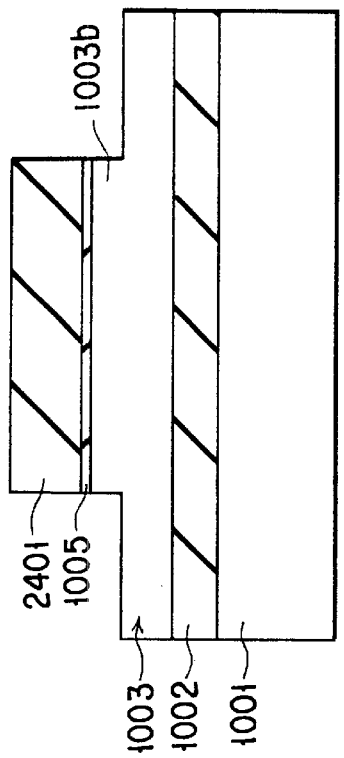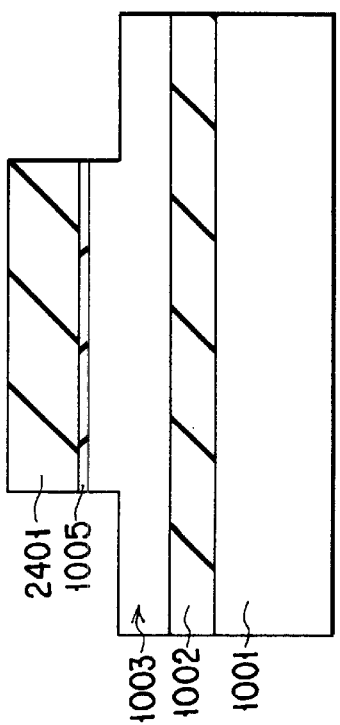
FIG. 17A
FIG. 17B
FIG. 16A
FIG. 16B

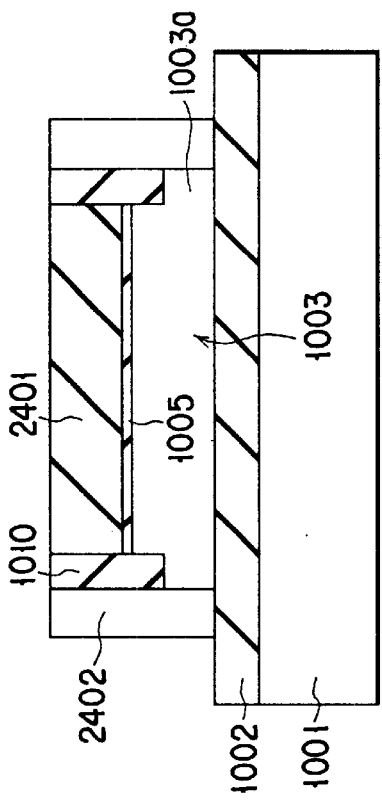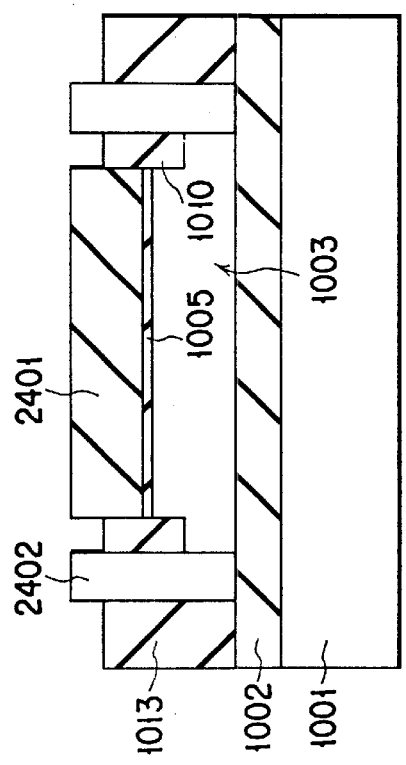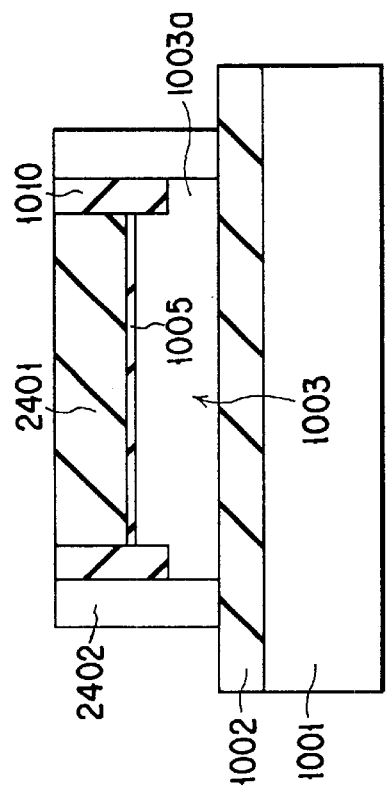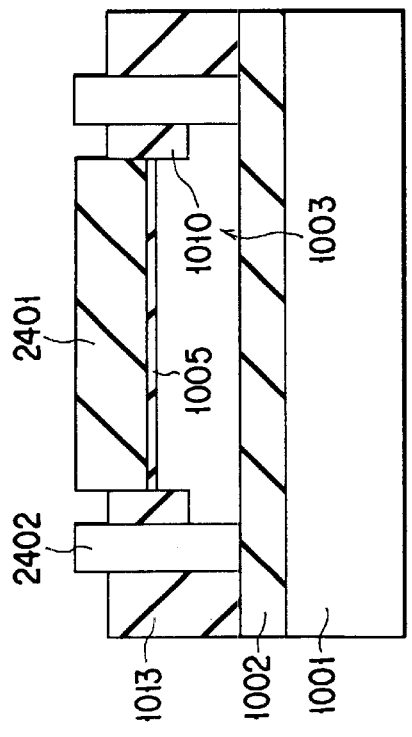

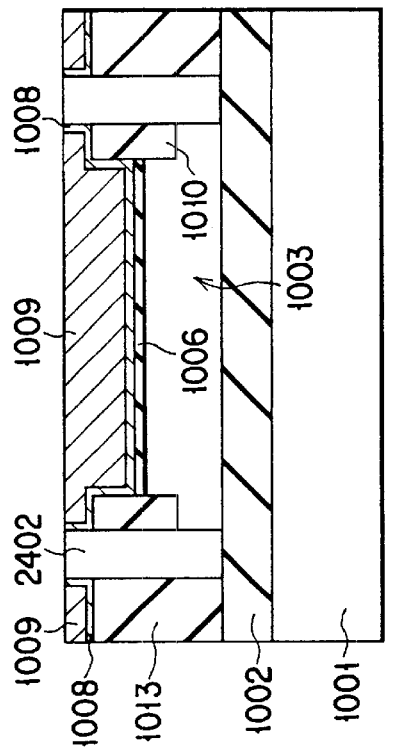
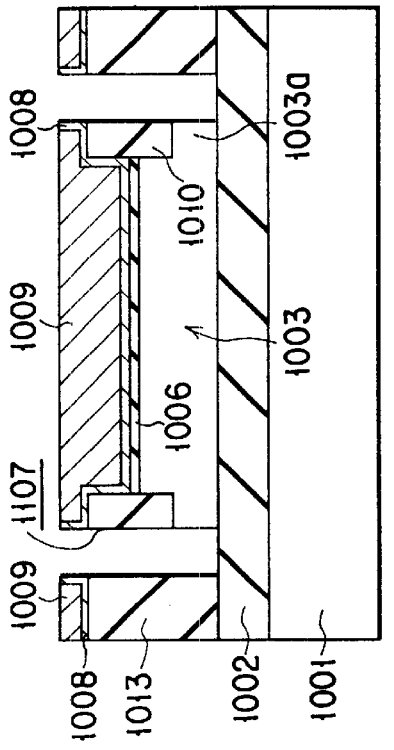
FIG. 17M
FIG. 17N
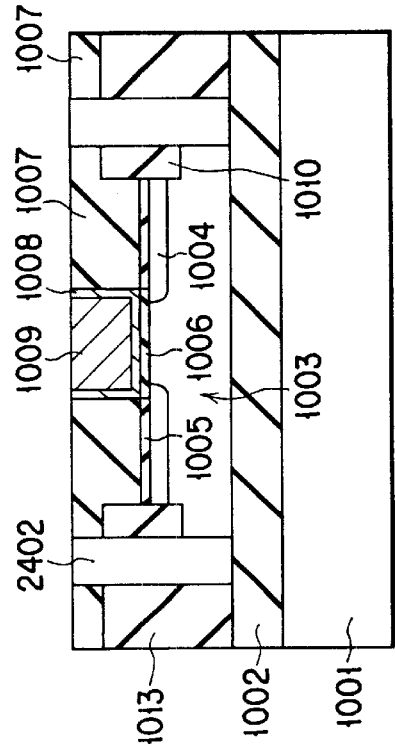
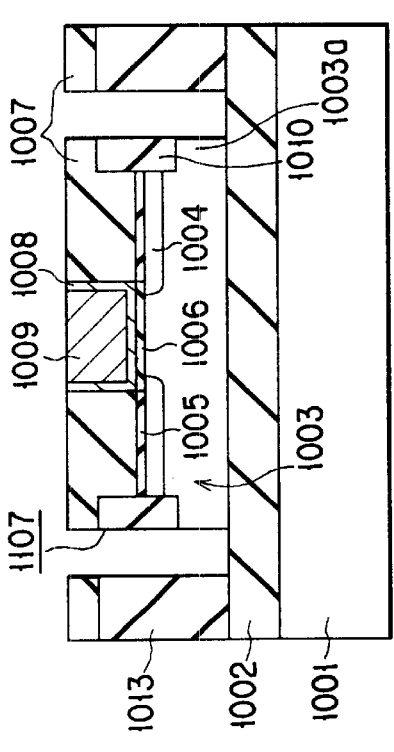
FIG. 16M
FIG. 16N

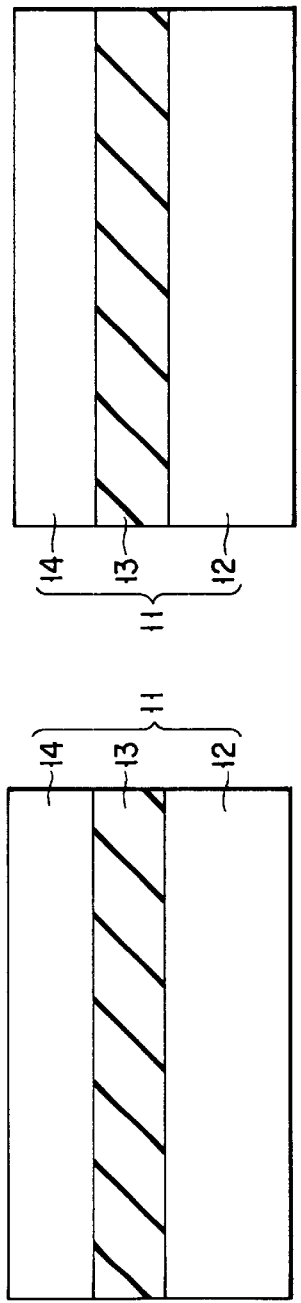
FIG. 21A
FIG. 22A
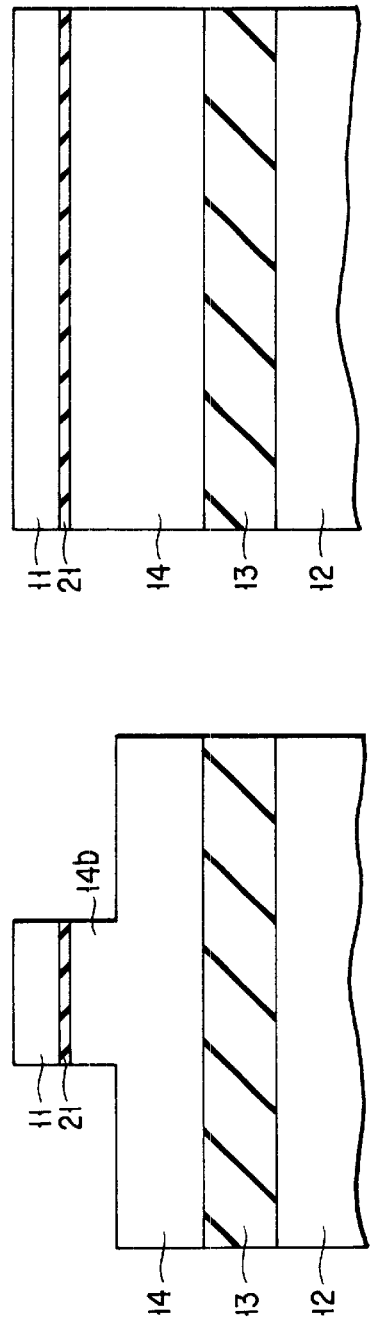
FIG. 22B
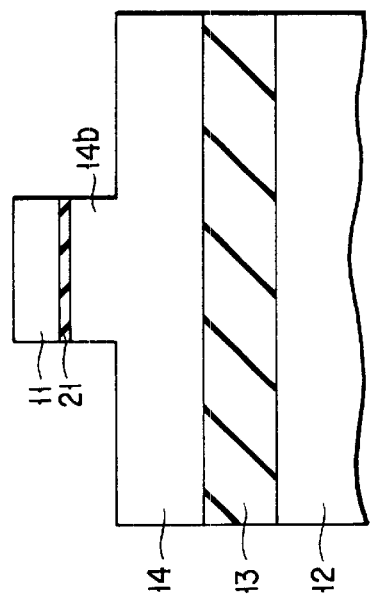
FIG. 21B

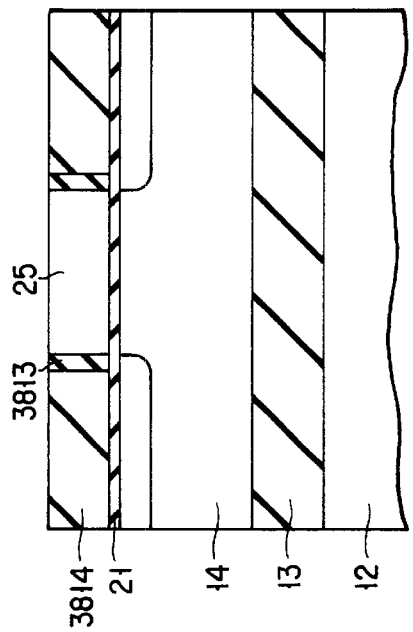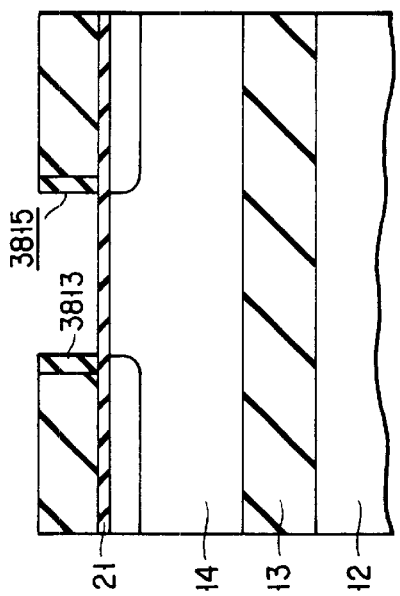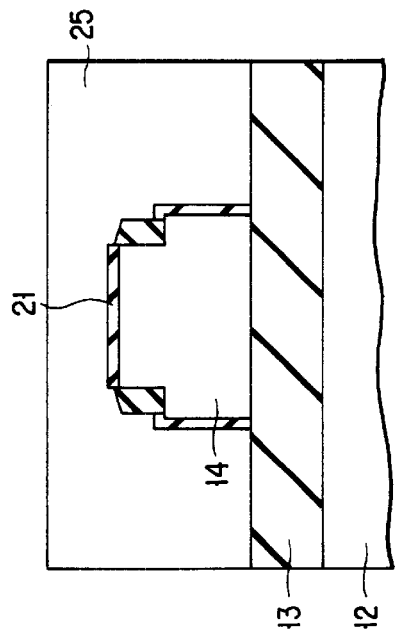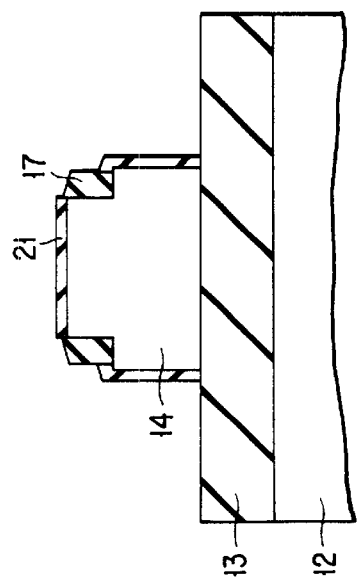

DYNAMIC THRESHOLD VOLTAGE METAL INSULATOR SEMICONDUCTOR EFFECT TRANSISTOR

CROSS-REFERENCE TO RELATED APPLICATIONS

This application is based upon and claims the benefit of priority from the prior Japanese Patent Applications No. 11-186995, filed Jun. 30, 1999; and No. 2000-175512, filed Jun. 12, 2000, the entire contents of which are incorporated herein by reference.

BACKGROUND OF THE INVENTION

The present invention relates to a semiconductor device in which a well under the channel of a MISFET is electrically connected to a gate electrode, and a method of manufacturing the same.

Conventionally, to reduce power consumption of a semiconductor device, a power supply voltage $V_{dd}$ is continuously dropped. However, a threshold voltage $V_{th}$ of a MISFET is not so largely dropped in order to prevent any increase in OFF-current. Hence, a driving capability (drain current) $I_d$ of a transistor tends to be low.

As a device for solving this problem, a DTMISFET (Dynamic Threshold Voltage Metal insulator Semiconductor Field Effect Transistor) has been proposed (Fariborz Assaderaghi, et al, "Dynamic threshold-voltage MOSFET (DTMOS) for Ultra-Low voltage VLSI", IEEE Trans. Electron Devices, Vol. 44, pp. 414–421, 1997).

The structure of a DTMISFET (DTMOSFET) will be described with reference to FIGS. 26A and 26B. FIG. 26A is a perspective view showing the structure of a conventional DTMISFET. FIG. 26B is a cross-sectional view showing a section taken along a line V–V' in FIG. 26A. Referring to FIGS. 26A and 26B, reference numeral 3500 denotes an SOI substrate; 3501, an Si substrate; 3502, an insulating layer; 3503, an Si-body (well region); 3504, an n+-type source and drain; 3505, a gate insulating film; 3506, a gate electrode made of polysilicon; and 3507, a p+type diffusion layer serving as a contact to a metal plug 3508 connected to the gate electrode.

A DTMISFET is a MISFET in which the gate electrode and the well (Si-body) under the channel are electrically connected and has an advantage that although a power supply voltage $V_{dd}$ is low, the driving capability is large, and the OFF current is small. The reason for this advantage is explained by the principle of operation in which the gate voltage is transmitted to the substrate to generate the substrate bias effect, so a threshold voltage $V_{th}$ is low in the transistor ON state and high in the OFF state.

The device also has the following advantages.

(1) One of reasons why the DTMISFET can realize a high driving capability is that the vertical electric field perpendicular to the channel plane is small, and carrier mobility is large.

(2) The S-factor always has an ideal value of approximately 60 mV/decade (best value at room temperature) in a region where no short channel effect occurs.

(3) A low threshold voltage $V_{th}$ that is suggested to be unrealizable by a MISFET using a metal gate electrode (e.g., gate using TiN) with a midgap work function can be realized.

However, a DTMISFET has the following disadvantages and therefore is not put into practical use for a long time.

(1) To form the contact area (contact hole and metal plug) connecting between polysilicon gate electrode and the Si-body, the device occupation area increases to result in complex manufacturing process. As shown in FIG. 27, when two contacts for connecting the gate and well region are formed for one transistor, the device occupation area. increases. Contact holes are formed on both the left and right sides of the Si-body 3502 to reduce the resistance in the Si-body portion. The same reference numerals as in FIGS. 26A and 26B denote the same parts in FIG. 27, and a detailed description thereof will be omitted.

(2) The high body resistance causes RC delay in the gate wiring, which readily adversely affects the circuit operation.

(3) The source/drain junction capacitance is larger than that of a conventional MOSFET.

(4) A forward bias applied to the p-n junction between the source/drain and the Si-body, and when the power supply voltage $V_{dd}$ exceeds about 0.7 V, the leakage current increases to make the device unusable.

In recent years, to reduce the p-n junction leakage between a source/drain and an Si-body, an attempt of connecting a gate and body via a capacitor has been proposed (IEEE International Solid-State Circuits Conference Digest of Technical Papers, p. 292, 1997). However, an increase in device area due to capacitor formation poses a serious problem (as described in the above reference, a p-n junction diode also need to be formed when we connect a gate and body via a capacitor).

BRIEF SUMMARY OF THE INVENTION

It is an object of the present invention to provide a semiconductor device capable of reducing the occupation area of a DTMISFET and simplifying the manufacturing process, and a method of manufacturing the same.

In order to achieve the above object, the present invention has the following arrangements.

According to the present invention, there is provided a semiconductor device formed on a semiconductor substrate in which a gate electrode of a MISFET is electrically connected to a well region under a channel of the MISFET, wherein the MISFET is formed in an island-shaped element region formed on the semiconductor substrate, and electrical connection between the gate electrode of the MISFET and the well region are electrically connected via a sides of the island-shaped element.

According to the present invention, there is provided a semiconductor device in which a semiconductor substrate including an island-shaped element region comprised of a lower structure and an upper structure formed on the lower structure and having a smaller cross-sectional area parallel to a surface of the substrate than that of the lower structure; a gate insulating film formed on an upper surface of the upper structure of the element region; a sidewall insulating film formed on an upper surface of the lower structure and along a side surface of the upper structure of the element region; and a gate electrode connected to an upper surface of the gate insulating film, an upper surface of the sidewall insulating film, and a side surface of the lower structure of the element region.

According to the present invention, there is provided a semiconductor device in which a semiconductor substrate including an island-shaped element region composed of a lower structure and an upper structure formed on the lower structure and having a smaller cross-sectional area parallel to a surface of the substrate than that of the lower structure; a gate insulating film formed on an upper surface of the upper structure of the element region; a gate electrode formed on the gate insulating film; an element sidewall insulating film formed along a side of the upper structure of the element region and a side of the gate electrode that have an upper surface lower than an upper surface of the gate electrode; and a contact electrode formed on a side of the lower structure of the element region and a side of the sidewall insulating film and electrically connected to the gate electrode and the side of lower structure of the element region.

According to the present invention, there is provided a semiconductor device in which a semiconductor substrate including an island-shaped element region comprised of a lower structure and an upper structure formed on the lower structure and having a smaller cross-sectional area parallel to a surface of the substrate than that of the lower structure; a gate insulating film formed on an upper surface of the upper structure of the element region; a sidewall insulating film formed on a side of the upper structure of the element region; a capacitor insulating film formed on each of opposite sides of the lower structure of the element region; a gate electrode formed on the gate insulating film; and a capacitor electrode formed on the capacitor insulating film and electrically connected to the gate electrode.

According to the present invention, there is provided a semiconductor device formed on a semiconductor substrate in which a gate electrode of a MISFET is electrically connected to a well region under a channel of the MISFET, wherein the MISFET is formed on part of a side of an island-shaped element region formed on the semiconductor substrate, and electrical connection between the gate electrode of the MISFET and the well region in the semiconductor substrate is done on an upper surface of the island-shaped element region.

According to the present invention, there is provided a semiconductor device in which a semiconductor substrate including an island-shaped element region composed of a lower structure and an upper structure formed on the lower structure and having a smaller cross-sectional area parallel to a surface of the substrate than that of the lower structure; a pair of gate insulating films formed on opposite sides of the lower structure of the element region, respectively; a sidewall insulating film formed on a side surface of the upper structure of the element region; a gate electrode formed on the pair of gate insulating films, an upper surface of the sidewall insulating film, and an upper surface of the upper structure of the element region; and source and drain regions formed on opposite side surfaces of the lower structure of the element region across the pair of gate insulating films, wherein bottom surfaces of the source and drain diffusion layers formed on side surfaces of the element region are in contact with each other.

In the above six semiconductor devices, the gate electrode is preferably composed of a metal material.

According to the present invention, there is provided a method of manufacturing a semiconductor device, comprising the steps of patterning a semiconductor substrate to form an island-shaped element region comprised of a lower structure and an upper structure formed on the lower structure and having a smaller cross-sectional area parallel to a surface of the substrate than that of the lower structure, forming an insulating film along a side of the upper structure and an upper surface of the lower structure of the element region, forming a disposable gate in a region on upper where a gate electrode is to be formed, forming a source and drain in the upper structure of the element region, forming an interlayer insulating film on the semiconductor substrate to expose an upper surface of the disposable gate close both sides of the disposable gate, removing the disposable gate to form a gate groove, forming a gate insulating film on an upper surface of the upper structure of the element region, the upper surface being exposed to a bottom surface of the gate groove, and forming a gate electrode buried in the gate groove and electrically connected to a side surface of the lower structure of the element region.

According to the present invention, there is also provided a method of manufacturing a semiconductor device, comprising the steps of forming a mask pattern in a region, where a source, drain, and channel of a MIS transistor are to be formed, on an upper surface of a semiconductor layer formed on stacked a semiconductor substrate and an insulating layer, etching the semiconductor layer using the mask pattern as a mask to form a convex on the semiconductor layer, forming a first sidewall insulating film on a side surface of the convex of the semiconductor layer, etching the semiconductor layer using the mask pattern and the first sidewall insulating film as a mask to expose the insulating layer, thereby forming an island-shaped element region comprised of an upper structure formed from the convex and a lower structure formed under the upper structure, forming a second sidewall insulating film on a side surface of the lower structure of the element region and a side surface of the first sidewall insulating film, forming a disposable gate, on upper surfaces of the insulating layer where the gate electrode is to be formed, the second sidewall insulating film, the first sidewall insulating film, and the upper structure of the element region, forming the source and drain in the upper surface of the upper structure of the element region, forming an insulating film to cover the disposable gate and planarizing an upper surface of the insulating film to expose the disposable gate, removing the disposable gate to form a gate groove in which the side surface of the lower structure of the element region is exposed, forming a gate insulating film on an upper surface of the upper structure of the element region on a bottom surface of the gate groove, and forming a gate electrode buried in the gate groove.

According to the present invention, there is also provided a method of manufacturing a semiconductor device, comprising the steps of. forming a mask pattern in a region on a semiconductor layer on a semiconductor substrate, where a source, drain, and channel of a MIS transistor will be formed, etching the semiconductor layer using the mask pattern as a mask to. form a convex on the semiconductor layer, forming a first sidewall insulating film on a side of the convex of the semiconductor layer, etching the semiconductor layer using the mask pattern and the first sidewall insulating film as a mask to expose the insulating layer, thereby forming an island-shaped element comprised of an upper structure formed from the convex and a lower structure formed under the upper structure, forming an insulating layer to cover an upper surface of the semiconductor substrate outside the element region so as to expose an upper end portion of a side surface of the lower structure of the element region, forming a second sidewall insulating film on a side surface of the lower structure of the element region and a side surface of the first sidewall insulating film, forming a disposable gate, on upper surfaces of the insulating layer where the gate electrode is to be formed, the second sidewall insulating film, the first sidewall insulating film, and the upper structure of the element region, forming the source and drain in the upper surface of the upper structure of the element region, forming an insulating film to cover the disposable gate and planarizing an upper surface of the insulating film to expose the disposable gate, removing the disposable gate to form a gate groove connected to the side surface of the lower structure of the element region, forming a gate insulating film on an upper surface of the upper structure of the element region on a bottom surface of the gate groove, and forming a gate electrode buried in the gate groove.

According to the present invention, there is also provided a method of manufacturing a semiconductor device, comprising the steps of forming a mask pattern in a region, where a source, drain, and channel region of a MIS transistor are to be formed, on an upper surface of a semiconductor layer formed on stacked a semiconductor substrate and an insulating layer, etching the semiconductor layer to a predetermined depth using the mask pattern as an etching mask to form a convex on the semiconductor layer, forming an element sidewall insulating film on side surfaces of the mask pattern and the convex of the semiconductor layer, etching the semiconductor layer using the mask pattern and the element sidewall insulating film as a mask to expose the insulating layer, thereby forming an island-shaped element region comprised of an upper structure formed from the convex and a lower structure formed under the upper structure, forming a dummy contact on a side surface of the lower structure of the element region and a side surface of the element sidewall insulating film, forming a first insulating film around the dummy contact, recessing an upper surface of the element sidewall insulating film, partially or completely removing the mask pattern, forming a disposable gate connected to the dummy contact on an upper surface of a region where a gate electrode is to be formed, including the channel region of the upper structure of the element region, forming the source and drain in the upper structure of the element region using the disposable gate as a mask, forming a second insulating film on the semiconductor substrate to cover a side surface of the disposable gate and expose an upper surface of the disposable gate, removing the disposable gate to form a gate groove in which the dummy contact is exposed, forming a gate insulating film in the gate groove, forming a gate electrode buried in the gate groove, exposing the upper surface of the dummy contact, removing the dummy contact to form a contact trench in which the side surface of the lower structure of the element region is exposed, and forming a contact electrode buried in the contact trench.

According to the present invention, there is provided a method of manufacturing a semiconductor device, comprising the steps of forming a mask pattern in a region, where a source, drain, and channel region of a MIS transistor are to be formed, on a semiconductor substrate, etching the semiconductor substrate to a predetermined depth using the mask pattern as an etching mask to form a convex on the semiconductor substrate, forming an element sidewall insulating film on side surfaces of the mask pattern and the convex, etching the semiconductor layer using the mask pattern and the element sidewall insulating film as a mask to form an island-shaped element region comprised of an upper structure formed from the convex and a lower structure formed under the upper structure, forming a dummy contact on a side surface of the lower structure of the element region and a side surface of the element sidewall insulating film, forming a first insulating film around the dummy contact, recessing an upper surface of the element sidewall insulating film, partially or completely removing the mask pattern, forming a disposable gate connected to the dummy contact on an upper surface of a region where a gate electrode is to be formed, including the channel region of the upper structure of the element region, forming the source and drain in the upper structure of the element region using the disposable gate as a mask, forming a second insulating film on the semiconductor substrate to cover a side surface of the disposable gate and expose an upper surface of the disposable gate, removing the disposable gate to form a gate groove in which the dummy contact is exposed, forming a gate insulating film in the gate groove, forming a gate electrode buried in the gate groove, exposing the upper surface of the dummy contact, removing the dummy contact to form a contact trench in which part of a sidewall is connected to the side surface of the lower structure of the element region, and forming a contact electrode buried in the contact trench.

According to the present invention, there is provided a method of manufacturing a semiconductor device, comprising forming a mask pattern in a region on a semiconductor substrate, where a source, drain, and channel region of a MIS transistor are to be formed; etching the semiconductor substrate to a predetermined depth using the mask pattern as a mask to form a convex on the semiconductor substrate; forming a sidewall insulating film on side surfaces of the mask pattern and the convex; etching the semiconductor layer using the mask pattern and the element sidewall insulating film as a mask to form an island-shaped element region comprised of an upper structure formed from the convex and a lower structure formed under the upper structure; forming a disposable gate in a region on the semiconductor substrate, where a gate electrode is to be formed; forming the source and drain in the upper structure of the element region; forming an interlayer insulating film on the semiconductor substrate in contact with the disposable gate to expose an upper surface of the disposable gate; removing the disposable gate to form a gate groove in which the element region is partially exposed; depositing an insulating film on an upper surface of the element region exposed to a bottom surface of the gate groove so as to form a gate insulating film on the upper structure of the element region and form a capacitor insulating film on a side surface of the lower structure of the element region; and burying an electrode pattern in the gate groove to form a gate electrode and capacitor electrode.

According to the present invention, there is provided a method of manufacturing a semiconductor device, comprising forming a mask pattern in a region on a semiconductor substrate, where a source, drain, and channel region of a MIS transistor are to be formed; etching the semiconductor substrate to a predetermined depth using the mask pattern as a mask to form a convex on the semiconductor substrate; forming a sidewall insulating film on side surfaces of the mask pattern and the convex; etching the semiconductor layer using the mask pattern and the element sidewall insulating film as a mask to form an island-shaped element region comprised of an upper structure formed from the convex and a lower structure formed under the upper structure; forming a disposable gate in a region on the semiconductor substrate, where a gate electrode is to be formed; forming the source and drain in a side portion of the lower structure of the element region; forming an interlayer insulating film on the semiconductor substrate in contact with a side portion of the disposable gate to expose an upper surface of the disposable gate; removing the disposable gate to form a gate groove in which the element region is partially exposed; forming a gate insulating film on a side surface of the lower structure of the element region exposed to a bottom surface of the gate groove; and forming a gate electrode buried in the gate groove.

The present invention with the above arrangements has the following functions and effects.

Since the gate electrode and well region are electrically connected on the side surface of the island-shaped element region, the planar area of a contact formation portion is unnecessary,. unlike the conventional DTMISFET, so the device occupation area can be largely reduced. In addition, since the portion for electrically connecting the gate electrode and well region is formed by self-alignment, the manufacturing process can be simplified.

In addition, when the gate and Si-body are electrically connected via a capacitor formed on the side surface of an island-shaped element region Si, the area can be reduced, and the leakage current between the source/drain and the Si-body can be largely decreased.

Furthermore, since the source and drain diffusion layers are formed to sandwich two gate electrodes formed at the side portion of the island-shaped element region, and the bottom portions of the source and drain diffusion layers come into contact with each other, the p-n junction area can be reduced, and the leakage current between the source/drain and the Si-body can be largely decreased.

When a metal electrode is used as a gate electrode, electrical connection to both an n-type well and a p-type well is facilitated. In use of a polysilicon gate electrode, when a gate is to be connected to a well region of conductivity type opposite to that of the gate, a metal plug must be formed therebetween. However, when a metal gate electrode is used, no metal plug need be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2L are cross-sectional views (corresponding to the section taken along the line X–X' in FIG. 1A) showing the steps in manufacturing the DTMISFET according to the first embodiment of the present invention;

FIGS. 3A to 3L are cross-sectional views (corresponding to a section taken along a line XI–XI' in FIG. 1A) showing the steps in manufacturing the DTMISFET according to the first embodiment of the present invention;

FIGS. 21A to 21J are cross-sectional views (corresponding to the section taken along the line X–X' in FIG. 20A) showing the steps in manufacturing the DTMISFET according to the eighth embodiment of the present invention;

FIGS. 22A to 22J are cross-sectional views (corresponding to a section taken along a line XI–XI' in FIG. 20A) showing the steps in manufacturing the DTMISFET according to the eighth embodiment of the present invention;

FIG. 26B is a cross-sectional view showing a section taken along a line V–V' in FIG. 26A; and.

DETAILED DESCRIPTION OF THE INVENTION

The embodiments of the present invention will be described below with reference to the accompanying drawings.

First Embodiment

Figure 1A:
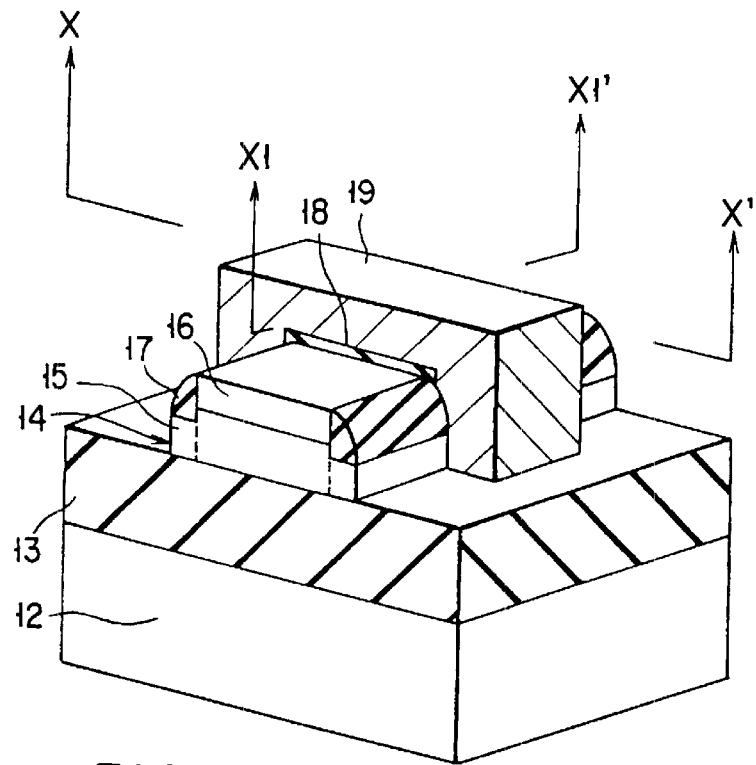
FIG. 1A is a perspective view showing the structure of a DTMISFET according to the first embodiment of the present invention.

FIG. 1A is a perspective view showing the structure of a DTMISFET according to the first embodiment of the present invention. FIG. 1 B is a cross-sectional view showing a section taken along a line X–X' in FIG. 1A.

Figure 1B:
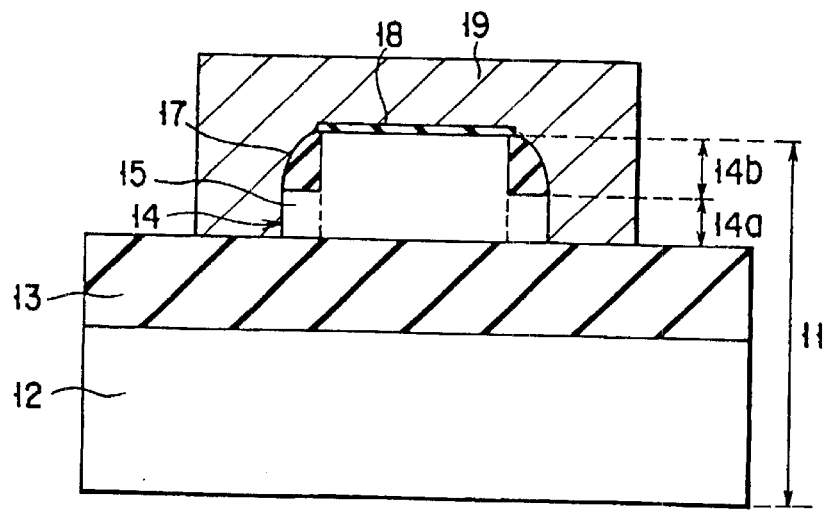
FIG. 1B is a cross-sectional view showing a section taken along a line X–X' in FIG. 1A.

As shown in FIGS. 1A and 1B, in this embodiment, an SOI substrate 11 in which a single-crystal Si substrate 12, silicon oxide film 13, and island-shaped Si-body (well region) 14 are sequentially stacked is used as a semiconductor substrate. The island-shaped Si-body 14 is comprised of a lower structure 14a and an upper structure 14b formed on the lower structure 14a and having a smaller cross-sectional area parallel to the surface of the substrate than that of the lower structure 14a. The upper surface of the lower structure 14a is exposed to the periphery of the upper structure 14b.

A sidewall insulating film 17 is formed on the side surfaces of the lower structure 14a and upper structure 14b of the island-shaped Si-body 14. A gate insulating film 18 is formed on part of the upper structure 14b of the Si-body 14. A metal gate electrode 19 is formed to come into contact with the upper surface of the gate insulating film 18 and the side surfaces of the sidewall insulating film 17 and lower structure 14a of the Si-body 14. A source and drain 16 are formed in the upper surface layer of the Si-body 14 so as to sandwich the gate electrode 19 from both sides.

As described above, the metal gate electrode 19 and the Si-body 14 in the element region are electrically connected to each other through the side surface of the lower structure 14a of the island-shaped Si-body 14.

As the gate insulating film 18, a high-permittivity film of $Ta_2O_5$, $TiO_2$, $Si_3N_4$, $HfO_2$, $ZrO_2$, $La_2O_3$, $Gd_2O_3$, $Y_2O_3$, $CaF_2$, $CaSnF_2$, $CeO_2$, Yttria Stabilized Zirconia, $Al_2O_3$, $ZrSiO_4$, $HfSiO_4$, $Gd_2SiO_5$, $2La_2O_3 \cdot 3SiO_2$, or the like is preferably used.

A method of manufacturing the device of this embodiment will be described next. FIGS. 2A to 2L and 3A to 3L are cross-sectional views showing the steps in manufacturing the DTMISFET shown in FIGS. 1A and 1B. FIGS. 2A to 2L are cross-sectional views corresponding to the section taken along the line X–X' in FIG. 1A. FIGS. 3A to 3L are cross-sectional views corresponding to a section taken along a line XI–XI' in FIG. 1A.

Figure 2A:
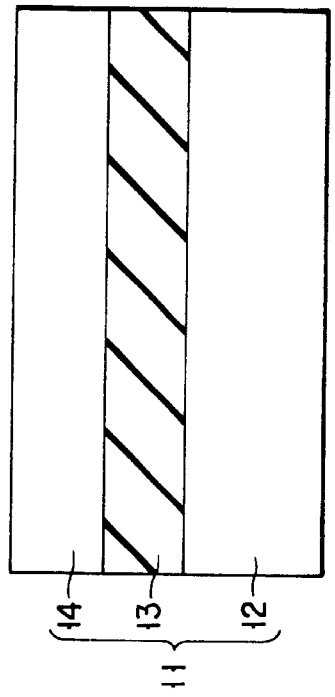
Figure 3A:
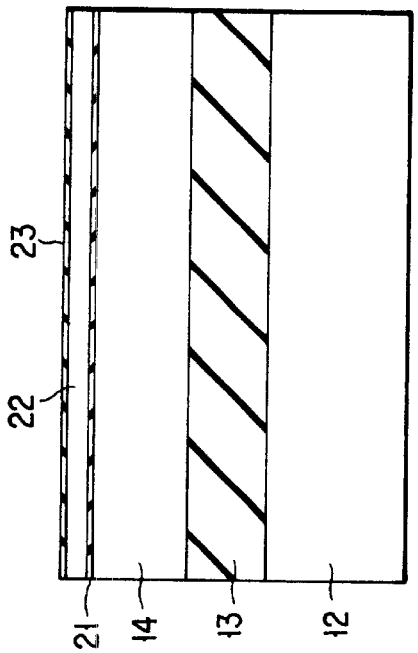

First, as shown in FIGS. 2A and 3A, the SOI substrate 11 in which the single-crystal Si substrate 12, silicon oxide film 13, and Si-body 14 are stacked is prepared.

Figure 2B:
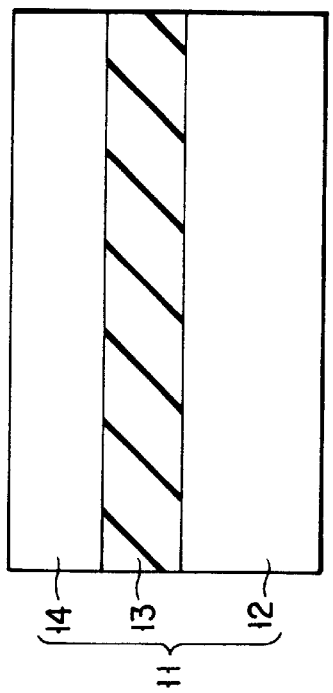
Figure 3B:
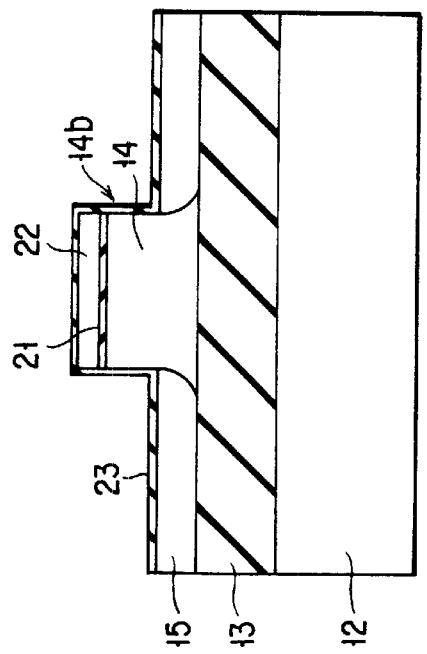

Next, as shown in FIGS. 2B and 3B, a 5-nm thick thermal oxide film 21 is formed on the surface of the Si-body 14, and then, a 100-nm thick polysilicon layer (mask pattern) 22 is deposited by LPCVD. After a resist pattern (not shown) is formed on the polysilicon layer 22 in the element region, the polysilicon layer 22, thermal oxide film 21, and Si-body 14 are sequentially etched by RIE to form a trench having a depth of 100 nm in the Si-body 14, thereby forming the upper structure 14b of the Si-body 14. After the resist pattern is removed, the exposed surfaces of the polysilicon layer 22 and Si-body 14 are oxidized to form a thin (about 5-nm thick at maximum) $SiO_2$ layer 23. A $p^+$-type diffusion layer 15 necessary for electrically connecting the gate and silicon layer to be formed later is formed on the side surface of the lower structure 14a of the Si-body 14 by ion implantation. The polysilicon layer 22 is used as a mask for this ion implantation.

Figure 3C:
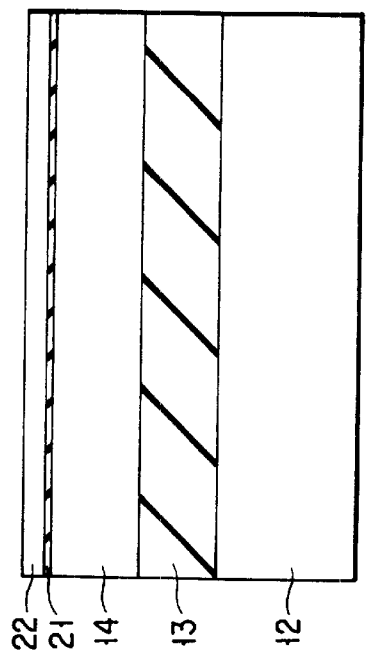
Figure 2C:
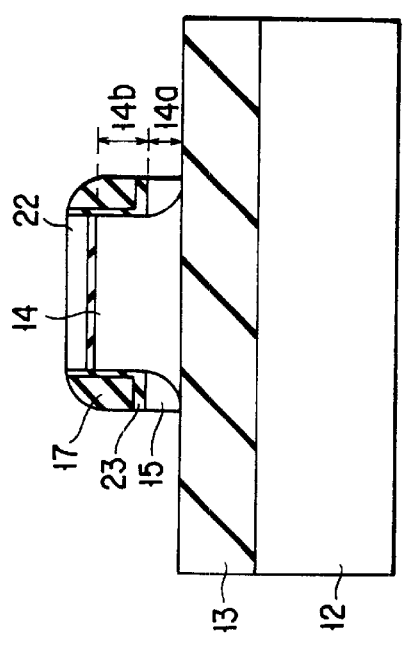

As shown in FIGS. 2C and 3C, an $Si_3N_4$ film is deposited on the entire surface, and then RIE is performed to form the sidewall insulating film 17 on the side surface of the upper structure 14b formed by the previous process. The Si-body 14 is etched using the polysilicon layer 22 and sidewall insulating film 17 as a mask, thereby exposing the silicon oxide film 13. With this etching process, the island-shaped Si-body 14 comprised of the lower structure 14a and the upper structure 14b formed on the lower structure 14a and having a smaller cross-sectional area parallel to the surface of the substrate than that of the lower structure 14a is formed. The upper surface of the lower structure 14a is exposed to the periphery of the upper structure 14b. The polysilicon layer 22 is also etched by this etching process. To prevent the polysilicon layer 22 from disappearing, the film thickness is adjusted in advance, or an etching mask such as a $TEOS\text{-}SiO_2$ film is formed on the surface of the polysilicon layer 22 in advance.

Figure 3D:
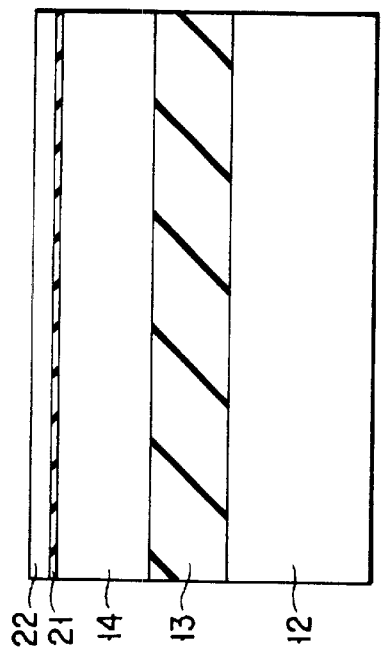
Figure 2D:
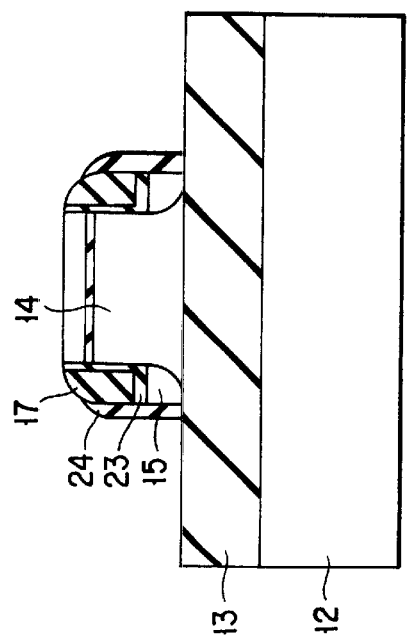

As shown in FIGS. 2D and 3D, an $Si_3N_4$ film is deposited and etched by RIE to form a second sidewall insulating film 24 having a thickness of 10 nm on the sidewall of the structure formed on the $SiO_2$ film 13. In depositing the $Si_3N_4$ film forming the second sidewall insulating film 24, the process condition is adjusted such that the wet etching rate of the second sidewall insulating film 24 becomes higher than that of the sidewall insulating film 17.

Figure 3E:
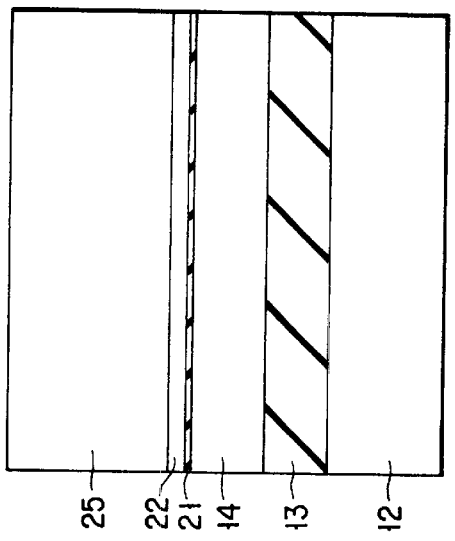
Figure 2E:
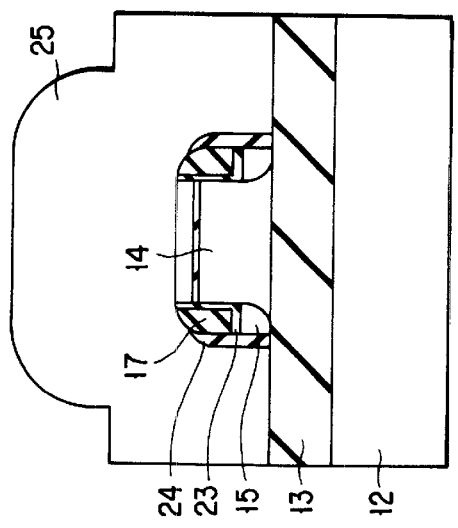

As shown in FIGS. 2E and 3E, a 400-nm thick polysilicon layer 25 as a disposable gate material is deposited.

Figure 3F:
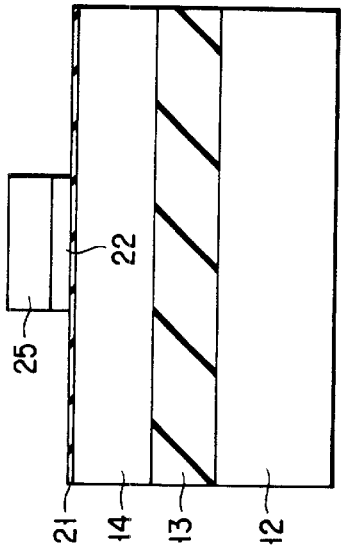
Figure 2F:
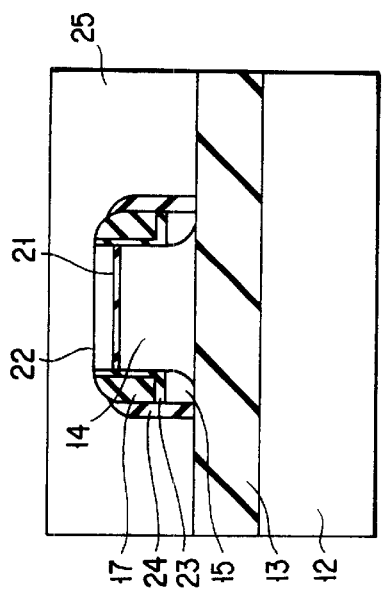

As shown in FIGS. 2F and 3F, the surface of the polysilicon layer 25 is planarized by CMP. A resist pattern (not shown) is formed on the surface of the polysilicon layer in a region where a gate electrode is to be formed later. After that, the polysilicon layers 25 and 22 are etched and patterned. The patterned polysilicon layers 22 and 25 will be referred to as disposable gates 22 and 25 hereinafter.

Figure 2G:
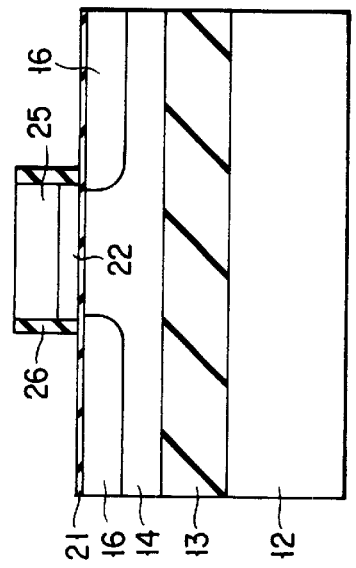
Figure 3G:
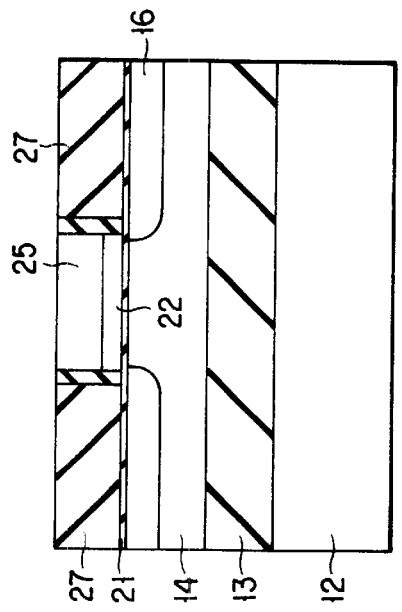

As shown in FIGS. 2G and 3G, after the resist pattern is removed, an $Si_3N_4$ film is deposited and etched to form a 20-nm thick gate sidewall insulating film 26 on the side wall of the disposable gates 22 and 25. Diffusion layers for extension or deep junction are formed to form the source and drain 16. As ions for forming an n⁻-type diffusion layer for extension are implanted, e.g., at an acceleration voltage of 15 keV and a dose of $3 \times 10^{14}$ cm⁻². As ions for forming deep junction are implanted at an acceleration voltage of 45 keV and a dose of $3 \times 10^{15}$ cm⁻². Annealing (1,000° C. at maximum) for activating the source and drain 16 is also performed at this time.

Figure 2H:
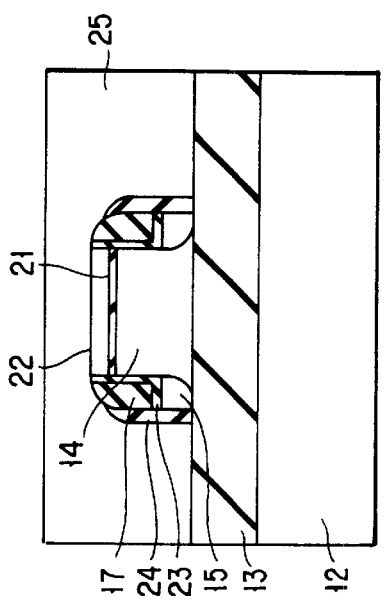
Figure 3H:
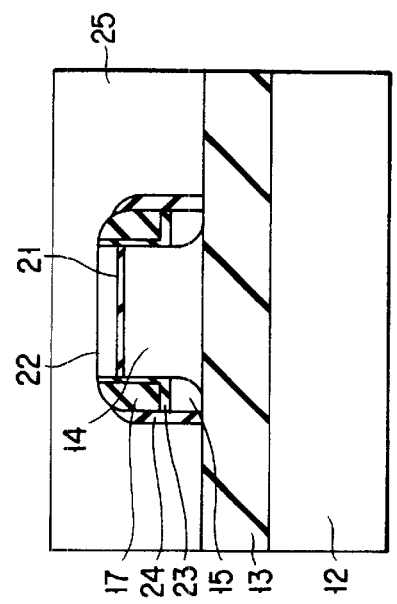

As shown in FIGS. 2H and 3H, after a TEOS-$SiO_2$ film 27 is deposited on the entire surface, the surface of the TEOS-$SiO_2$ film 27 is planarized by CMP to expose the surfaces of the disposable gate 22 and 25.

Figure 3I:
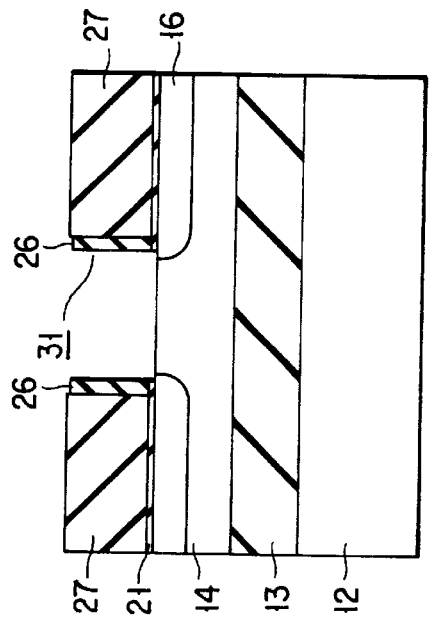
Figure 2I:
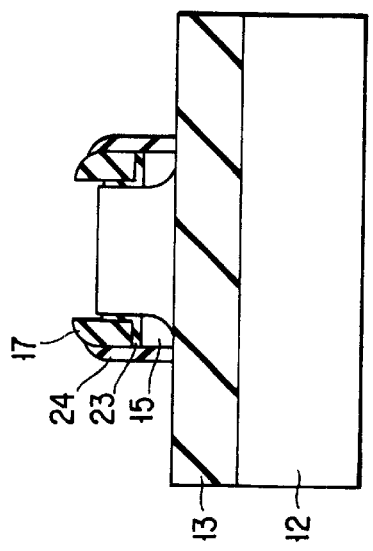

As shown in FIGS. 2I and 3I, the disposable gates 22 and 25 are removed by CDE to form a gate groove 31 in the gate formation region. This etching process is performed without etching $Si_3N_4$, thereby leaving the sidewall insulating films 17, 24, and 26. The thermal oxide film 21 at the bottom of the gate groove is also removed by wet etching using an HF-based etchant.

Figure 3J:
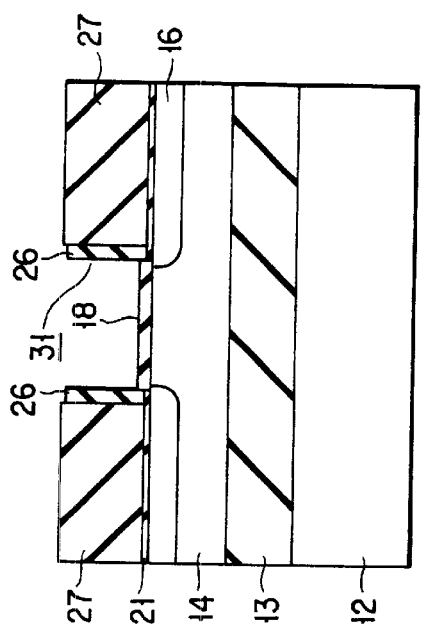
Figure 2J:
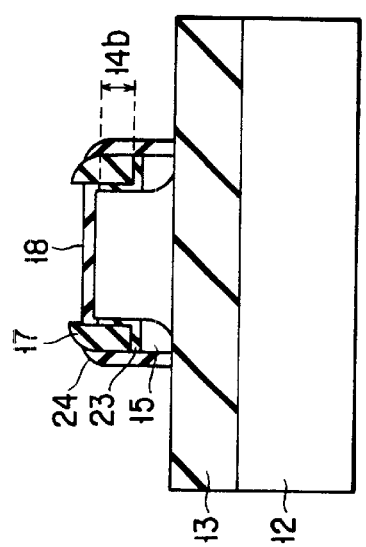

As shown in FIGS. 2J and 3J, the gate insulating film 18 formed from $SiO_2$ is formed on the surface of the upper structure 14b of the Si-body 14 exposed to the bottom surface of the gate groove 31. Next, as shown in FIGS. 2K and 3K, the second sidewall insulating film 24 formed on the side portion of each p⁺-type diffusion layer 15 is removed by wet etching to expose each p⁺-type diffusion, layer 15. As described above, since the $Si_3N_4$ film forming the second sidewall insulating film 24 has a higher etching rate and smaller film thickness than those of the sidewall insulating film 17 and gate sidewall insulating film 26, the sidewall insulating film 17 and gate sidewall insulating film 26 can be left even after the sidewall insulating film 24 is removed.

As shown in FIGS. 2L and 3L, a multilayered metal film of Al/TiN (film thickness: 400 nm/5 nm) is formed by CVD or sputtering and planarized by CMP, thereby forming the metal gate electrode 19 electrically connected to the p⁺-type diffusion layers 15 formed on the side portion of the lower structure 14a of the element region.

After that, as in the normal LSI manufacturing process, a TEOS interlayer insulating film is deposited by CVD, contact holes are formed on the source and drain, and the metal gate electrode, and an upper metal interconnection is formed.

As described above, since the gate electrode and silicon layer are electrically connected through a contact electrode integrated with the gate electrode at part of the side surface of the island-shaped element region, the planar area of the contact formation portion becomes unnecessary, and the device occupation area can be largely decreased.

Since the gate electrode is made of a metal, it can easily be electrically connected to both an n-type semiconductor and a p-type semiconductor. This is very advantageous in formation of a C-MOSFET. For a polysilicon gate electrode, a metal plug must be formed between the gate electrode and a silicon layer of opposite conductivity type in connecting them, resulting in complex process.

Since the gate electrode and silicon layer can be connected by self-alignment, the area can be reduced, and the process can be simplified. In addition, when the metal gate electrode and DTMISFET are combined, a low threshold voltage Vth (0.2 V at maximum) can be realized, although it is supposedly hard to realize for the metal gate electrode DTMISFET.

Since the source and drain are formed before the gate insulating film and gate electrode are formed, a high-temperature process is no longer present after annealing for activating the source and drain. For this reason, as the gate insulating film, not only an $SiO_2$ film but also a high-permittivity film such as a $Ta_2O_5$ film, $TiO_2$ film, or (Ba, Si)$TiO_3$ film or ferroelectric film can be used, and a metal material can be used as the gate electrode.

When the gate insulating film is formed from a high-permittivity film or ferroelectric film, the gate electrode material need be selected in accordance with the used gate insulating film, and TiN, Al, W, and Ru can be used. A TiN or WN film is preferably formed between the gate insulating film and the gate electrode as a barrier metal.

Second Embodiment

Figure 4A:
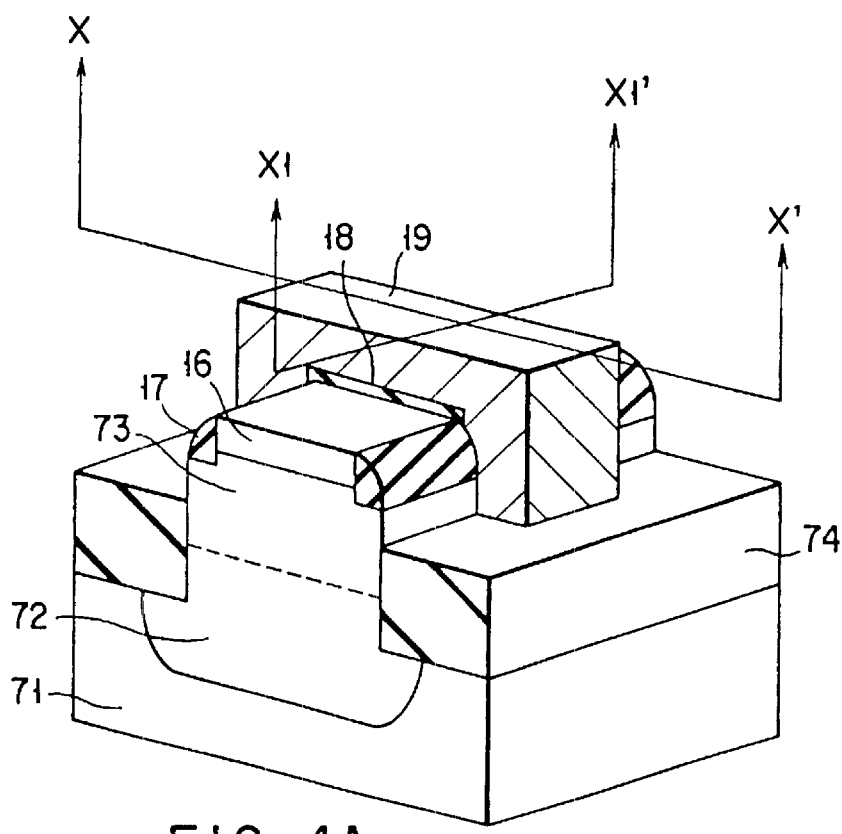
FIG. 4A is a perspective view showing the structure of a DTMISFET according to the second embodiment of the present invention.
Figure 4B:
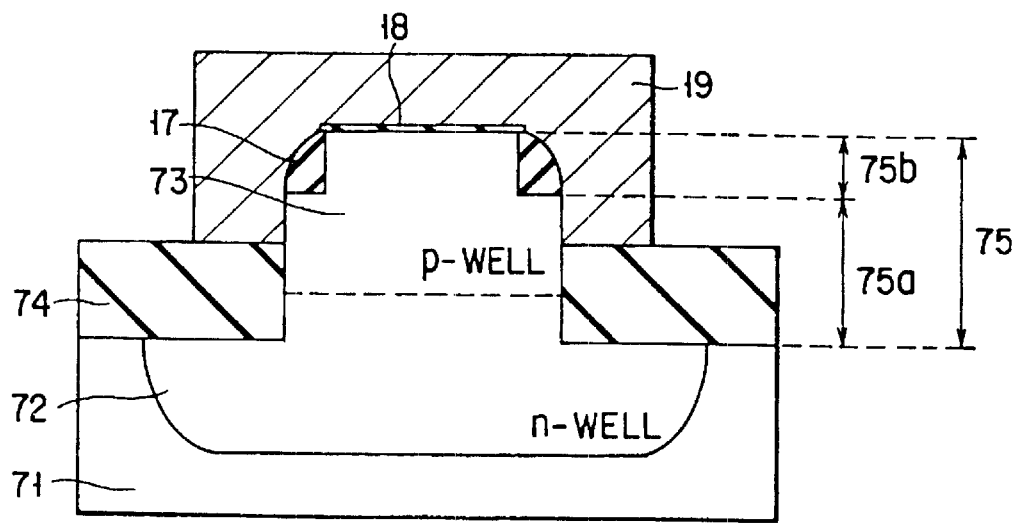
FIG. 4B is a cross-sectional view showing a section taken along a line X–X' in FIG. 4A.

In this embodiment, a DTMISFET using a normal bulk Si semiconductor substrate will be described. FIG. 4A is a perspective view showing the structure of a DTMISFET according to the second embodiment of the present invention. FIG. 4B is a cross-sectional view showing a section taken along a line X–X' in FIG. 4A.

An island-shaped element region 75 is formed on part of an single-crystal Si substrate 71 in the element region. The island-shaped element region 75 is comprised of a lower structure 75a and an upper structure 75b formed on the lower structure 75a and having a smaller cross-sectional area parallel to the surface of the substrate than that of the lower structure 75a. The upper surface of the lower structure 75a is exposed to the periphery of the upper structure 75b. A p-type well 73 is formed in the upper surface layer of the island-shaped element region 75. An n-type well 72 is formed under the p-type well 73.

A sidewall insulating film 17 is formed on the lower structure 75a of the element region 75 on the single-crystal Si substrate 71 in contact with the side surface of the upper structure 75b. An element isolation insulating film (TEOS) 74 is formed on the single-crystal Si substrate 71 around the element region 75 in contact with the side surface of the lower structure 75a of the element region 75. The upper surface of the element isolation insulating film 74 is lower than that of the lower structure 75a of the element region 75. The p-type well 73 in the single-crystal Si substrate 71 is partially exposed from the element isolation insulating film 74.

A gate insulating film 18 is formed on part of the upper surface of the upper structure 75b of the element region 75. A gate electrode 19 is formed on the single-crystal Si substrate 71 via the metal gate electrode 19. A source and drain 16 are formed in the surface of the upper structure 75b of the element region 75 so as to sandwich the gate insulating film 18. The gate electrode 19 is formed on the gate insulating film 18 in contact with the sidewall insulating film 17 and the p-type well 73 on the upper side surface of the lower structure 75a of the element region 75.

A process of manufacturing this device will be described next with reference to FIGS. 5A to 5D and 6A to 6D. FIGS. 5A to 5D are cross sectional views corresponding to the section taken along the line X–X' in FIG. 4A. FIGS. 6A to 6D are cross-sectional views corresponding to a section taken along a line XI–XI' in FIG. 4A.

Figure 6A:
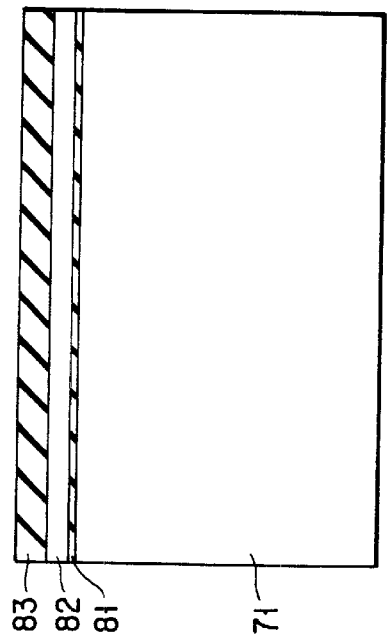
FIGS. 6A to 6D are cross-sectional views (corresponding to a section taken along a line XI–XI' in FIG. 4A) showing the steps in manufacturing the DTMISFET according to the second embodiment of the present invention.
Figure 5A:
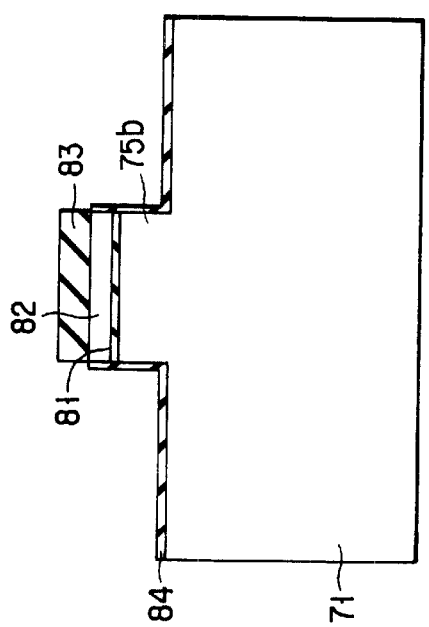
FIGS. 5A to 5D are cross-sectional views (corresponding to the section taken along the line X–X' in FIG. 4A) showing the steps in manufacturing the DTMISFET according to the second embodiment of the present invention.

First, as shown in FIGS. 5A and 6A, the bulk single-crystal Si substrate 71 is prepared. A 5-nm thick thermal oxide film 81 is formed on the surface of the single-crystal Si substrate 71. After this, a 100-nm thick polysilicon layer 82 and 150-nm thick insulating film 83 formed from a TEOS film are deposited by LPCVD. A resist pattern (not shown) is formed on the insulating film 83 in the element region by lithography. The insulating film 83, polysilicon layer 82, thermal oxide film 81, and single-crystal Si substrate 71 are etched using the resist pattern as a mask to form a 100-nm deep trench in the single-crystal Si substrate 71, and the lower structure 75a is formed on the single-crystal Si substrate 71. After the resist pattern is removed, the exposed surfaces of the polysilicon layer 82 and single-crystal Si substrate 71 are oxidized to form a thin (5-nm thick at maximum) oxide layer 84.

Figure 6B:
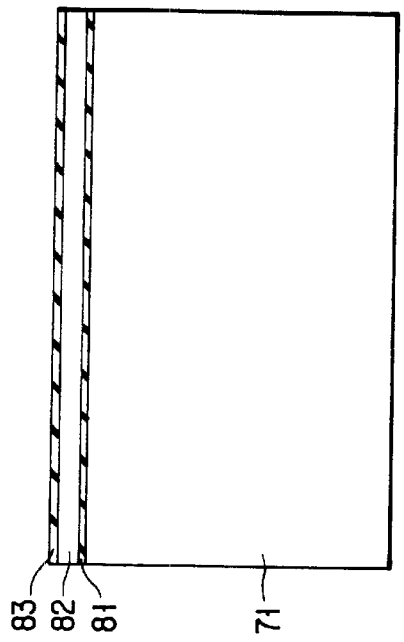
Figure 5B:
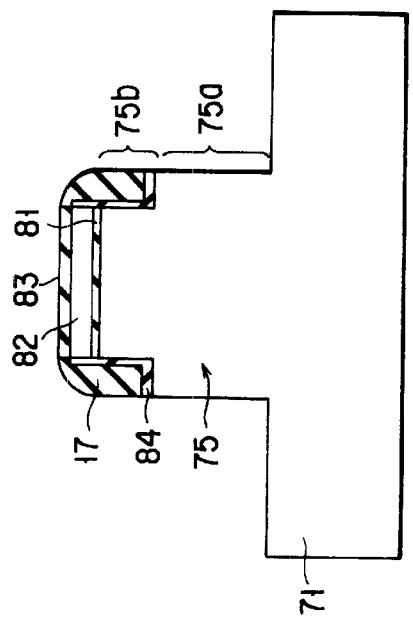

As shown in FIGS. 5B and 6B, the 30-nm thick sidewall insulating film 17 made of $Si_3N_4$ is formed on the side surface of the upper structure 75b formed on the single-crystal Si substrate 71. The single-crystal Si substrate 71 is further etched by 250 nm using the insulating film 83 and sidewall insulating film 17 as a mask. With this etching, the island-shaped element region 75 comprised of the lower structure 75a and the upper structure 75b formed on the lower structure 75a and having a smaller cross-sectional area parallel to the surface of the substrate than that of the lower structure 75a is formed. The upper surface of the lower structure 75a is exposed to the periphery of the upper structure 75b. At this time, the insulating film 83 is simultaneously etched. To prevent the insulating film 83 from disappearing by this etching process, the film thickness of the insulating film 83 is adjusted in advance.

Figure 6C:
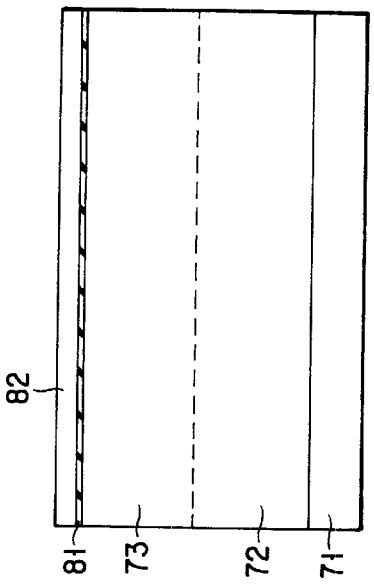
Figure 5C:
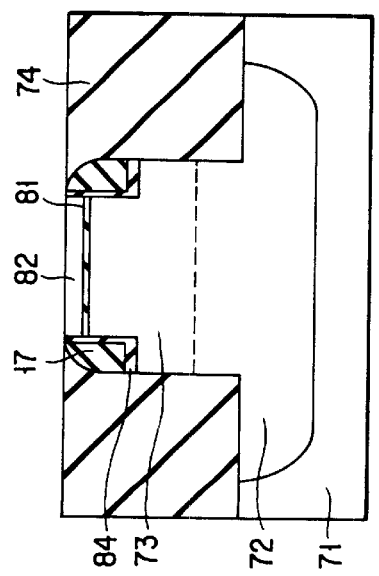

As shown in FIGS. 5C and 6C, the 550-nm thick element isolation insulating film 74 is deposited on the entire surface, and the surface thereof is planarized by CMP to expose the polysilicon layer 82. Next, the deep n-type well 72 and shallow p-type well 73 are sequentially formed by accelerated ion implantation (double well structure).

Figure 6D:
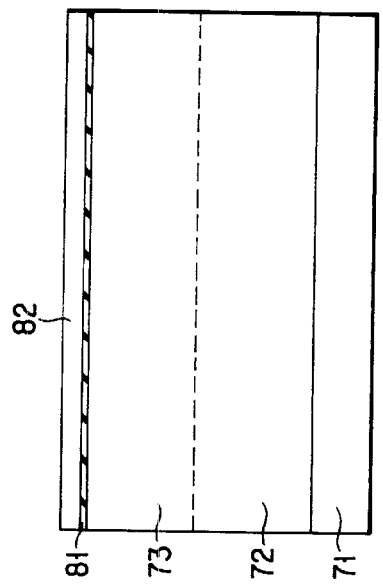
Figure 5D:
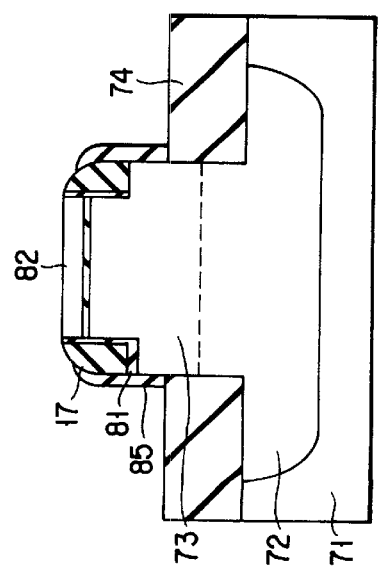

As shown in FIGS. 5D and 6D, the element isolation insulating film 74 in the element isolation region is recessed by RIE or wet etching until the side surface of the shallow p-type well 73 under the sidewall insulating film 17 is exposed by 80 nm in the direction of depth. An $Si_3N_4$ film is deposited and etched to form a 10-nm thick second sidewall insulating film 85 on the side portion of the sidewall insulating film 17. The $Si_3N_4$ film forming the second sidewall insulating film 85 is preferably deposited while optimizing the process condition such that the etching rate of the $Si_3N_4$ film becomes higher than that of the sidewall insulating film 17.

The subsequent manufacturing processes are the same as those described in the first embodiment with reference to FIGS. 2E to 2L and 3E to 3L, and a detailed description thereof will be omitted.

According to the second embodiment, the high electric resistance of an Si-body, which tends to pose a problem in use of an SOI substrate, need not be worried. This is because since the p-type well having a relatively high impurity concentration and large film thickness is used instead of the Si-body, the electric resistance at this portion can be reduced.

Third Embodiment

Figure 7:
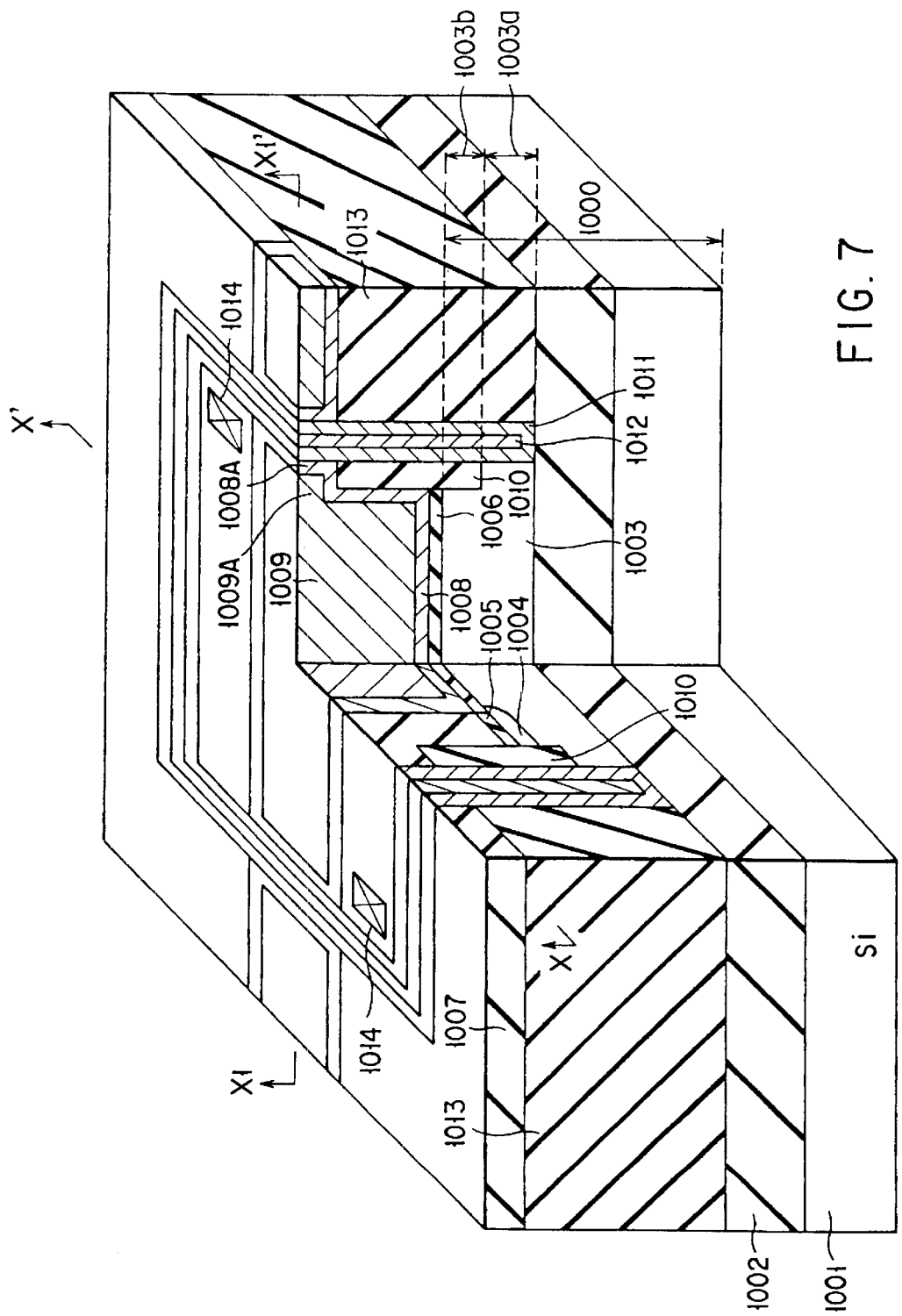
FIG. 7 is a cross-sectional perspective view showing the structure of DTMISFET according to the third embodiment of the present invention.

FIG. 7 is a cross-sectional perspective view showing the structure of a DTMISFET according to the third embodiment of the present invention.

This device uses an SOI substrate 1000 in which a silicon substrate 1001, buried oxide film 1002, and silicon active layer 1003 are stacked. The silicon active layer (element region) 1003 has an island shape. The island-shaped silicon active layer 1003 is comprised of a lower structure 1003a and an upper structure 1003b formed on the lower structure 1003a and having a smaller cross-sectional area parallel to the surface of the substrate than that of the lower structure 1003a. The upper surface of the lower structure 1003a is exposed along the periphery of the upper structure 1003b.

A ring-shaped element sidewall insulating film 1010 is formed on the upper surface of the lower structure 1003a and along the periphery the upper structure 1003b of the island-shaped silicon active layer 1003. The upper surface of the element sidewall insulating film 1010 is formed to be higher than that of the upper structure 1003b of the silicon active layer 1003.

A contact electrode 1012 having bottom and side surfaces covered with a barrier metal 1011 is formed on the buried oxide film 1002, which contact with the surface of the lower structure 1003a of the silicon active layer 1003 and the side surface of the element sidewall insulating film 1010. Hence, the silicon active layer 1003 and contact electrode 1012 are electrically connected through the barrier metal 1011.

A gate insulating film 1006 is formed on the upper surface of the upper structure 1003b of the silicon active layer 1003. The gate insulating film 1006 is formed to be connected part of one of the opposing surfaces of the sidewall insulating film 1010 and not to be connected to the other of the opposing surfaces. A buffer oxide film 1005 is formed on the upper surface of the upper structure 1003b of the silicon active layer 1003, where the gate insulating film 1006 is not formed.

As the gate insulating film 1006, a high-permittivity film of $Ta_2O_5$, $TiO_2$, $Si_3N_4$, $HfO_2$, $ZrO_2$, $La_2O_3$, $Gd_2O_3$, $Y_2O_3$, $CaF_2$, $CaSnF_2$, $CeO_2$, Yttria Stabilized Zirconia, $Al_2O_3$, $ZrSiO_4$, $HfSiO_4$, $Gd_2SiO_5$, $2La_2O_3 \cdot 3SiO_2$, or the like is preferably used.

An interlayer insulating film 1007 is formed in contact with the upper surface of the buffer oxide film 1005, the side and upper surfaces of the sidewall insulating film 1010 in a region contacting the buffer oxide film 1005, and the side surface of the barrier metal 1011.

A barrier metal 1008 is formed in contact with the upper surface of the gate insulating film 1006, the side surface of the interlayer insulating film 1007, and side and upper surfaces of the element sidewall insulating film 1010, and the side surface of the barrier metal 1011. A gate electrode 1009 is formed in contact with the barrier metal 1008. That is, the gate electrode 1009 and contact electrode 1012 are electrically connected via the barrier metals 1008 and 1011. Hence, the gate electrode 1009 and the lower side surface of the silicon active layer 1003 are electrically connected via the barrier metals 1008 and 1011 and contact electrode 1012.

A source and drain 1004 are formed in the upper surface of the upper structure 1003b of the silicon active layer 1003 so as to sandwich the gate electrode 1009 (one of the source and drain is not shown).

An element isolation insulating film 1013 is formed in contact with the periphery of the barrier metal 1011 covering the surfaces of the contact electrode 1012. The upper surface of the isolation insulating film 1013 is lower than that of the gate electrode 1009. An electrode 1009A whose side and lower surfaces are covered with a barrier metal 1008A is formed along the longitudinal direction of the gate electrode 1009. The interlayer insulating film 1007 is formed in a region on the isolation insulating film 1013, where the electrode 1009A is not formed.

A method of manufacturing this device will be described with reference to FIGS. 8A to 8P and 9A to 9P. FIGS. 8A to 8P are cross-sectional views corresponding to a section taken along a line X–X' in FIG. 7. FIGS. 9A to 9P are cross-sectional views corresponding to a section taken along a line XI–XI' in FIG. 7.

First, as shown in FIGS. 8A and 9A, after the buffer oxide film 1005 is formed on the SOI substrate 1000 in which the 300-nm thick silicon active layer 1003 is stacked on the SOI substrate 1000 and the buried oxide film 1002, a polysilicon film 1101 and silicon nitride film 1102 are sequentially deposited.

As shown in FIGS. 8B and 9B, using a resist pattern (not shown) as a work, for forming element region is formed by lithography, the silicon nitride film 1102, polysilicon film 1101, buffer oxide film 1005, and silicon active layer 1003 are etched by RIE. At this time, instead of etching the entire silicon active layer 1003 in the direction of depth, the silicon active layer 1003 is etched by a depth of 150 to 200 nm to form the upper structure 1003b of the silicon active layer 1003.

Figure 8C:
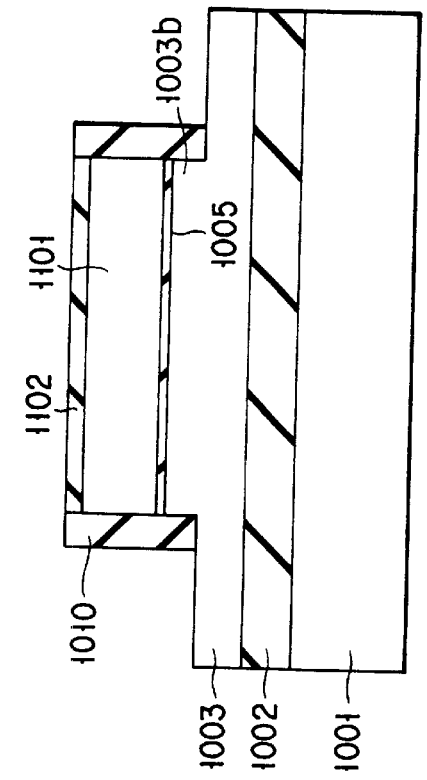
FIGS. 8A to 8P are cross-sectional views (corresponding to a section taken along a line X–X' in FIG. 7) showing the steps in manufacturing the DTMISFET according to the third embodiment of the present invention.
Figure 9C:
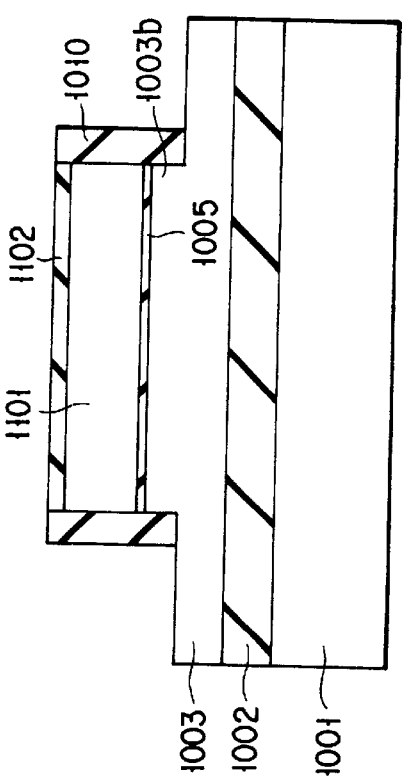
FIGS. 9A to 9P are cross-sectional views (corresponding to a section taken along a line XI–XI' in FIG. 7) showing the steps in manufacturing the DTMISFET according to the third embodiment of the present invention.

As shown in FIGS. 8C and 9C, a silicon oxide film is deposited and then etched by RIE to form the element sidewall insulating film 1010 covering the periphery of the upper structure 1003b of the silicon active layer 1003. Although the element sidewall insulating film 1010 illustrated has a rectangular section, it normally becomes thin at the upper portion.

Figure 8D:
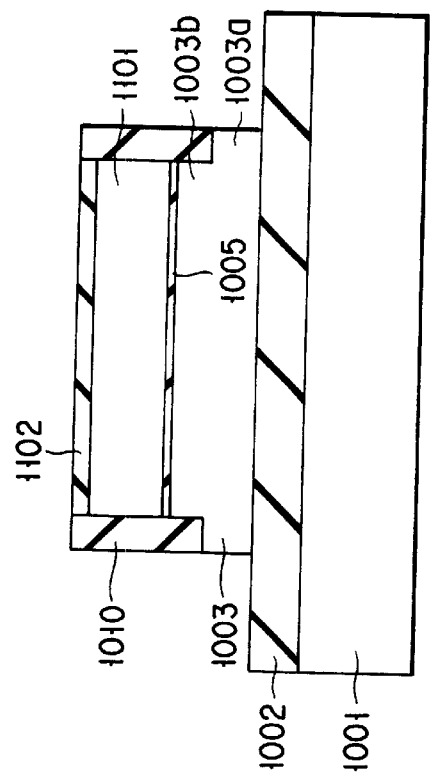
Figure 9D:
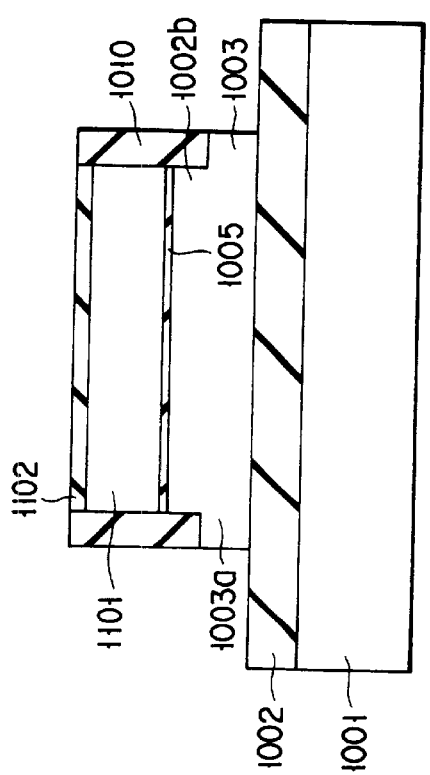

As shown in FIGS. 8D and 9D, the silicon active layer 1003 is etched by RIE using the silicon nitride film 1102 and element sidewall insulating film 1010 as a mask until the buried oxide film 1002 is exposed, thereby exposing the silicon active layer 1003 under the element sidewall insulating film 1010. With this etching process, the island-shaped element region 1003 comprised of the lower structure 1003a and the upper structure 1003b formed on the lower structure 1003a and having a smaller cross-sectional area parallel to the surface of the substrate than that of the lower structure 1003a is formed. The upper surface of the lower structure 1003a is exposed to the periphery of the upper structure 1003b. An impurity is preferably implanted into the side surface of the lower structure 1003a of the silicon active layer 1003 by oblique ion implantation to increase the impurity concentration and decrease the contact resistance to a gate electrode to be formed later.

Figure 9E:
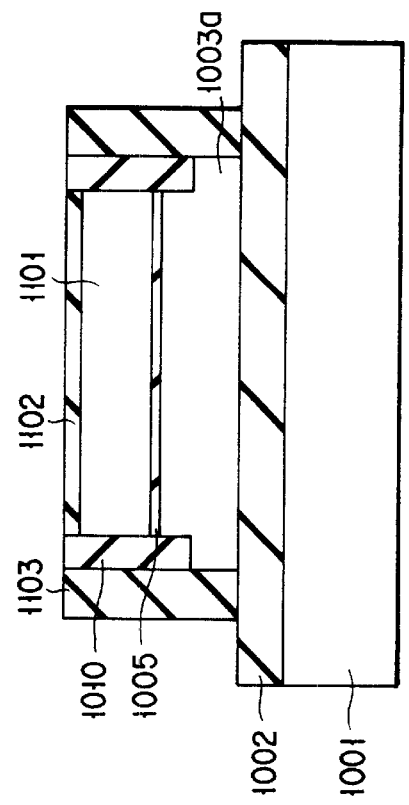
Figure 8E:
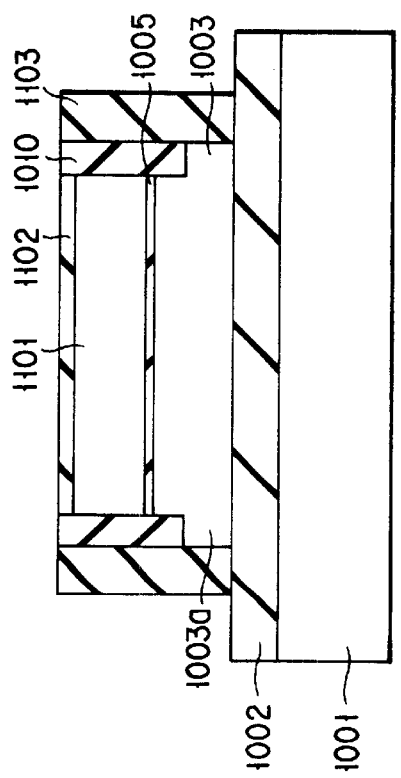

As shown in FIGS. 8E and 9E, a silicon nitride film is deposited on the entire surface and etched by RIE to form a dummy contact 1103 at the side portions of the lower structure 1003a of the element region 1003 and the element sidewall insulating film 1010.

Figure 9F:
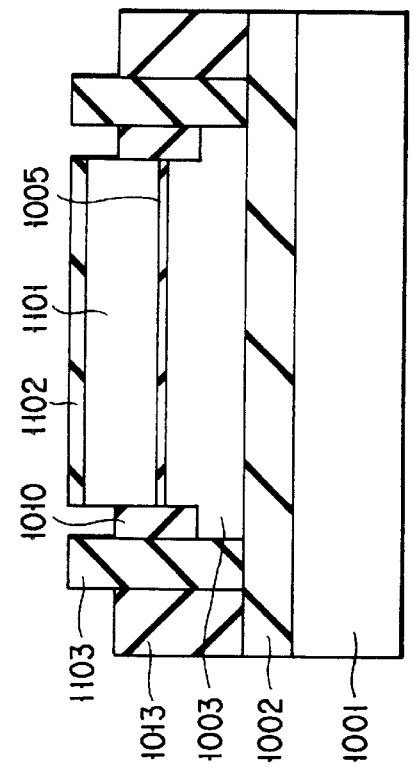
Figure 8F:
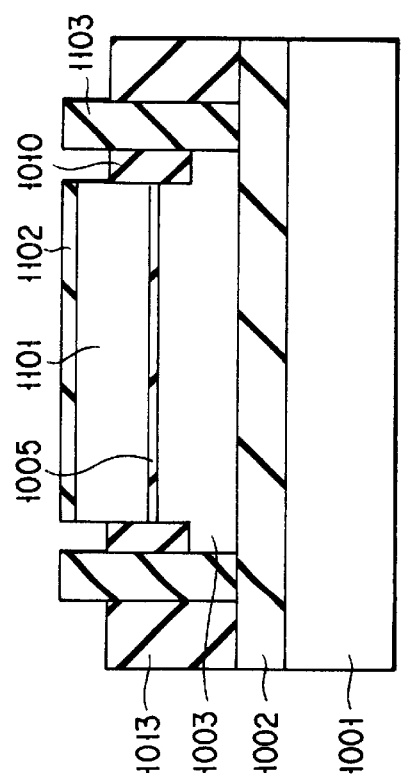

As shown in FIGS. 8F and 9F, a silicon oxide film is deposited on the entire surface and planarized by CMP to form the element isolation insulating film 1013 between adjacent element regions 1003. The silicon oxide is selectively etched by RIE to recess the surface of the element isolation insulating film 1013. At this time, the surface of the element sidewall insulating film 1010 is also recessed.

Figure 8G:
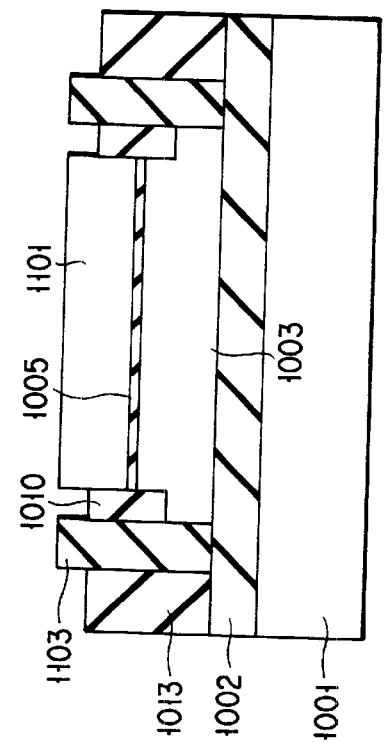
Figure 9G:
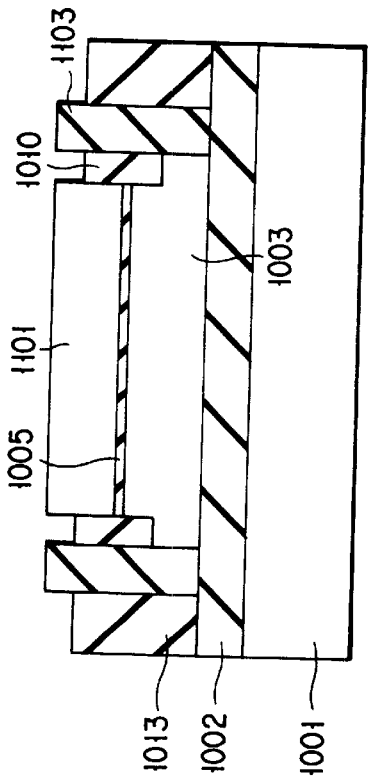

As shown in FIGS. 8G and 9G, the silicon nitride is selectively etched by using RIE, thereby removing the silicon nitride film 1102. With this etching, the surface of the dummy contact 1103 formed from silicon nitride is recessed.

Figure 8H:
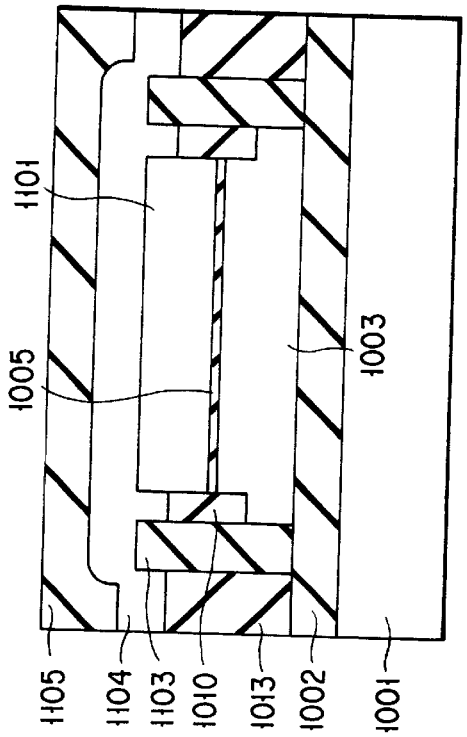
Figure 9H:
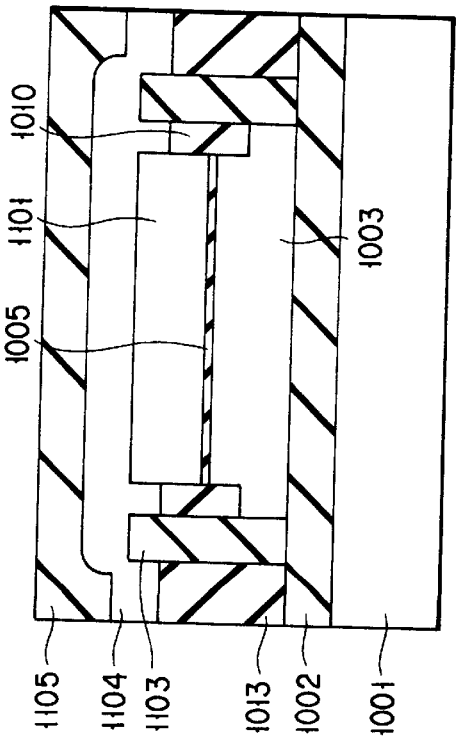
Figure 8I:
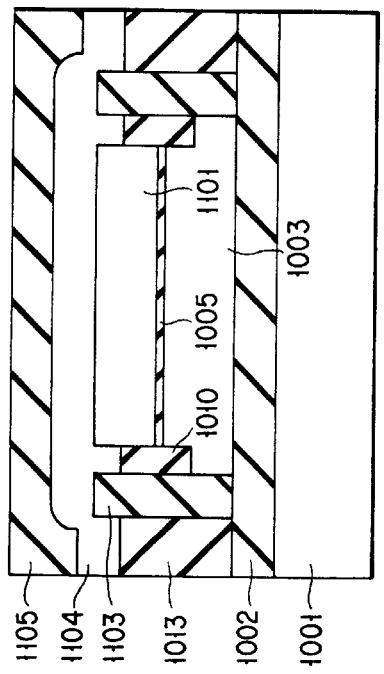
Figure 9I:
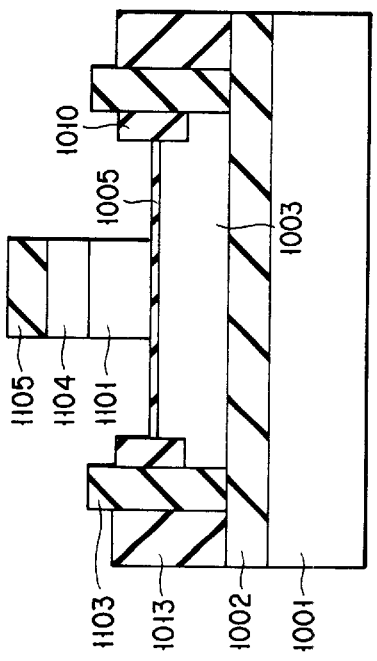

As shown in FIGS. 8H and 9H, a polysilicon film 1104 and silicon nitride film 1105 are sequentially deposited. Next, as shown in FIGS. 8I and 9I, a resist pattern (not shown) is formed by lithography to cover a region where a gate electrode is to be formed. After that, the silicon nitride film 1105, polysilicon film 1104, and polysilicon film 1101 are sequentially etched by RIE to form disposable gates, and then, the resist pattern is removed. The remaining silicon nitride film 1105, polysilicon film 1104, and polysilicon film 1101 will be referred to as disposable gates 1105, 1104, and 1101 hereinafter.

Figure 8J:
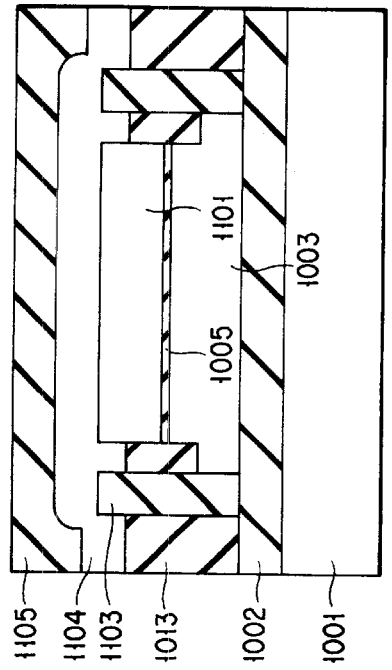
Figure 9J:
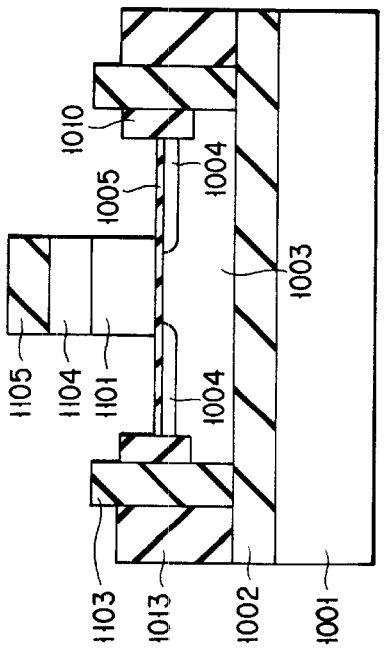

As shown in FIGS. 8J and 9J, ions are implanted into the silicon active layer 1003 using the disposable gates 1105, 1104, and 1101 as a mask to form the source and drain 1004. Then, annealing is performed to activate the source and drain 1004.

Figure 8K:
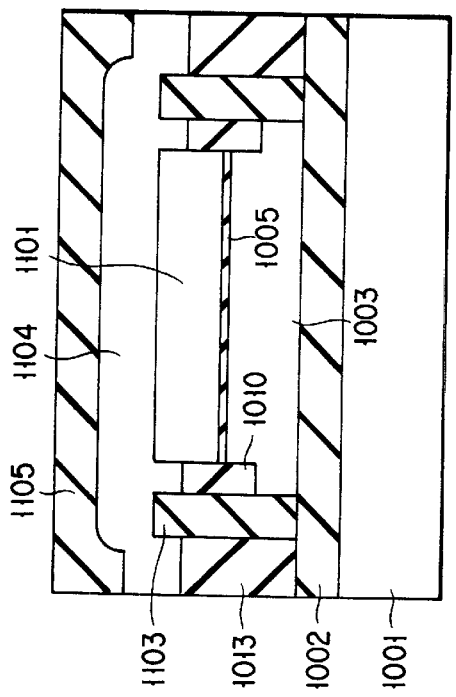
Figure 9K:
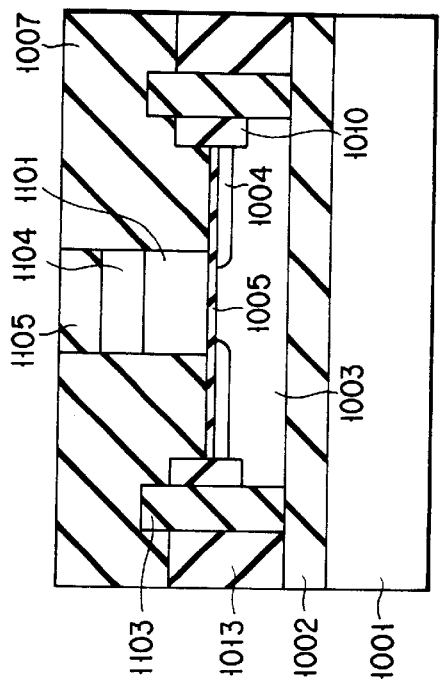

As shown in FIGS. 8K and 9K, the interlayer insulating film 1007 is formed to cover the disposable gates 1105, 1104, and 1101 and planarized by CMP such that the upper surface of the interlayer insulating film 1007 is flush with that of the disposable gates 1105, 1104, and 1101.

Figure 8L:
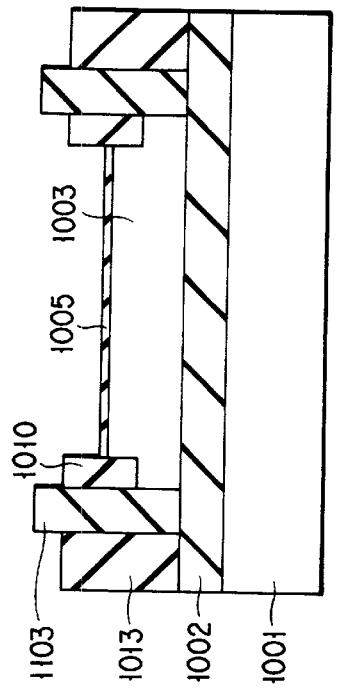
Figure 9L:
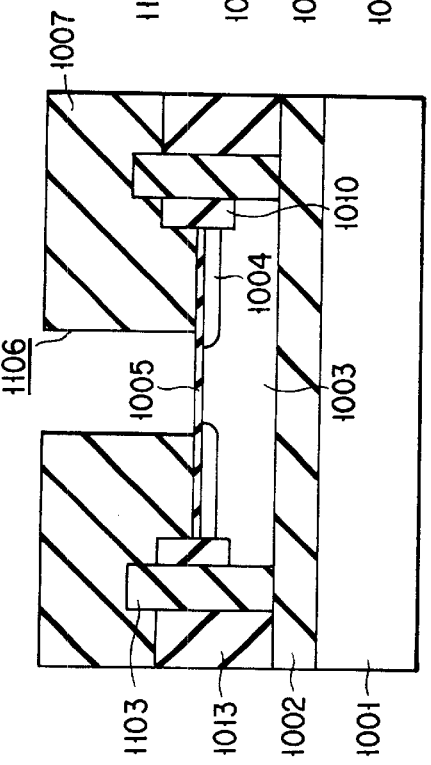

As shown in FIGS. 8L and 9L, the disposable gates 1105, 1104, and 1101 are removed using the interlayer insulating film 1007 as a mask to form a gate groove 1106 where the surface of the buffer oxide film 1005 is exposed. As shown in FIGS. 8M and 9M, the buffer oxide film 1005 exposed in the gate groove 1106 is removed.

As shown in FIGS. 8N and 9N, the surface of the silicon active layer 1003 exposed in the gate groove 1106 is oxidized to form the gate insulating film 1006. To prevent diffusion of the gate electrode material, the barrier metal 1008 formed from, e.g., TiN is deposited, and then, the gate electrode 1009 of W or the like is deposited. The gate electrode material and barrier metal material are polished by CMP to form the barrier metal 1008 and gate electrode 1009 only in the trench.

Figure 9O:
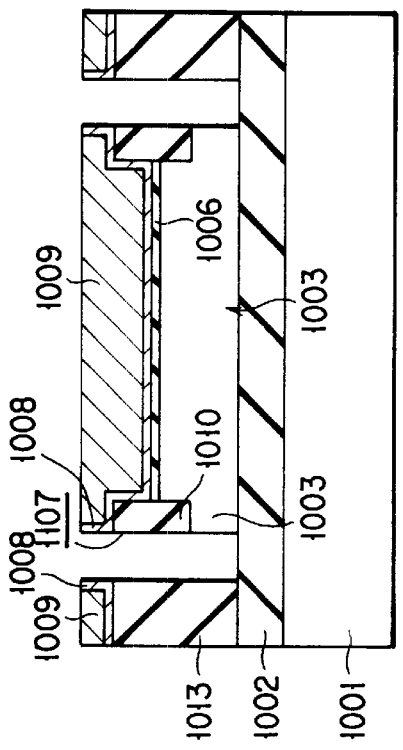
Figure 9P:
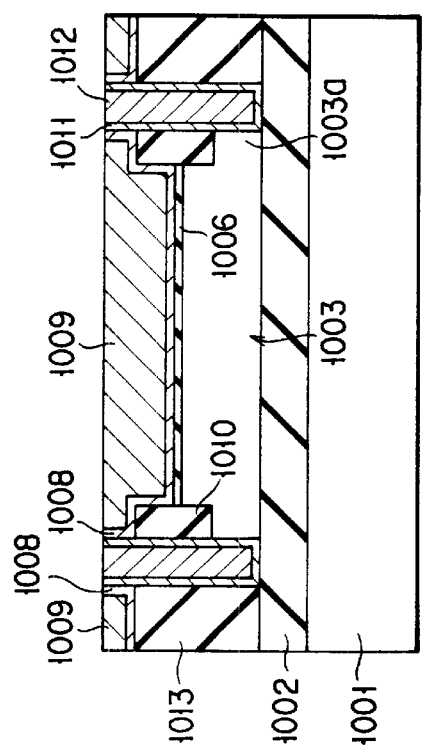
Figure 8O:
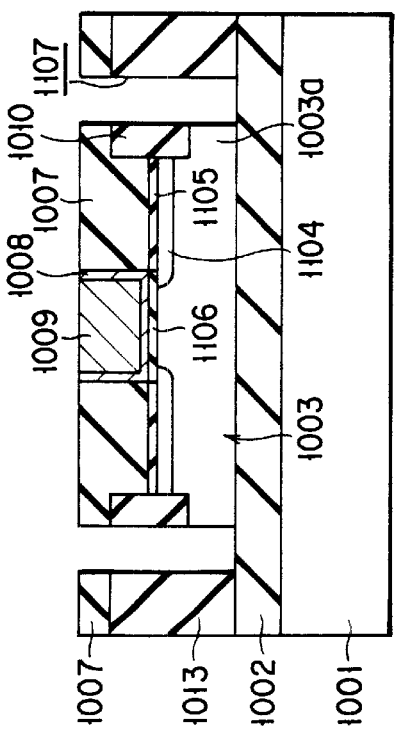
Figure 8P:
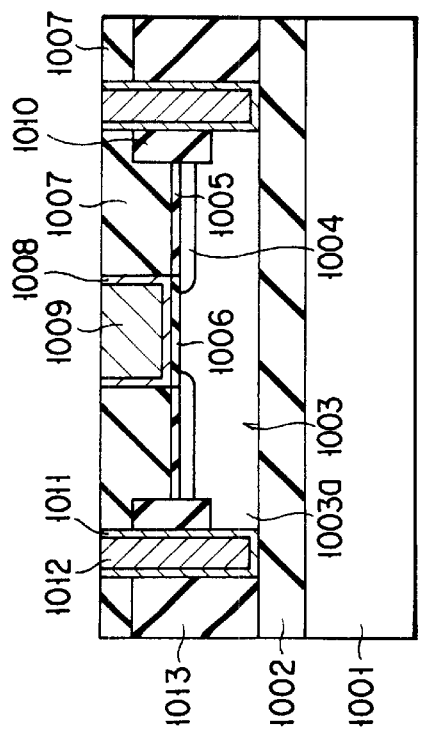

As shown in FIGS. 8O and 9O, the dummy contact 1103 is removed by hot phosphoric acid treatment to form a contact trench 1107 in which the lower structure 1003a of the silicon active layer 1003 is exposed to the side surface. Next, as shown in FIGS. 8P and 9P, the barrier metal 1011 and contact electrode 1012 of Al or the like are formed and planarized by CMP to form the contact electrode 1012 for electrically connecting the gate electrode 1009 and the upper structure 1003b of the silicon active layer 1003.

After that, an interlayer insulating film is deposited, and a contact hole connected to the gate electrode is formed, as in the normal transistor formation process. In addition, TiN is deposited as a passivation layer, and aluminum as a gate inter-connection is deposited and patterned to form the gate interconnection.

In this embodiment, in addition to the effect described in the first embodiment, stable electrical connection with a low resistance can be obtained because the contact electrode 1012 and silicon active layer 1003 are brought into contact at the entire periphery of the silicon active layer 1003. Although source contact and drain contact 1014 are illustrated in FIG. 7, they can be formed by a known method, and a detailed description of the manufacturing method will be omitted.

Fourth Embodiment

In this embodiment, a DTMISFET using a deposition film formed from tantalum oxide as a gate insulating film will be described. When a deposition film is used as a gate insulating film, the insulating film is deposited on the entire surface of a gate groove formed by removing a disposable gate. For this reason, a contact for electrically connecting a gate electrode and a silicon active layer is insulated from the gate electrode by the gate insulating film.

Figure 10:
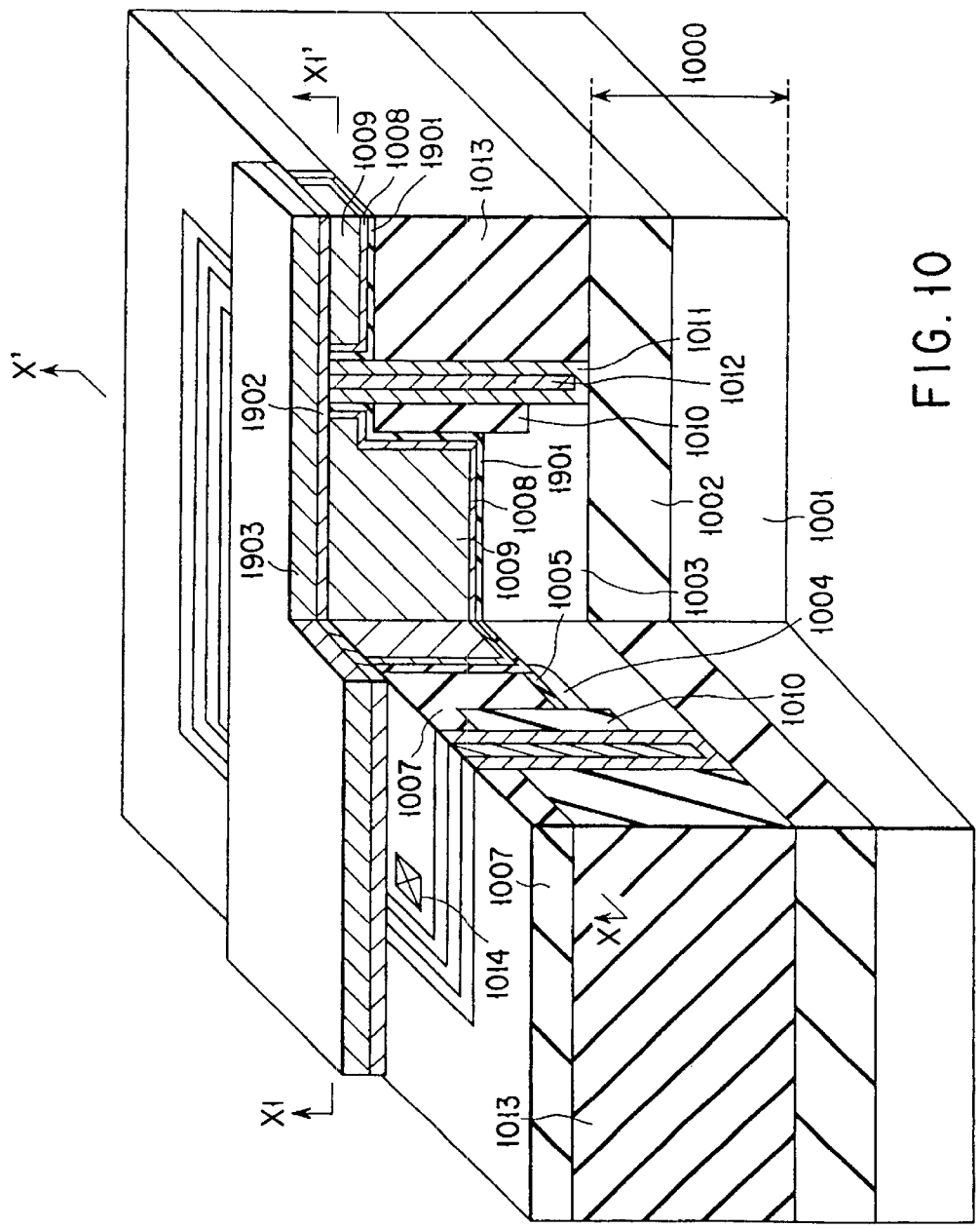
FIG. 10 is a cross-sectional perspective view showing the structure of a DTMISFET according to the fourth embodiment of the present invention.

To avoid this problem, as shown in FIG. 10, electrodes 1902 and 1903 for connecting a contact electrode 1012 and a gate electrode 1009 are formed. The same reference numerals as in FIG. 7 denote the same parts in FIG. 10, and a detailed description thereof will be omitted.

A method of manufacturing this device will be described next. FIGS. 11A to 11D and 12A to 12D are cross-sectional view showing the steps in manufacturing the DTMISFET according to the fourth embodiment of the present invention. FIGS. 11A to 11D are cross sectional views corresponding to a section taken along a line X–X' in FIG. 10. FIGS. 12A to 12D are cross-sectional views corresponding to a section taken along a line XI–XI' in FIG. 10.

Figure 11A:
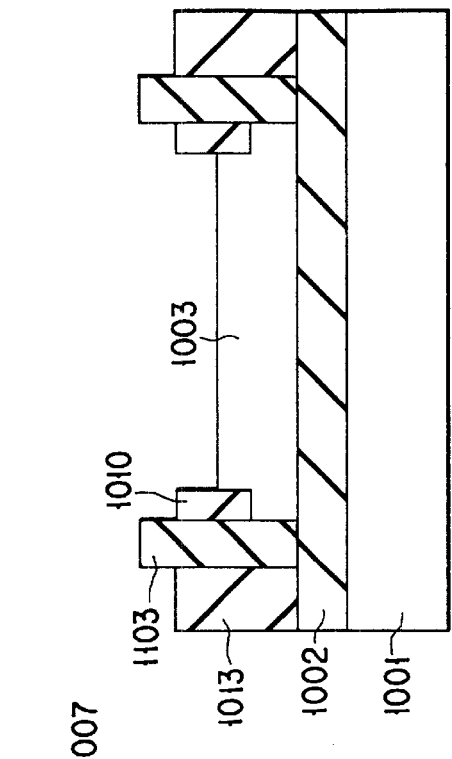
FIGS. 11A to 11D are cross-sectional views (corresponding to a section taken along a line X–X' in FIG. 10) showing the steps in manufacturing the DTMISFET according to the fourth embodiment of the present invention.
Figure 12A:
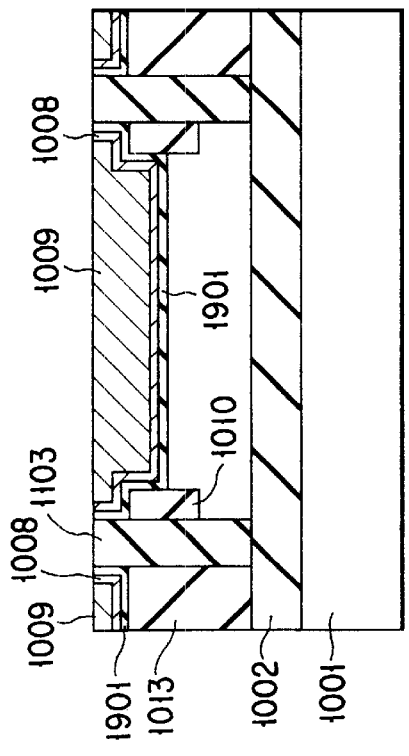
FIGS. 12A to 12D are cross-sectional views (corresponding to a section taken along a line XI–XI' in FIG. 10) showing the steps in manufacturing the DTMISFET according to the fourth embodiment of the present invention.

The structure shown in FIGS. 11A and 12A is the same as that formed by the processes shown in FIGS. 8A to 8M and 9A to 9M that show the method of manufacturing the DTMISFET of the third embodiment, and a detailed description thereof will be omitted.

Figure 11B:
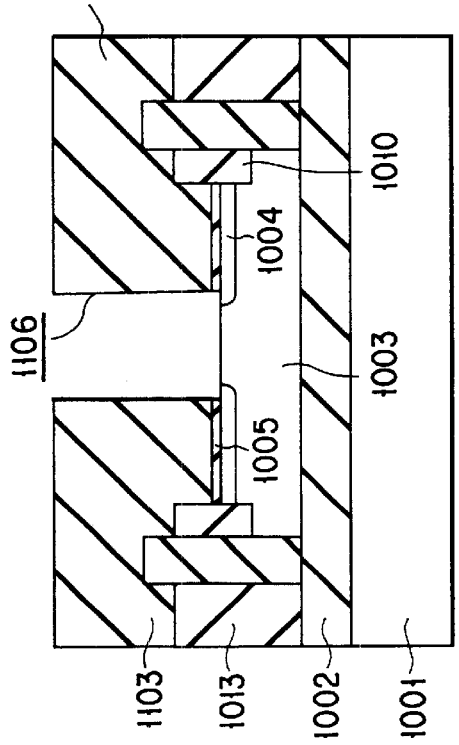
Figure 12B:
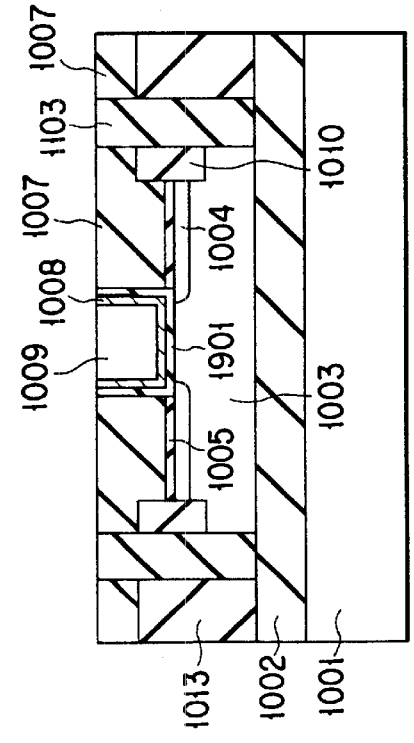
Figure 12C:
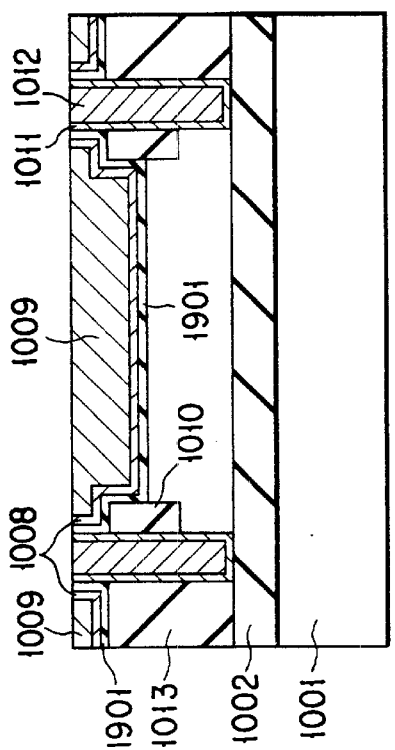
Figure 11C:
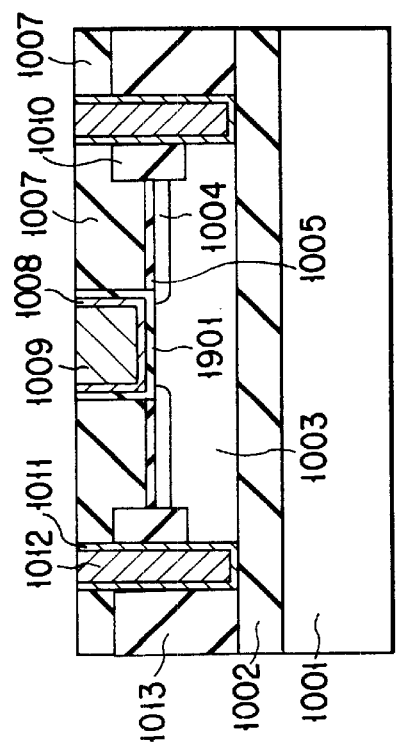

As shown in FIGS. 11B and 12B, a high-permittivity film of tantalum oxide or the like as a gate insulating film material, a barrier metal, and a gate electrode are sequentially deposited and planarized by CMP to leave a gate insulating film 1901, barrier metal 1008, and gate electrode 1009 only in a trench 1106. As shown in FIGS. 11C and 12C, a dummy contact 1103 is removed by hot phosphoric acid treatment to form a contact trench 1107. A barrier metal 1011 and contact electrode 1012 are deposited and polished by CMP to leave the barrier metal 1011 and contact electrode 1012 only in the contact trench 1107.

Figure 12D:
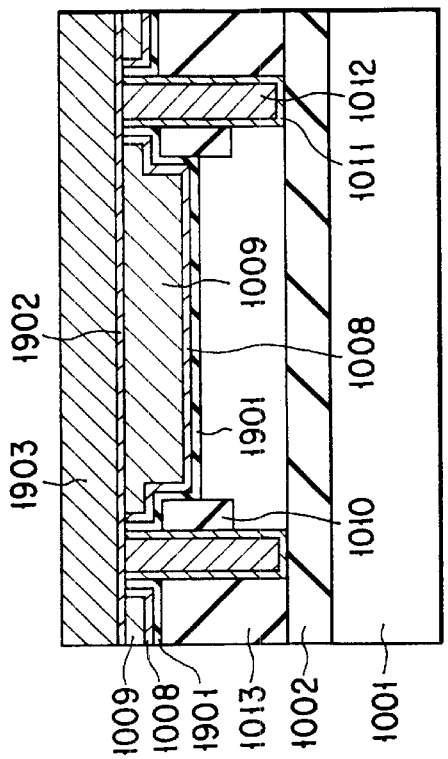
Figure 11D:
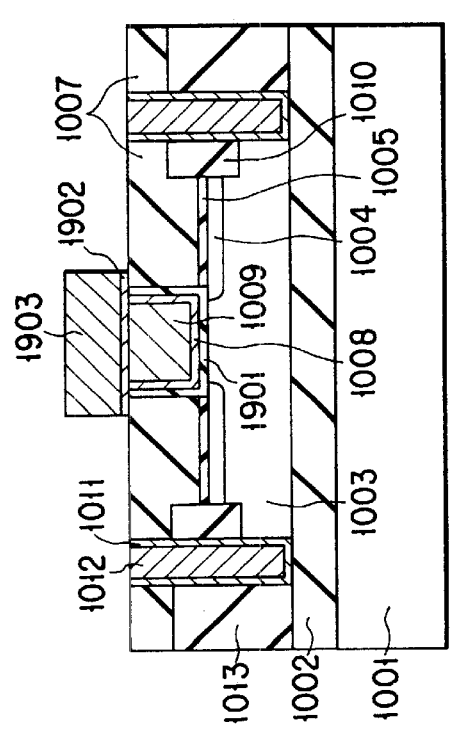

As shown in FIGS. 11D and 12D, the barrier metal 1902 and metal electrode 1903 are sequentially deposited and patterned by lithography to form the metal electrode 1903 for connecting the gate electrode 1009 and contact electrode 1012.

According to this embodiment, even when a deposition film is used as a gate insulating film, the gate electrode and contact electrode are electrically connected by a metal electrode. For this reason, the gate electrode and silicon active layer are electrically connected.

Fifth Embodiment

In this embodiment, a DTMISFET in which a gate insulating film is formed by depositing a high-permittivity film, as in the second embodiment, will be described.

Figure 13:
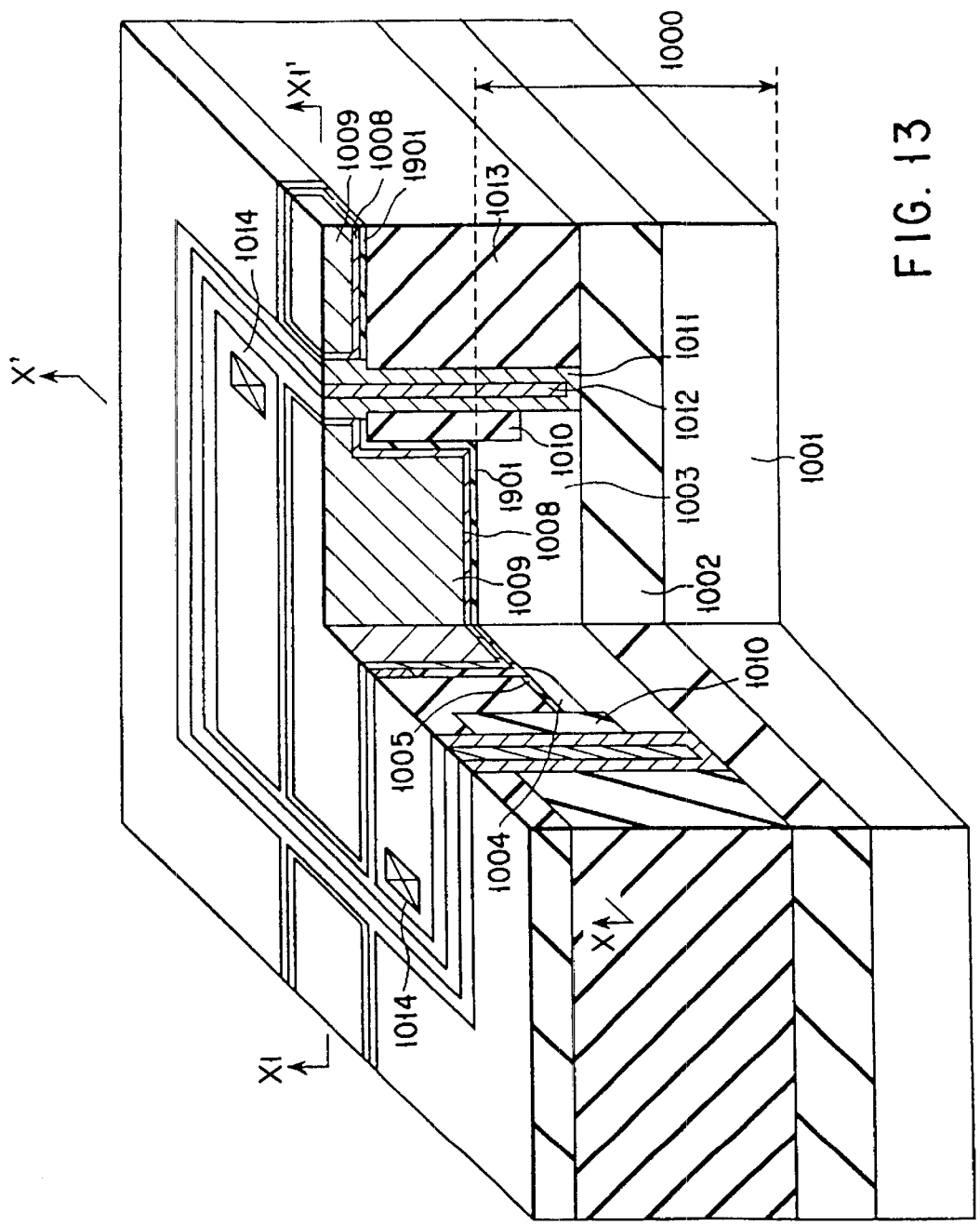
FIG. 13 is a cross-sectional perspective view showing the structure of a DTMISFET according to the fifth embodiment of the present invention.

In the structure of this embodiment, as shown in FIG. 13, a gate insulating film 1901 at the side portion of a contact electrode 1012 is removed, and the contact electrode 1012 and gate electrode 1009 are electrically connected. The same reference numerals as in FIG. 10 denote the same parts in FIG. 13, and a detailed description thereof will be omitted.

Figure 14A:
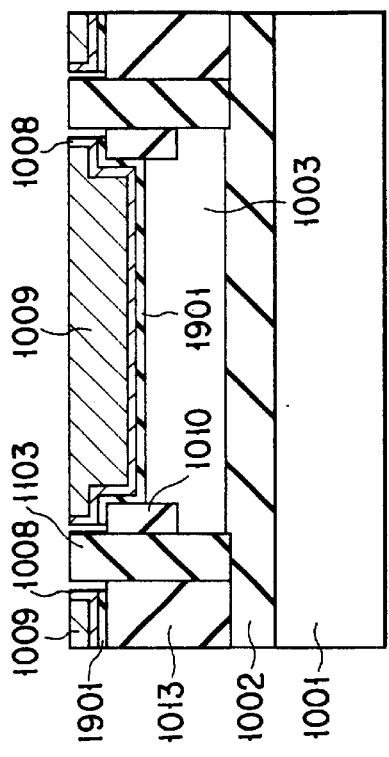
FIGS. 14A and 14B are cross-sectional views (corresponding to a section taken along a line X–X' in FIG. 13) showing the steps in manufacturing the DTMISFET according to the fifth embodiment of the present invention.
Figure 14B:
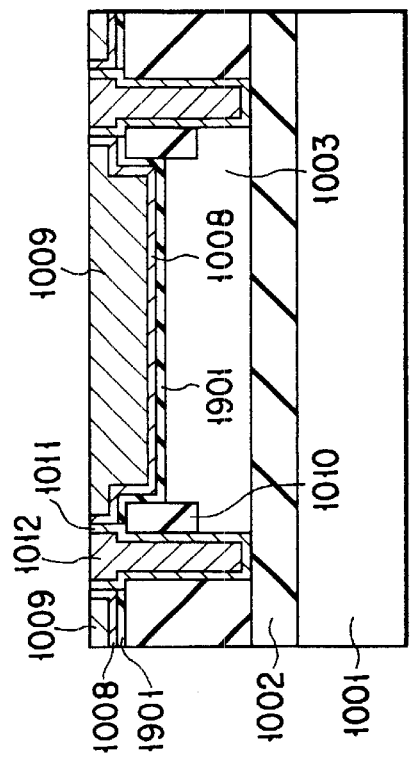
Figure 15A:
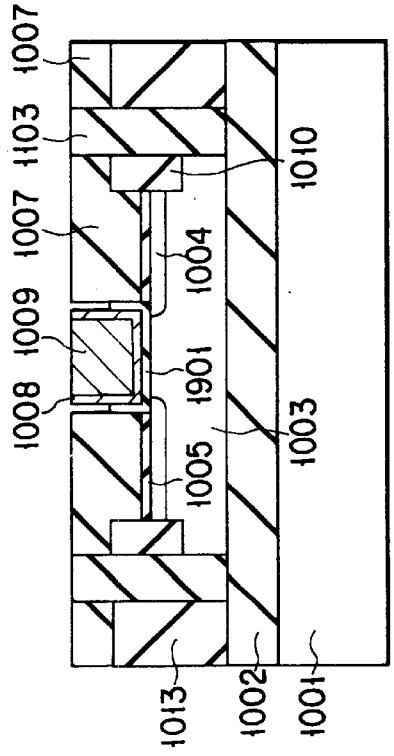
FIGS. 15A to 15B are cross-sectional views (corresponding to a section taken along a line XI–XI' in FIG. 13) showing the steps in manufacturing the DTMISFET according to the fifth embodiment of the present invention.
Figure 15B:
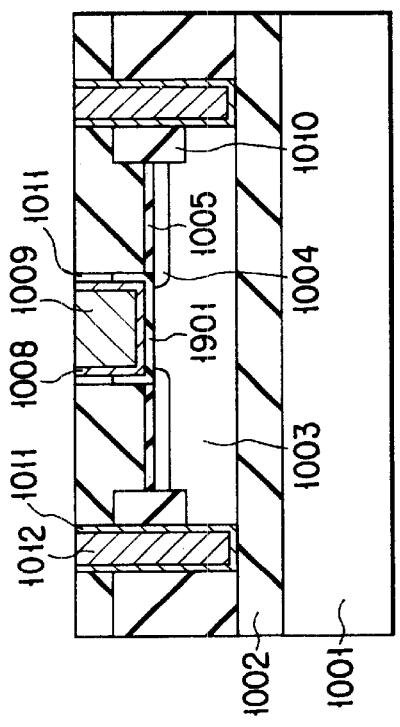

A method of manufacturing this device will be described with reference to FIGS. 14A and 14B and 15A and 15B. FIGS. 14A and 14B are cross-sectional views corresponding to a section taken along a line X–X' in FIG. 13. FIGS. 15A and 15B are cross-sectional views corresponding to a section taken along a line XI–XI' in FIG. 13.

The same manufacturing processes as in FIGS. 11A and 11B and 12A and 12B of the fourth embodiment are performed. After that, as shown in FIGS. 14A and 15A, before removal of a dummy contact 1103, the gate insulating film 1901 formed from a high-permittivity film of tantalum oxide or the like, which is in contact with the dummy contact 1103, is selectively etched and recessed by CDE.

As shown in FIGS. 14B and 15B, after removal of the dummy contact 1103, a barrier metal 1011 and contact electrode 1012 are deposited and planarized by CMP to form the contact electrode 1012 electrically connected to the gate electrode 1009 and silicon active layer 1003.

This structure has an advantage that the gate electrode 1009 and contact electrode 1012 can be electrically connected without the electrode 1903 used in the fourth embodiment.

Sixth Embodiment

In the third to fifth embodiments, silicon nitride is used as a dummy contact. In the sixth embodiment, polysilicon is used as a dummy contact.

FIGS. 16A to 16O are cross-sectional views corresponding to a section taken along a line X–X' in FIG. 13. FIGS. 17A to 17O are cross-sectional views corresponding to a section taken along a line XI–XI' in FIG. 13.

First, as shown in FIGS. 16A and 17A, a buffer oxide film 1005 is formed on a 300-nm thick silicon active layer 1003, and then, a silicon nitride film 2401 is further deposited.

As shown in FIGS. 16B and 17B, a resist pattern (not shown) is formed by lithography. The silicon nitride film 2401 and buffer oxide film 1005 are etched by RIE using the resist pattern as a mask. After removal of the resist pattern, the silicon active layer 1003 is etched by RIE using the silicon nitride film 2401 as a mask. At this time, instead of etching the entire silicon active layer 1003 in the direction of depth, the silicon active layer 1003 is etched by a depth of 150 to 200 nm to form an upper structure 1003b.

Figure 17C:
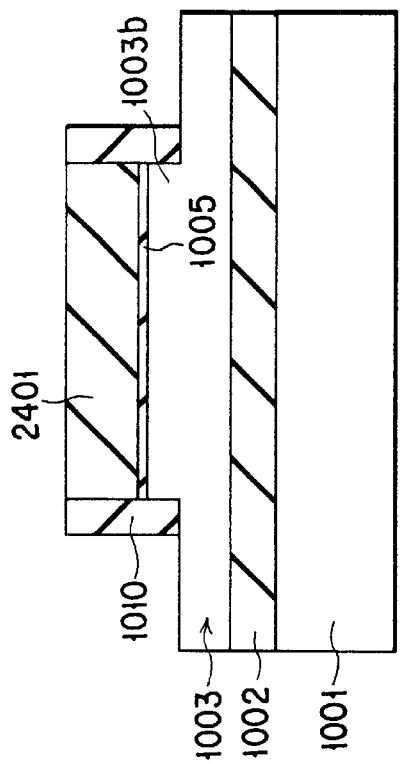
FIGS. 17A to 17O are cross-sectional views (corresponding to the section taken along the line XI–XI' in FIG. 13) showing the steps in manufacturing the DTMISFET according to the sixth embodiment of the present invention.
Figure 16C:
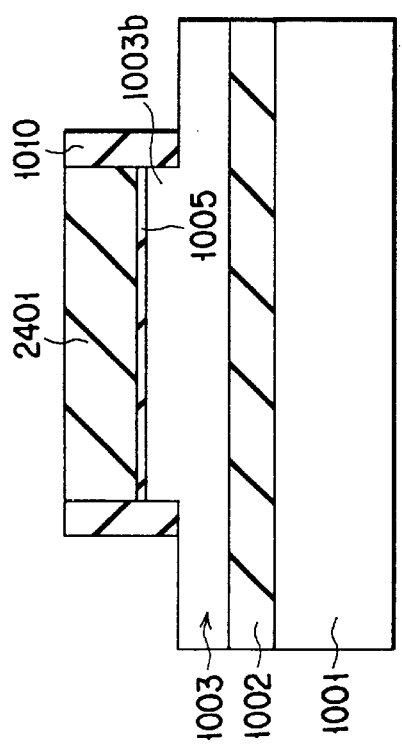
FIGS. 16A to 16O are cross-sectional views (corresponding to the section taken along the line X–X' in FIG. 13) showing the steps in manufacturing the DTMISFET according to the sixth embodiment of the present invention.

As shown in FIGS. 16C and 17C, a silicon oxide film is formed on the entire surface and etched by RIE to form an element sidewall insulating film 1010 on the side surfaces of the upper structure 1003b of the silicon active layer 1003, the buffer oxide film 1005, and the silicon nitride film 2401.

Figure 17D:
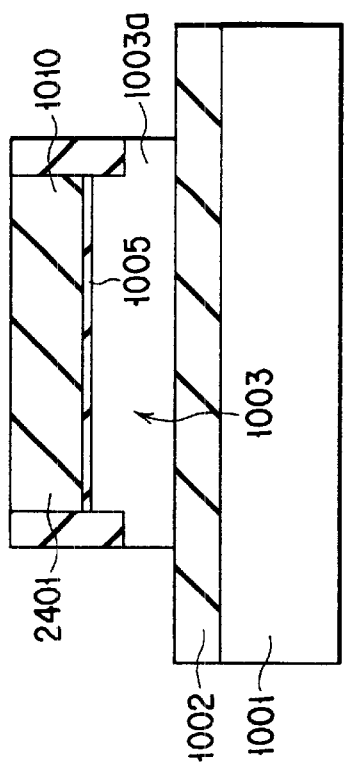
Figure 16D:
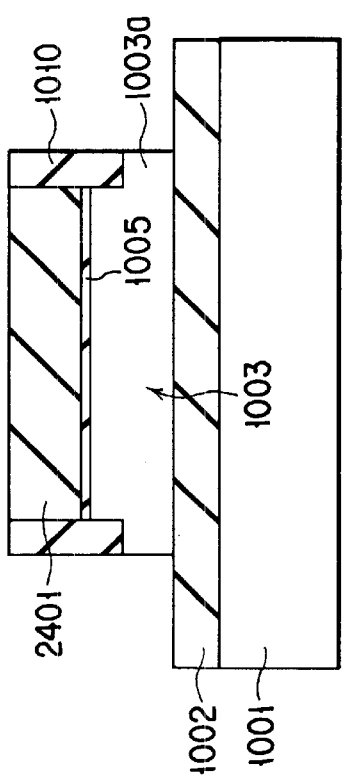

As shown in FIGS. 16D and 17D, the silicon active layer 1003 is etched by RIE using the silicon nitride film 2401 and element sidewall insulating film 1010 as a mask until a buried oxide film 1002 is exposed. With this RIE process, the silicon active layer 1003 is exposed under the element sidewall insulating film 1010, and a lower structure 1003a connected to a contact electrode for electrically connecting a gate electrode is formed. The impurity concentration of the portion where the silicon active layer 1003 is exposed is preferably increased by oblique ion implantation to decrease the contact resistance to a gate electrode to be formed later.

As shown in FIGS. 16E and 17E, the surface of the exposed lower structure 1003a of the silicon active layer 1003 is thermally oxidized. After that, a polysilicon film is deposited to cover the silicon nitride film 2401 and element sidewall insulating film 1010 and etched by RIE to form a dummy contact 2402 connected to the silicon active layer 1003 around the element region.

As shown in FIGS. 16F and 17F, a silicon oxide film is deposited on the entire surface and planarized by CMP to form an element isolation insulating film 1013. The silicon oxide film is selectively etched to recess the surface of the element isolation insulating film 1013. The surface of the element sidewall insulating film 1010 formed from silicon oxide is also simultaneously recessed.

Figure 17G:
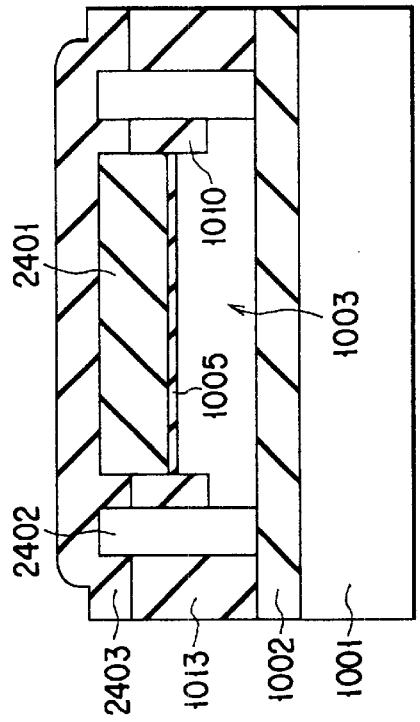
Figure 17H:
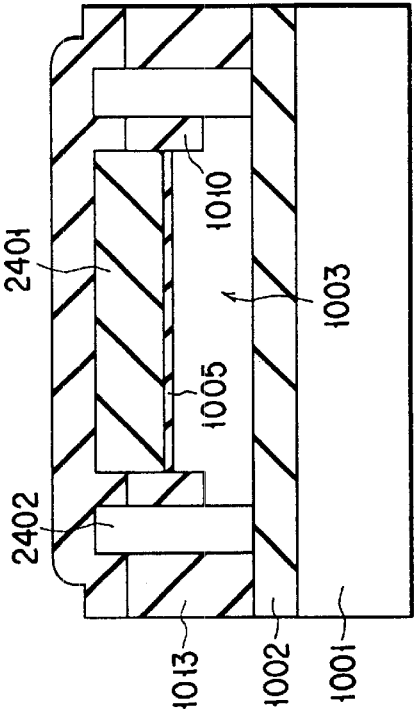
Figure 16G:
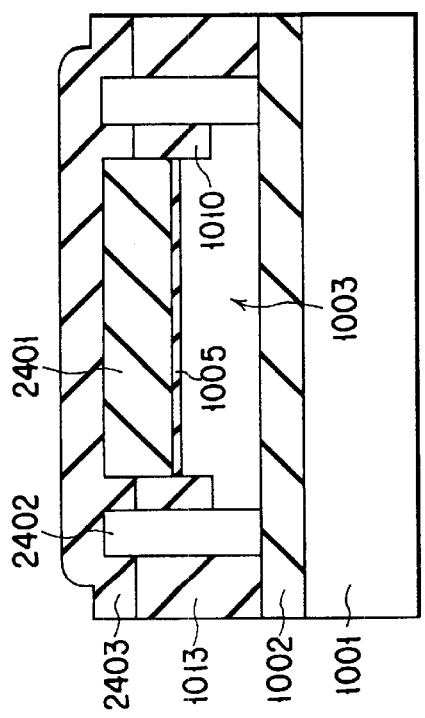
Figure 16H:
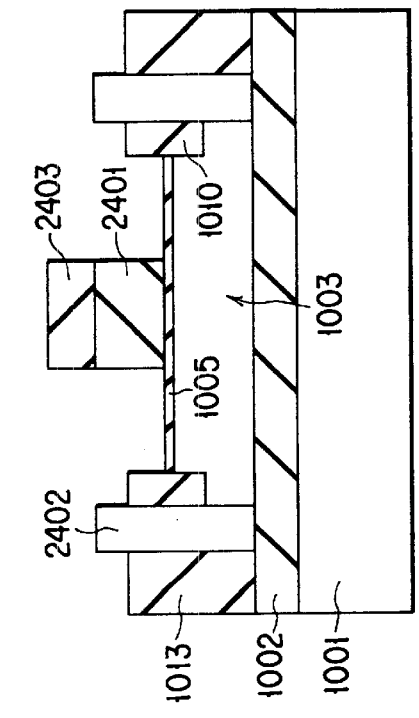

As shown in FIGS. 6G and 17G, a silicon nitride film 2403 is deposited on the entire surface. Next, as shown in FIGS. 16H and 17H, a resist pattern (not shown) is formed on the silicon nitride film 2403 in the gate electrode region by lithography. The silicon nitride films 2403 and 2401 are etched by RIE using the resist pattern as a mask to leave the silicon nitride films 2401 and 2403 only in the gate electrode region, and then, the resist pattern is removed. The remaining silicon nitride films 2401 and 2403 will be referred to as a disposable gate 2401 and 2403 hereinafter.

Figure 17I:
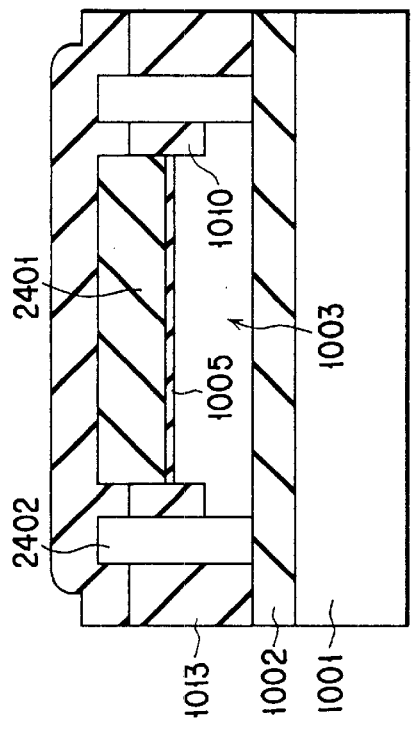
Figure 17J:
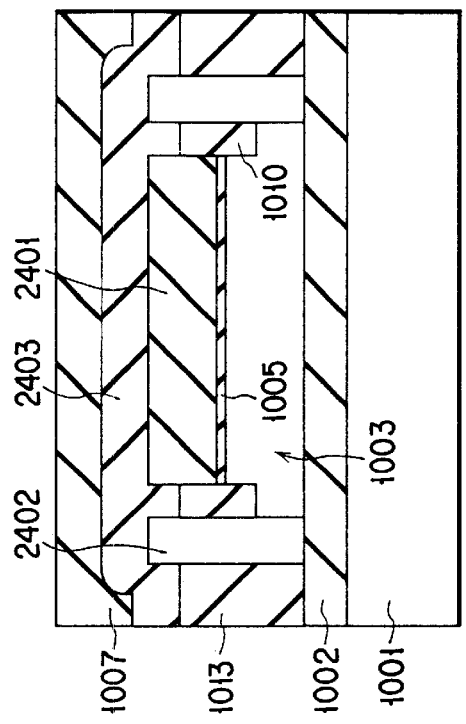
Figure 16I:
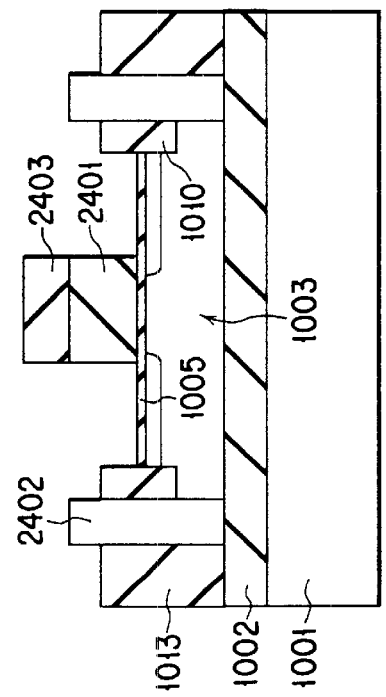
Figure 16J:
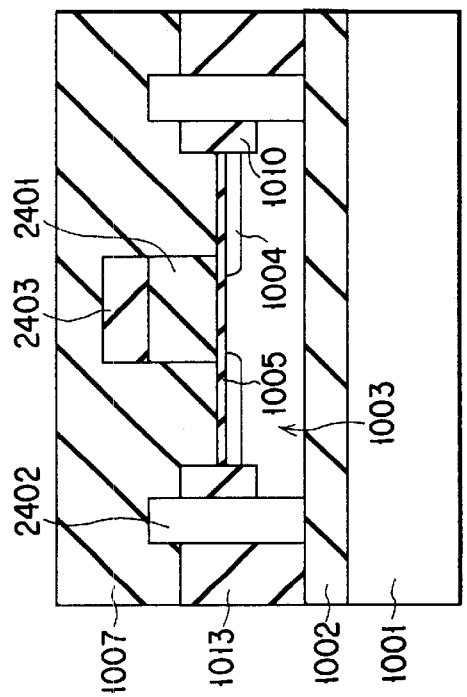
Figure 17K:
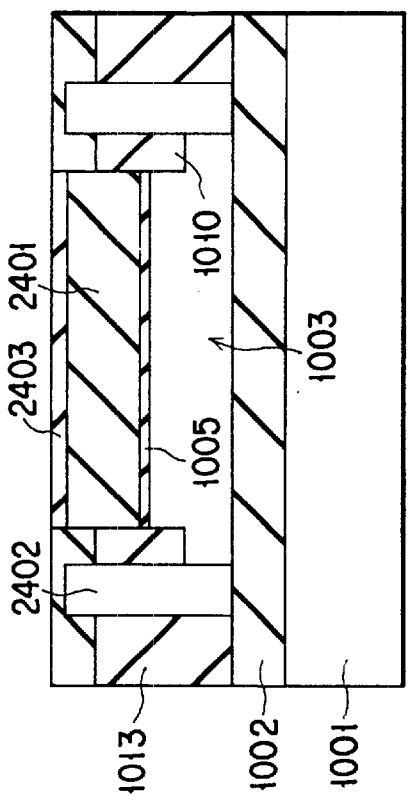
Figure 17L:
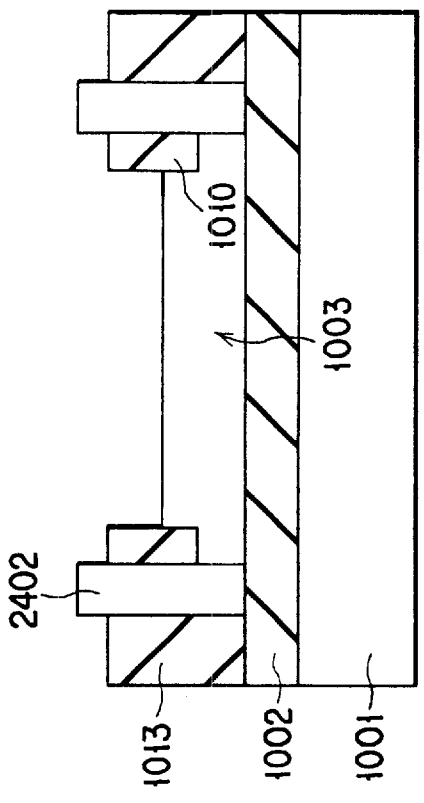
Figure 16K:
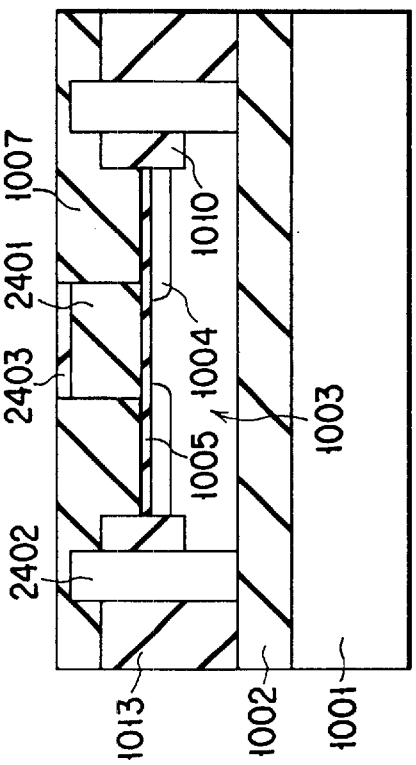
Figure 16L:
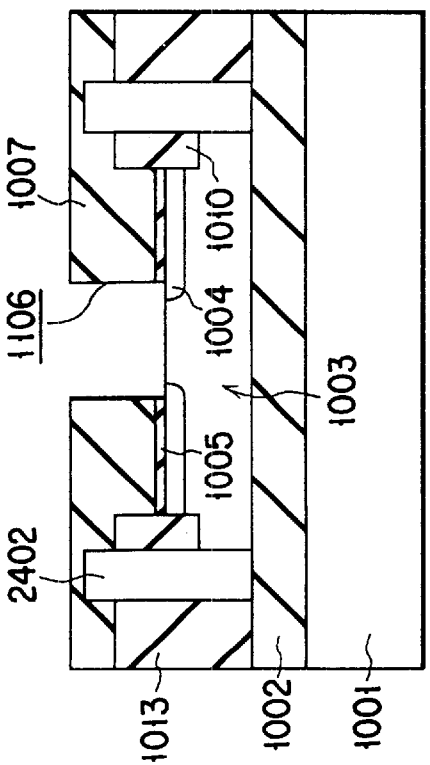
Figure 170:
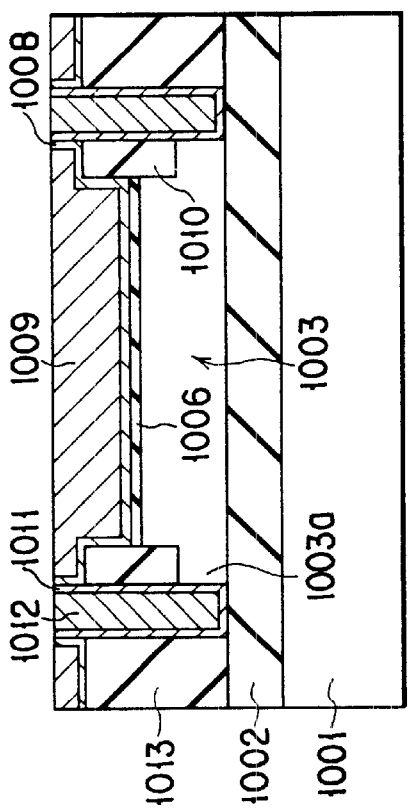
Figure 160:
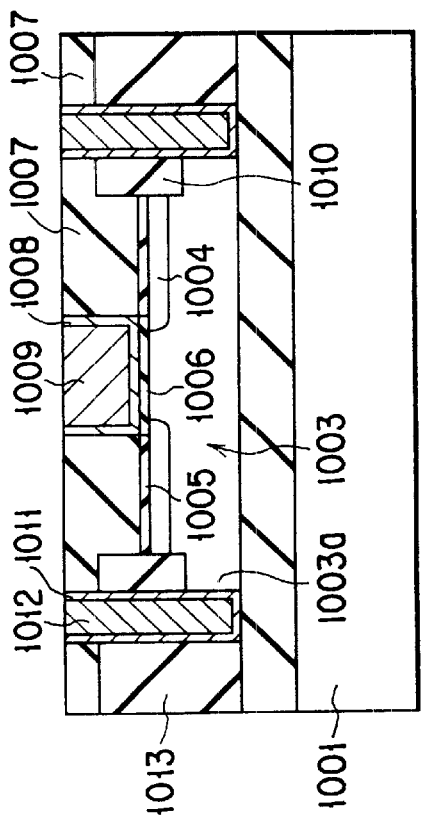

As shown in FIGS. 16I and 17I, ion implantation using the disposable gates 2401 and 2403 as a mask and activation annealing are performed to form a source and drain 1004. Next, as shown in FIGS. 16J and 17J, an ba interlayer insulating film 1007 is deposited on the entire surface. As shown in FIGS. 16K and 17K, the interlayer insulating film 1007 is planarized by CMP to expose the surface of the disposable gates 2401 and 2403. As shown in FIGS. 6L and 17L, the disposable gates 2401 and 2403 formed from silicon nitride are selectively removed to form a gate groove 1106. As shown in FIGS. 16M and 17M, the surface of the silicon active layer 1003 exposed to the bottom surface of the gate groove 1106 is oxidized to form a gate insulating film 1006. Materials of a barrier metal 1008 and gate electrode 1009 are sequentially deposited and planarized by CMP to selectively form the barrier metal 1008 and gate electrode 1009 in the gate groove 1106.

As shown in FIGS. 16N and 17N, the dummy contact 2402 formed from polysilicon is removed by using CDE. After that, the oxide film on the surface of the transistor body is removed by diluted hydrofluoric acid treatment to form a contact trench 1107 in which the lower structure 1003a is exposed.

As shown in FIGS. 16O and 17O, a barrier metal 1011 and contact electrode 1012 formed from Al are deposited and planarized by CMP to form the contact electrode 1012 for electrically connecting the gate electrode 1009 and the lower structure 1003a of the silicon active layer 1003.

Seventh Embodiment

In this embodiment, a DTMISFET is formed not on an SOI substrate but on a normal bulk polysilicon substrate.

FIGS. 18A to 18E are cross-sectional views corresponding to a section taken along a line X–X' in FIG. 13. FIGS. 19A to 19E are cross-sectional views corresponding to a section taken along a line XI–XI' in FIG. 13.

Figure 18A:
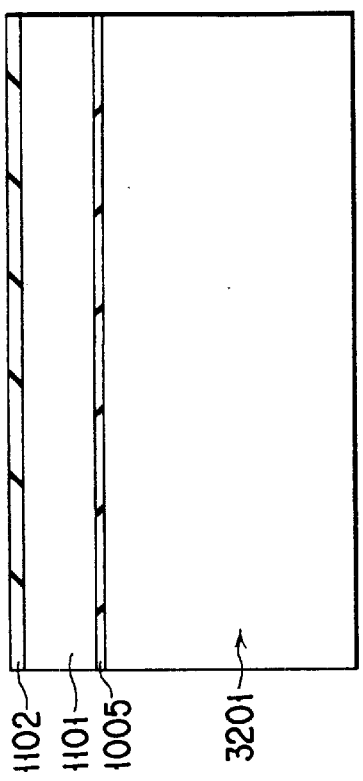
FIGS. 18A to 18E are cross-sectional views (corresponding to the section taken along the line X–X' in FIG. 13) showing the steps in manufacturing the DTMISFET according to the seventh embodiment of the present invention.
Figure 19A:
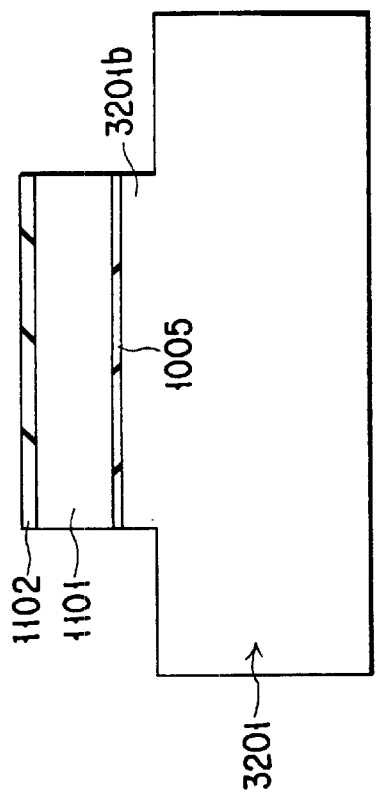
FIGS. 19A to 19E are cross-sectional views (corresponding to the section taken along the line XI–XI' in FIG. 13) showing the steps in manufacturing the DTMISFET according to the seventh embodiment of the present invention.

First, as shown in FIGS. 18A and 19A, after a buffer oxide film 1005 is formed on a single-crystal Si substrate 3201, a polysilicon film 1101 and silicon nitride film 1102 are sequentially deposited.

Figure 18B:
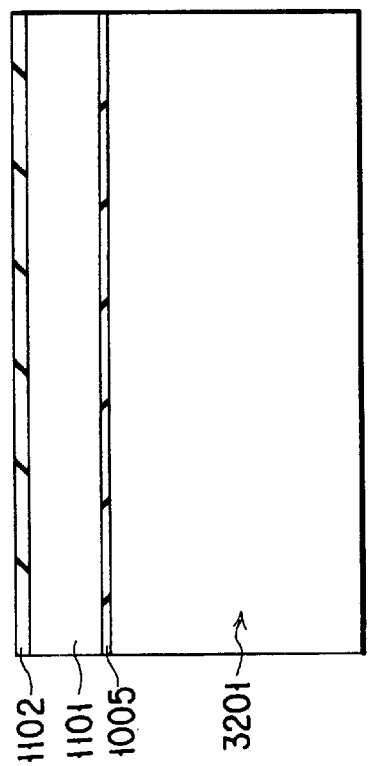
Figure 19B:
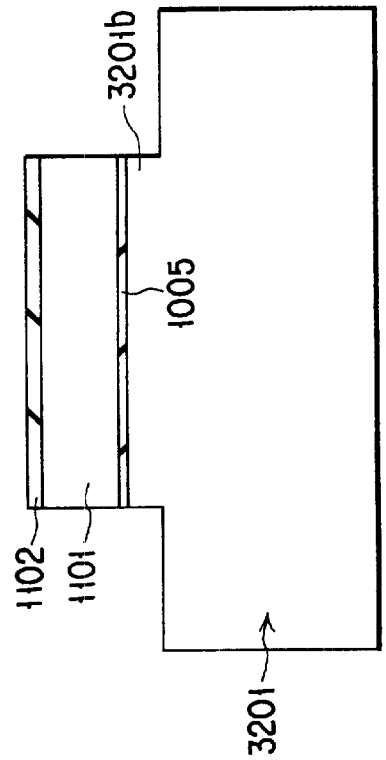

As shown in FIGS. 18B and 19B, after a resist pattern (not shown) is formed by drawing the pattern of an element region by lithography, the silicon nitride film 1102, polysilicon film 1101, buffer oxide film 1005, and single-crystal Si substrate 3201 are etched by RIE. At this time, instead of etching the entire single-crystal Si substrate 3201 in the direction of depth, the single-crystal Si substrate 3201 is etched by a depth of 150 to 200 nm to form an upper structure 3201b.

Figure 18C:
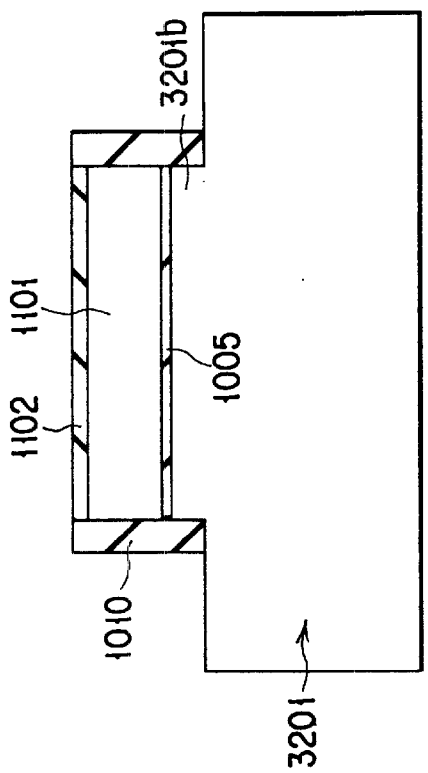
Figure 19C:
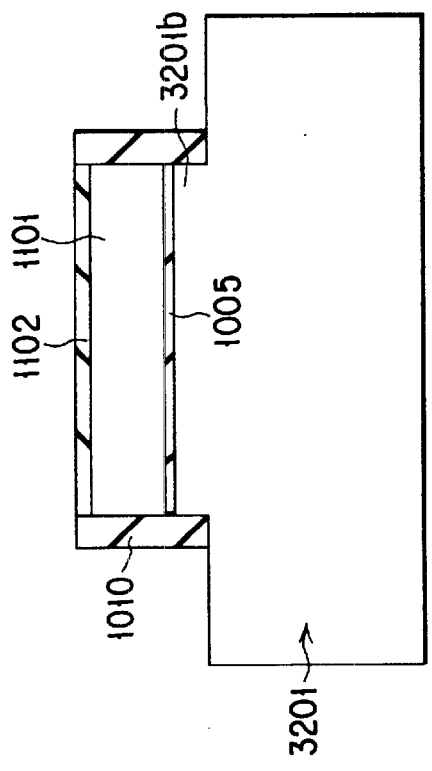

As shown in FIGS. 18C and 19C, a silicon oxide film is deposited and etched by RIE to form an element sidewall insulating film 1010 to completely surround the side portion of the upper structure 3201b.

Figure 18D:
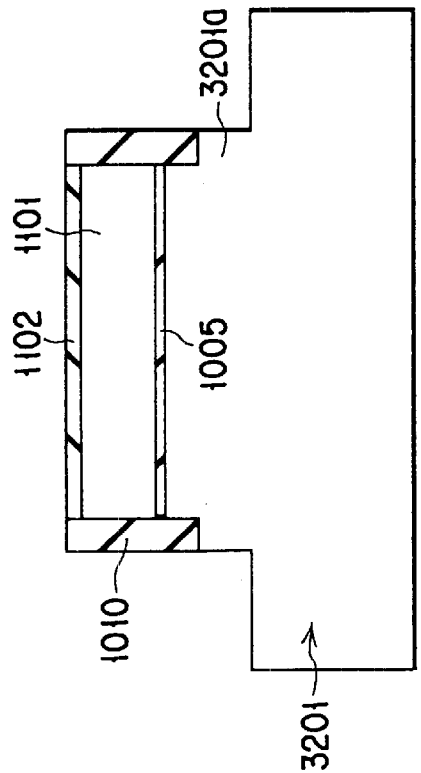
Figure 19D:
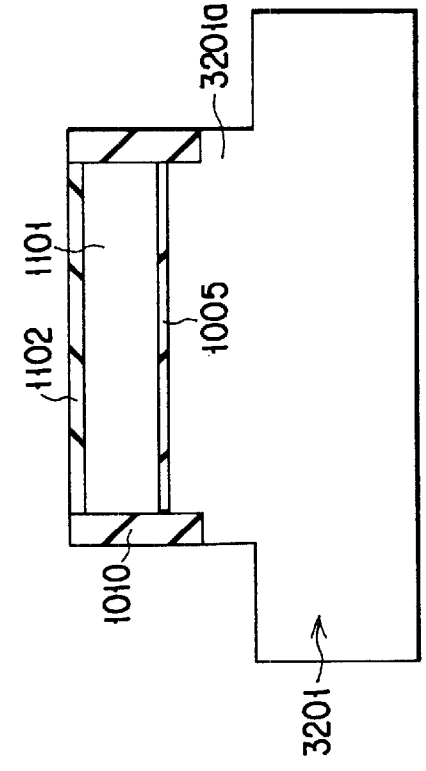

As shown in FIGS. 18D and 19D, the single-crystal Si substrate 3201 is etched by RIE using the silicon nitride film 1102 and element sidewall insulating film 1010 as a mask to form a lower structure 3201a under the element sidewall insulating film 1010 of the upper structure 3201b. An impurity is preferably implanted into the exposed lower structure 3201a by oblique ion implantation to increase the impurity concentration and decrease the contact resistance to a gate electrode to be formed later.

Figure 19E:
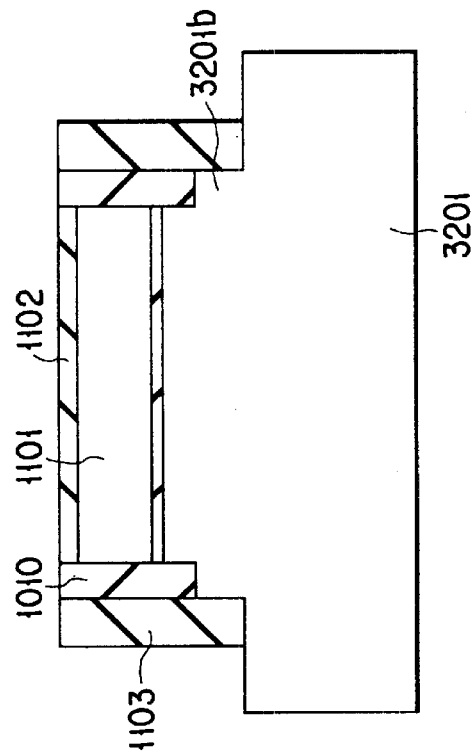
Figure 18E:
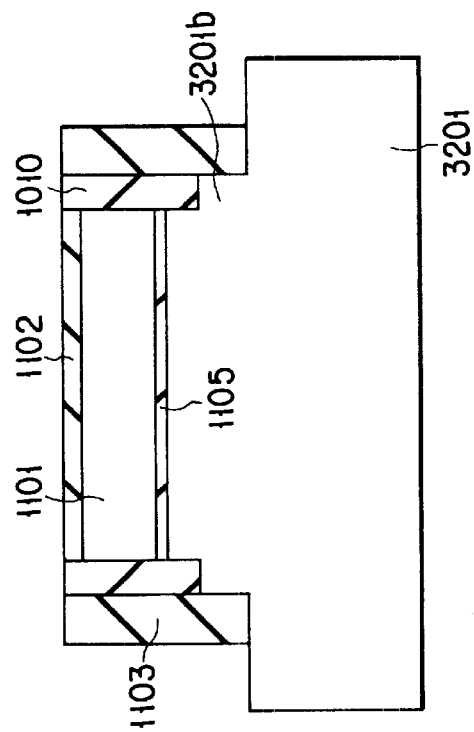

As shown in FIGS. 18E and 19E, a silicon nitride film is deposited on the entire surface and etched by RIE to form a dummy contact 1103 on the side surfaces of the element sidewall insulating film 1010 and lower structure 3201a.

The subsequent processes are the same as those described with reference to FIGS. 8F to 8P and 9F to 9P, and a detailed description thereof will be omitted.

Eighth Embodiment

Figure 20A:
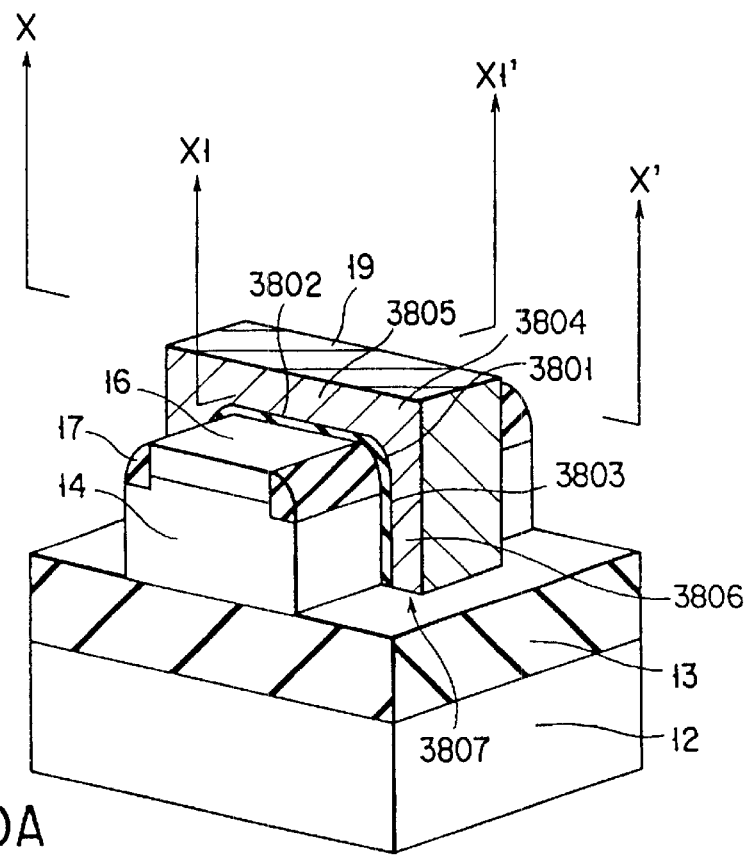
FIG. 20A is a perspective view showing the structure of a DTMISFET according to the eighth embodiment of the present invention.
Figure 20B:
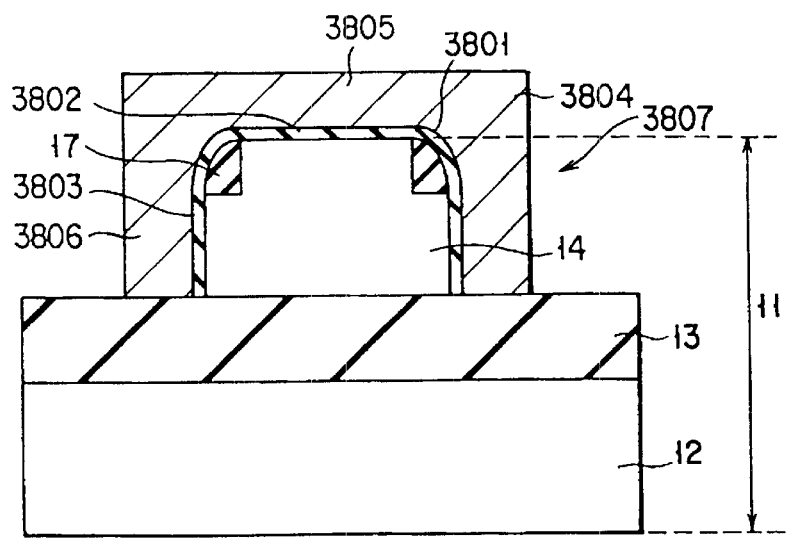
FIG. 20B is a cross-sectional view showing a section taken along a line X–X' in FIG. 20A.

FIG. 20A is a perspective view showing the structure of a DTMISFET according to the eighth embodiment of the present invention. FIG. 20B is a cross-sectional view showing a section taken along a line X–X' in FIG. 20A. In this device, a metal gate N-channel MOSFET is formed on the basis of mesa-type element isolation.

As shown in FIGS. 20A and 20B, in this embodiment, an SOI substrate 11 in which a single-crystal Si substrate 12, silicon oxide film 13, and island-shaped Si-body (well region) 14 are sequentially stacked is used as a semiconductor substrate. The island-shaped Si-body 14 is comprised of a lower structure 14a and an upper structure 14b formed on the lower structure 14a and having a smaller cross-sectional area parallel to the surface of the substrate than that of the lower structure 14a. The upper surface of the lower structure 14a is exposed to the periphery of the upper structure 14b.

A sidewall insulating film 17 is formed in contact with the side surface of the upper structure 14b and upper surface of the lower structure 14a of the island-shaped Si-body. A $Ta_2O_5$ film 3801 is formed along the surfaces of the Si-body 14 and sidewall insulating film 17. The $Ta_2O_5$ film 3801 formed on the upper structure 14b of the Si-body becomes a gate insulating film 3802 of the DTMISFET. The $Ta_2O_5$ film 3801 formed on the side surface of the lower structure 14a of the Si-body becomes a capacitor insulating film 3803.

A metal electrode 3804 is formed along the surface of the $Ta_2O_5$ film 3801. The metal electrode 3804 formed via the $Ta_2O_5$ film 3801 (gate insulating film 3802) on the upper structure 14b of the Si-body becomes a gate electrode 3805. The metal electrode 3804 formed via the $Ta_2O_5$ film 3801 (capacitor insulating film 3803) on the side surface of the lower structure 14a of the Si-body becomes a capacitor electrode 3806. A source and drain 16 are formed in the surface layer of the Si-body 14 so as to sandwich a gate electrode 19. Hence, a capacitor 3807 is formed on the side surface of the lower structure 14a of the Si-body, and a MISFET is formed on the upper structure 14b of the Si-body.

The gate electrode 3805 of the MISFET and the capacitor electrode 3806 of the capacitor 3807 are formed from the same metal electrode 3804. Hence, the gate electrode 3805 of the MISFET is electrically connected to the lower structure 14a of the Si-body through the capacitor 3807.

The sidewall insulating film 17 is formed on the upper surface of the lower structure 14a of the Si-body and the side surface of the upper structure 14b of the Si-body to insulate and isolate the gate from the source/drain and reduce the capacitance therebetween.

In this device, since electrical connection between the gate electrode 19 and the Si-body is done at a part of the side surface of the lower structure 14a of the Si-body, the conventional problem of an increase in device area can be solved. In addition, since the gate and Si-body are electrically connected via the capacitor formed on the side surface of the lower structure 14a of the Si-body, the area can be reduced, and the leakage current between the source/drain and the Si-body can be largely decreased. Furthermore, according to this embodiment, the gate and Si-body can be connected by self-alignment, so the area can be reduced, and the process can be simplified.

A method of manufacturing this device will be described with reference to the accompanying drawing. FIGS. 21A to 21J and 22A to 22J are cross-sectional views showing the steps in manufacturing the DTMISFET shown in FIGS. 20A and 20B. FIGS. 21A to 21J are cross-sectional views corresponding to the section taken along the line X–X' in FIG. 20A. FIGS. 22A to 22J are cross-sectional views corresponding to a section taken along a line XI–XI' in FIG. 20A.

First, as shown in FIGS. 21A and 22A, the SOI substrate 11 in which the single-crystal Si substrate 12, silicon oxide film 13, and Si semiconductor layer 14 are stacked is prepared.

As shown in FIGS. 21B and 22B, a 5-nm thick thermal oxide film 21 is formed on the surface of the Si semiconductor layer 14, and then, a 100-nm thick $Si_3N_4$ film 3811 is deposited by using LPCVD. After a resist pattern (not shown) is formed on the $Si_3N_4$ film 3811 in the element region, the $Si_3N_4$ film 3811, thermal oxide film 21, and Si semiconductor layer 14 are sequentially etched by RIE to form a 100-nm deep trench in the Si semiconductor layer 14, thereby forming the upper structure 14b of the Si-body. After the resist pattern is removed, the surface of the Si-body 14 is oxidized to form a thin (5-nm thick at maximum) $SiO_2$ layer (not shown).

Figure 22C:
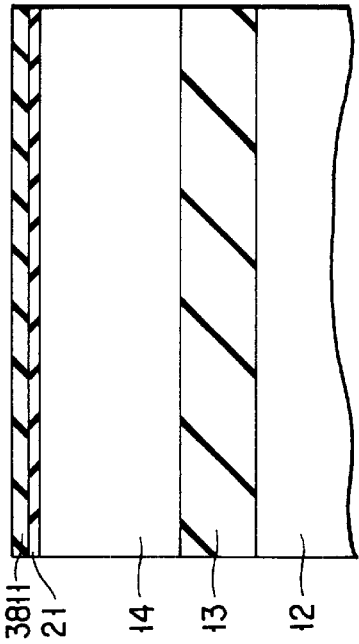
Figure 21C:
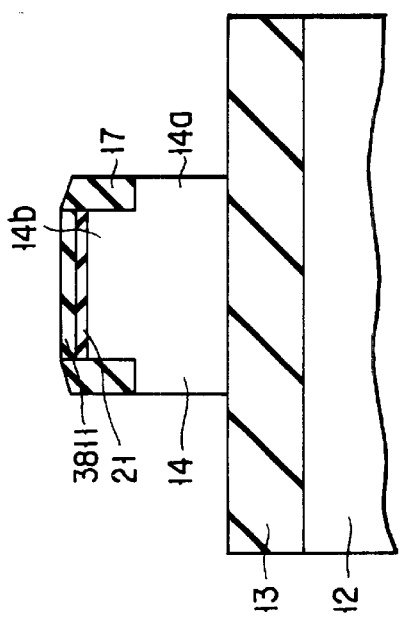

As shown in FIGS. 21C and 22C, an $Si_3N_4$ film is deposited on the entire surface and etched by RIE to form the 30-nm thick sidewall insulating film 17 formed from the $Si_3N_4$ film on the side surface of the upper structure 14b of the Si-body. The Si semiconductor layer 14 is etched using the sidewall insulating film 17 and $Si_3N_4$ film 3811 as a mask until the $SiO_2$ film 13 is exposed. Since the $Si_3N_4$ film 3811 is also simultaneously etched, the film thickness decreases.

Figure 22D:
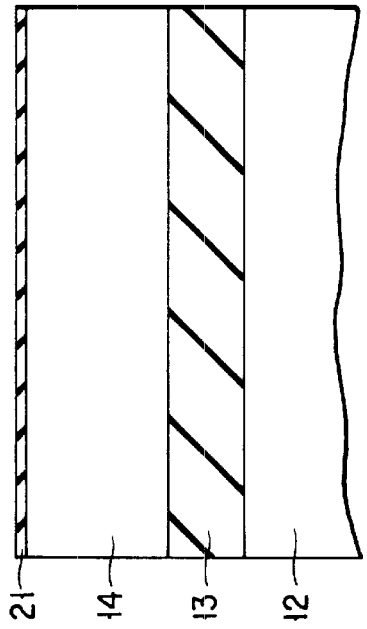
Figure 21D:
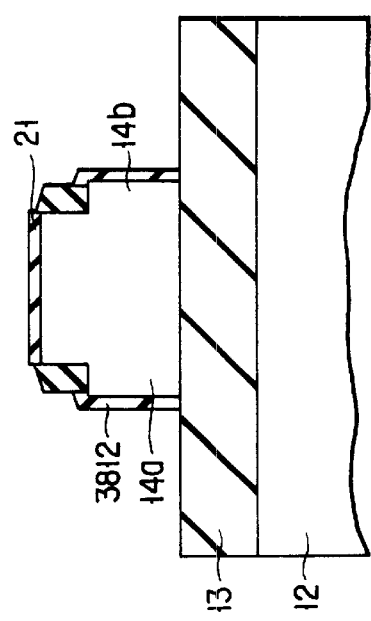

As shown in FIGS. 21D and 22D, to remove the $Si_3N_4$ film 3811 on the upper surface of the upper structure 14b of the Si-body, RIE or hot phosphoric acid treatment is performed in a small etching amount. The side surface of the lower structure 14a of the Si-body is oxidized to form a silicon oxide film 3812.

Figure 22E:
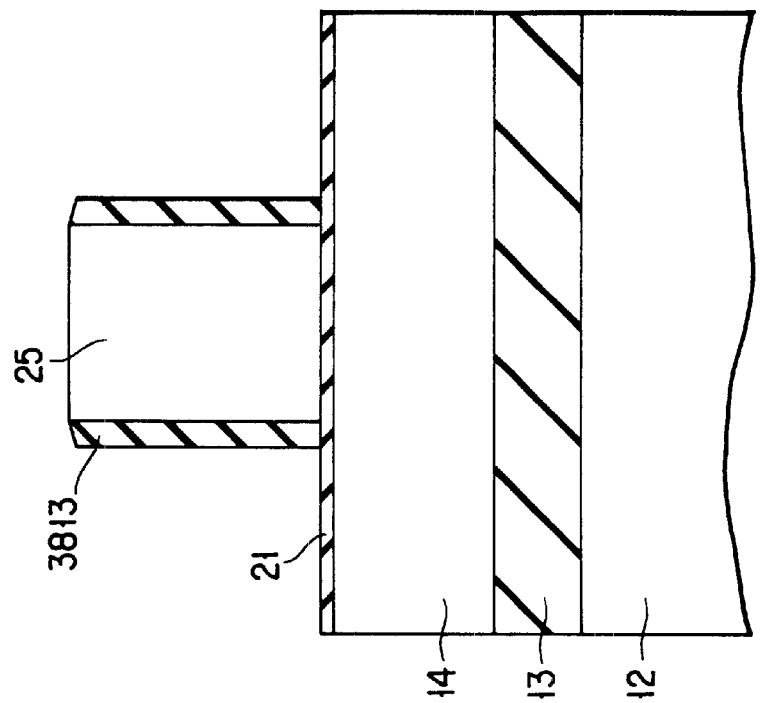
Figure 21E:
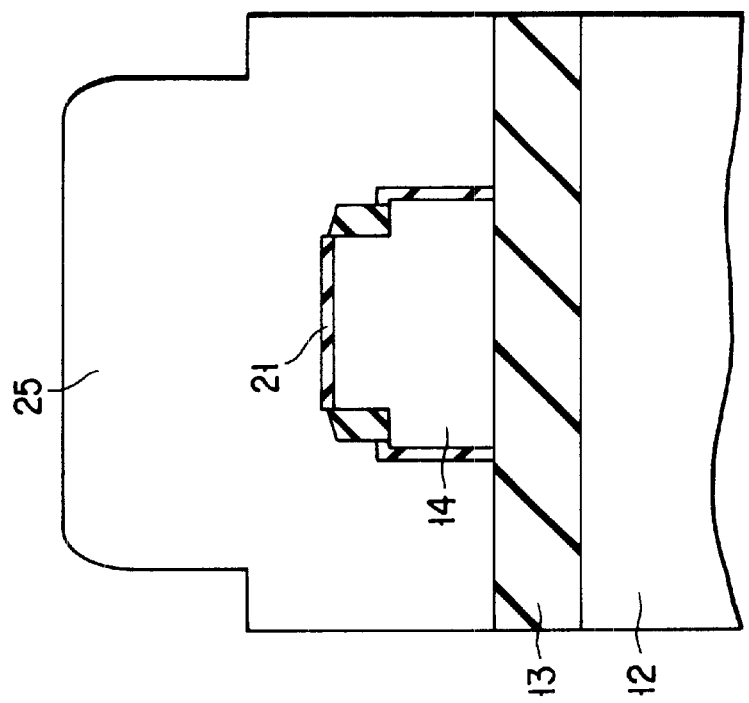

As shown in FIGS. 21E and 22E, a 400-nm thick polysilicon film 25 is deposited on the entire surface as the material of a gate (to be called as a disposable gate) that will be removed later. A resist pattern (not shown) used to form the disposable gate is formed, and the polysilicon film 25 is etched. If necessary, the polysilicon film 25 may be etched after the convex of the polysilicon film 25 is planarized by CMP (Chemical Mechanical Polishing). After that, the resist is removed, and an $Si_3N_4$ film is deposited and etched by RIE to form an $Si_3N_4$ film 3813 (film thickness: 20 nm) on the side surface of the polysilicon film 25.

Figure 22F:
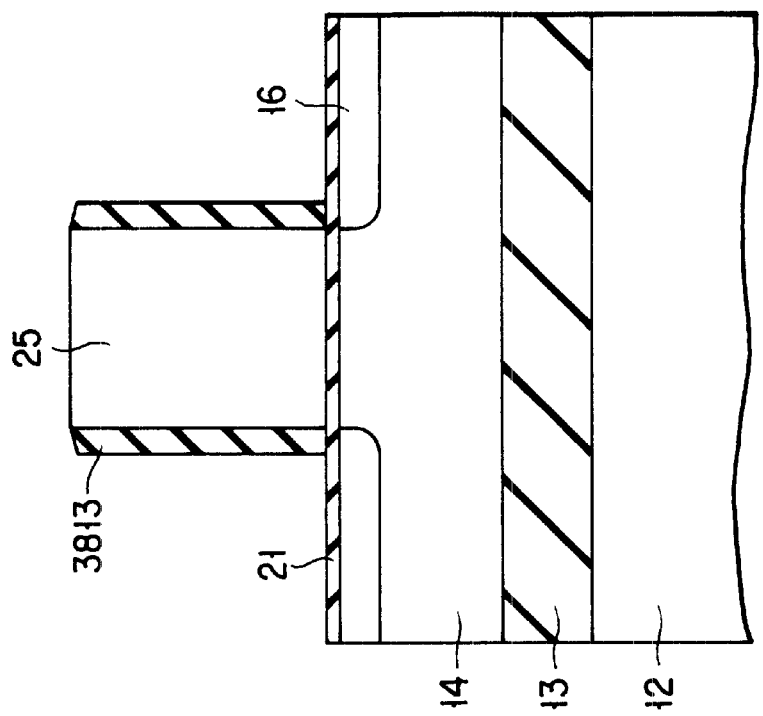

As shown in FIGS. 21F and 22F, extension or deep-junction ion implantation is performed using the polysilicon film 25 as a mask, thereby forming the source and drain 16. Extension-n⁻ implantation conditions are, e.g., As, 15 keV, and $3 \times 10^{14}$ $cm^{-2}$. Deep-n⁺ diffusion layer implantation conditions are, e.g., As, 45 keV, and $3 \times 10^{15}$ $cm^{-2}$. The source and drain are also activated (1,000° C. at maximum) at this time.

Since the source and drain are already formed, a high-temperature process at 600° C. is no longer present. For this reason, as the gate insulating film, not only an $SiO_2$ film but also a high-permittivity film (high-k film) such as a $Ta_2O_5$ film, $TiO_2$ film, $HfO_2$ film, $ZrbO_2$ film, or $(Ba, Si)TiO_3$ film can be used. As the gate electrode, a metal material can be used. When the gate insulating film is formed from a high-permittivity film, the gate electrode material need be selected in accordance with the used gate insulating film, and, for example polysilicon, TiN, Al, W, or Ru can be used. In many cases, a TiN or WN film is preferably formed between the gate insulating film and the gate electrode material as a barrier metal.

As shown in FIGS. 21G and 22G, a TEOS-$SiO_2$ film 3814 is deposited on the entire surface and planarized by CMP to expose the upper surface of the polysilicon film 25.

As shown in FIGS. 21H and 22H, the polysilicon film 25 is removed by CDE to form a trench 3815 in which the gate material is to be buried in the gate formation region. The process conditions at this time are set not to remove the $Si_3N_4$ film 3813 and sidewall insulating film 17 formed from the $Si_3N_4$ film.

Figure 22I:
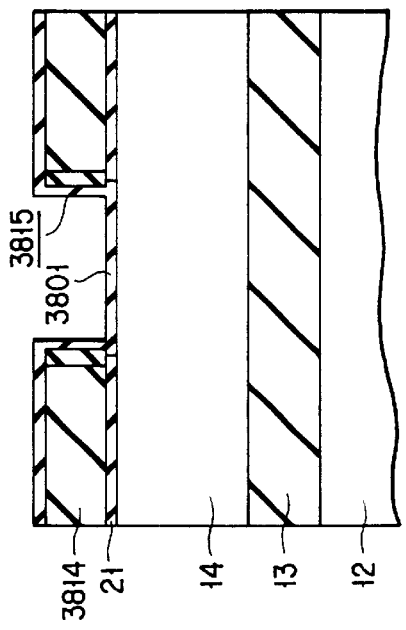
Figure 21I:
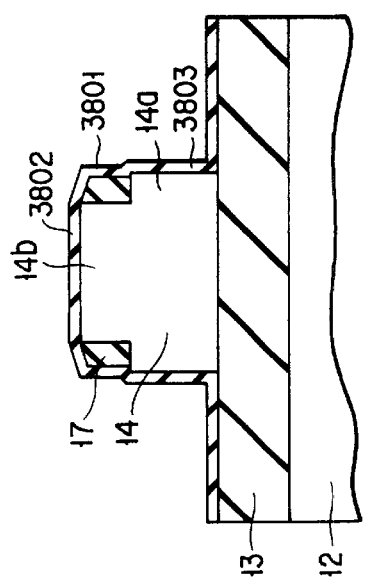

As shown in FIGS. 21I and 22I, the $SiO_2$ films 21 and 3812 are removed by HF-based wet etching. After that, the $Ta_2O_5$ film 3801 is formed by CVD. The $Ta_2O_5$ film 3801 becomes the capacitor insulating film 3803 on the lower structure 14a of the Si-body and the gate insulating film 3802 on the upper structure 14b of the Si-body.

Figure 22J:
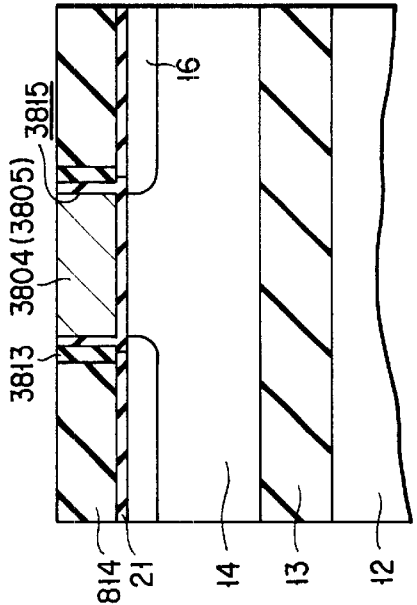
Figure 21J:
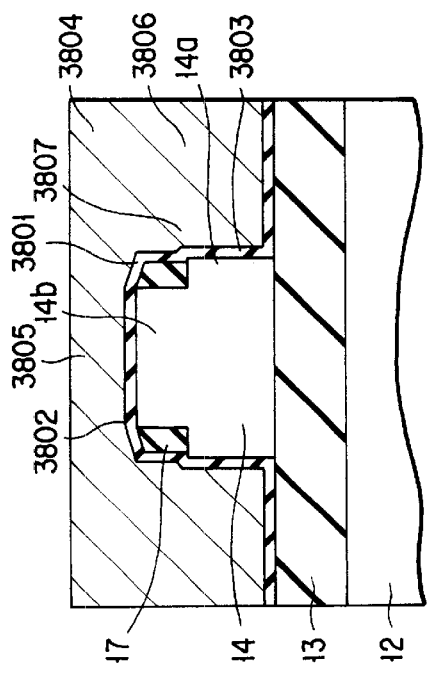

As shown in FIGS. 21J and 22J, a multilayered metal film of W/TiN (film thickness: 400 nm/5 nm) is formed by CVD or sputtering, planarized by CMP, and patterned to form the metal electrode 3804 buried in the trench. The metal electrode 3804 formed via the $Ta_2O_5$ film 3801 (gate insulating film 3802) on the upper structure 14b of the Si-body becomes the gate electrode 3805. The metal electrode 3804 formed via the $Ta_2O_5$ film 3801 (capacitor insulating film 3803) on the side surface of the lower structure 14a of the Si-body becomes the capacitor electrode 3806.

With the above-described manufacturing process, a MISFET is formed on the upper structure 14b of the Si-body, and the gate electrode 3805 and the lower structure 14a of the island-shaped Si-body are connected via the capacitor 3807 by self-alignment.

The process after metal gate electrode formation is the same as the normal LSI manufacturing process. A TEOS-based interlayer insulating film is deposited by CVD, contact holes are formed on the source and drain and the gate electrode, and upper metal inter-connections are formed (not shown).

As described above, according to this embodiment, since electrical connection between the gate and the Si-body is done at part of the side surface of the element region Si, the conventional problem of an increase in device area can be solved. In addition, since the gate electrode and Si-body are electrically connected via the capacitor formed on the side surface of the lower structure of the Si-body, the area can be reduced, and the leakage current between the source/drain and the Si-body can be largely decreased. Furthermore, according to this embodiment, the gate and Si-body can be connected by self-alignment, so the area can be reduced, and the process can be simplified.

Ninth Embodiment

Figure 23A:
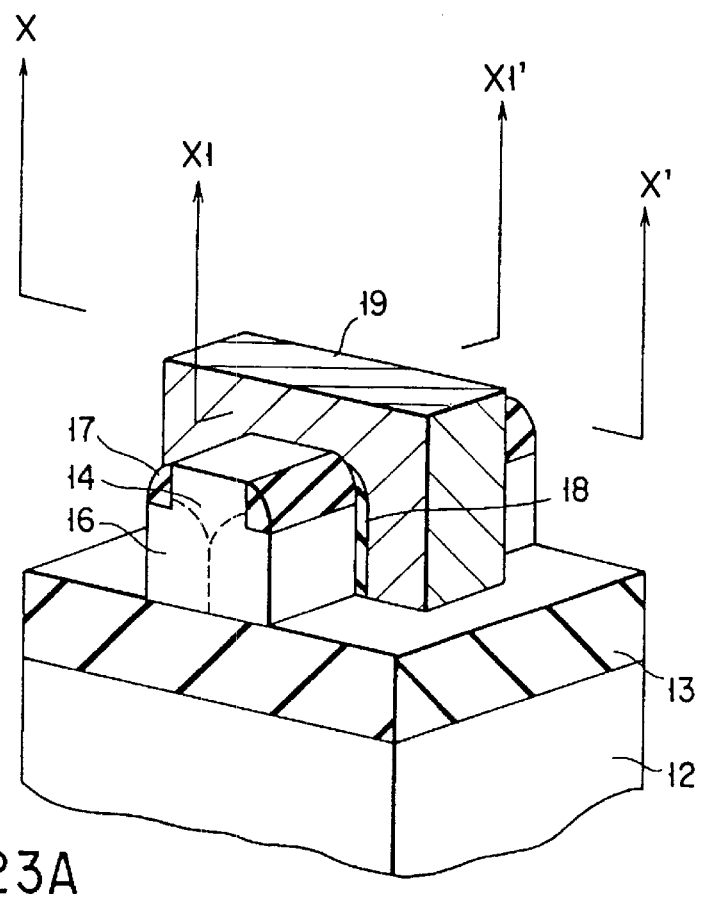
FIG. 23A is a perspective view showing the structure of a DTMISFET according to the ninth embodiment of the present invention.
Figure 23B:
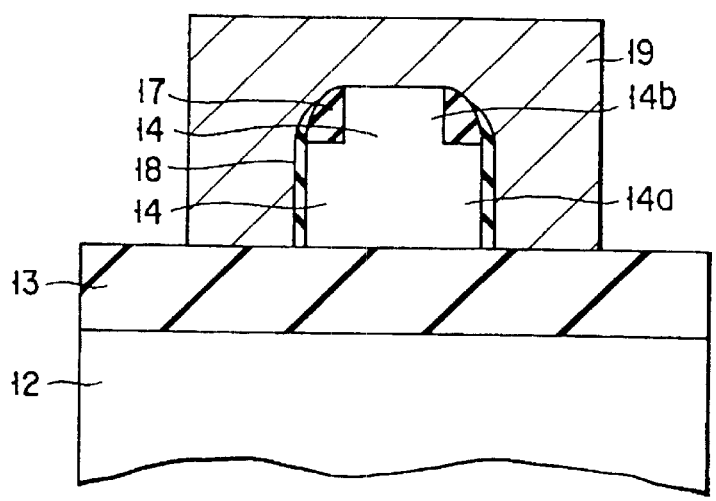
FIG. 23B is a cross-sectional view showing a section taken along a line X–X' in FIG. 23A.

FIG. 23A is a perspective view showing the structure of a DTMISFET according to the ninth embodiment of the present invention. FIG. 23B is a cross-sectional view showing a section taken along a line X–X' in FIG. 23A. In this device, a metal gate N-channel MOSFET is formed on the basis of mesa-type element isolation.

As shown in FIGS. 23A and 23B, in this embodiment, an SOI substrate 11 in which a single-crystal Si substrate 12, silicon oxide film 13, and island-shaped Si-body (well region) 14 are sequentially stacked is used as a semiconductor substrate. The island-shaped Si-body 14 is comprised of a lower structure 14a and an upper structure 14b formed on the lower structure 14a and having a smaller cross-sectional area parallel to the surface of the substrate than that of the lower structure 14a. The upper surface of the lower structure 14a is exposed to the periphery of the upper structure 14b.

A sidewall insulating film 17 in contact with the side surface of the upper structure 14b and the upper surface of the lower structure 14a of the Si-body is formed to insulate and isolate the gate from the source/drain and reduce the capacitance therebetween. A gate insulating film 18 is formed on the side surface of the lower structure 14a of the Si-body. A metal gate electrode 19 is formed on the gate insulating film 18 in contact with the upper surfaces of the sidewall insulating film 17 and the upper structure 14b of the Si-body. The source and drain regions are so formed as to sandwich two gate electrodes formed on opposite side surfaces of the lower structure 14a of the Si-body.

According to this device, MOSFETs are formed on both side surfaces of the lower structure 14a of the Si-body, and the gate and Si-body are electrically connected on the upper surface of the upper structure 14b of the Si-body. For this reason, the device occupation area can be largely reduced, and the device is easy to manufacture. In addition, according to this embodiment, the source and drain diffusion layers formed on both side surfaces of the island-shaped Si-body are formed to bring their bottom surfaces into contact with each other. For this reason, the p-n junction area is reduced, and the leakage current between the source/drain and the Si-body can be made much smaller than that of the conventional DTMISFET.

A method of manufacturing this device will be described with reference to the accompanying drawing. FIGS. 24A to 24K and 25A to 25K are cross-sectional views showing the steps in manufacturing the DTMISFET shown in FIGS. 23A and 23B. FIGS. 24A to 24K are cross sectional views corresponding to the section taken along the line X–X' in FIG. 23A. FIGS. 25A to 25K are cross-sectional views corresponding to a section taken along a line XI–XI' in FIG. 23A.

Figure 24F:
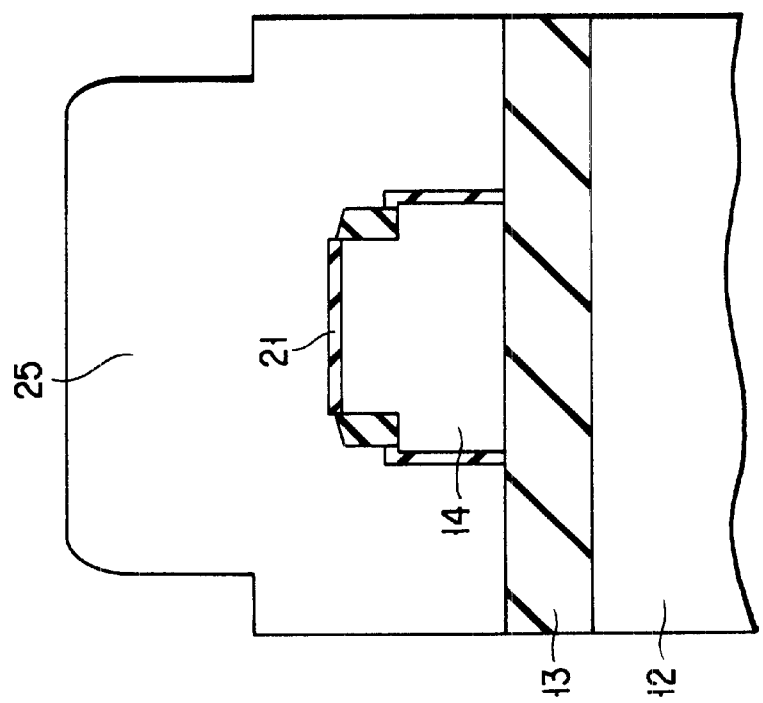
FIGS. 24A to 24K are cross-sectional views (corresponding to the section taken along the line X–X' in FIG. 23A) showing the steps in manufacturing the DTMISFET according to the ninth embodiment of the present invention.
Figure 24A:
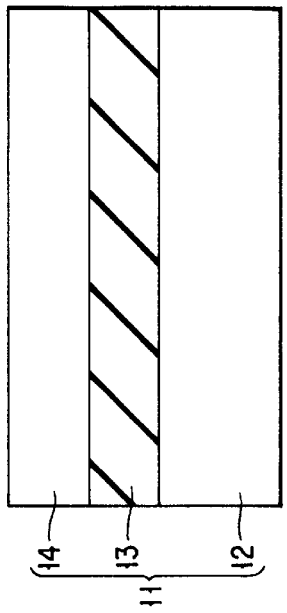
Figure 25A:
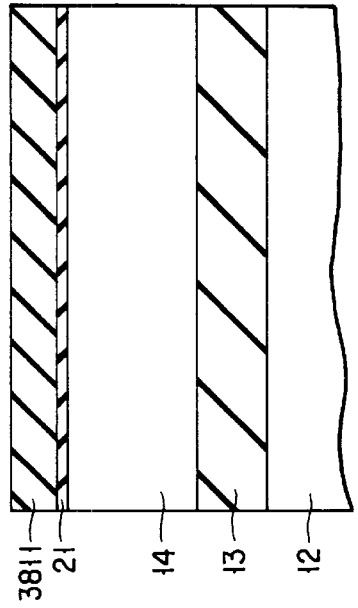
FIGS. 25A to 25K are cross-sectional views (corresponding to a section taken along a line XI–XI' in FIG. 23A) showing the steps in manufacturing the DTMISFET according to the ninth embodiment of the present invention.

First, as shown in FIGS. 24A and 25A, the SOI substrate 11 in which the single-crystal Si substrate 12, silicon oxide film 13, and Si semiconductor layer 14 are stacked is prepared.

Figure 24B:
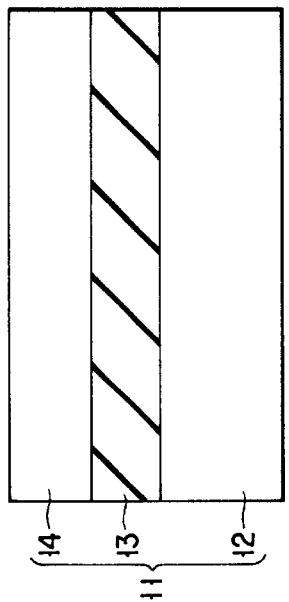
Figure 25B:
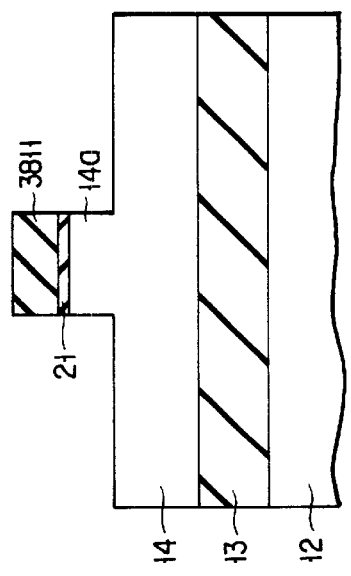

As shown in FIGS. 24B and 25B, a 5-nm thick thermal oxide film 21 is formed on the surface of the Si semiconductor layer 14, and then, a 100-nm thick $Si_3N_4$ film 3811 is deposited by LPCVD. After a resist pattern (not shown) is formed on the $Si_3N_4$ film 3811 in the element region, the $Si_3N_4$ film 3811, thermal oxide film 21, and Si-body 14 are sequentially etched by RIE to form a 100-nm deep trench in the Si-body 14, thereby forming the upper structure 14b of the Si-body. After the resist pattern is removed, the surface of the Si-body 14 is oxidized to form a thin (5-nm thick at maximum) $SiO_2$ layer (not shown).

Figure 24C:
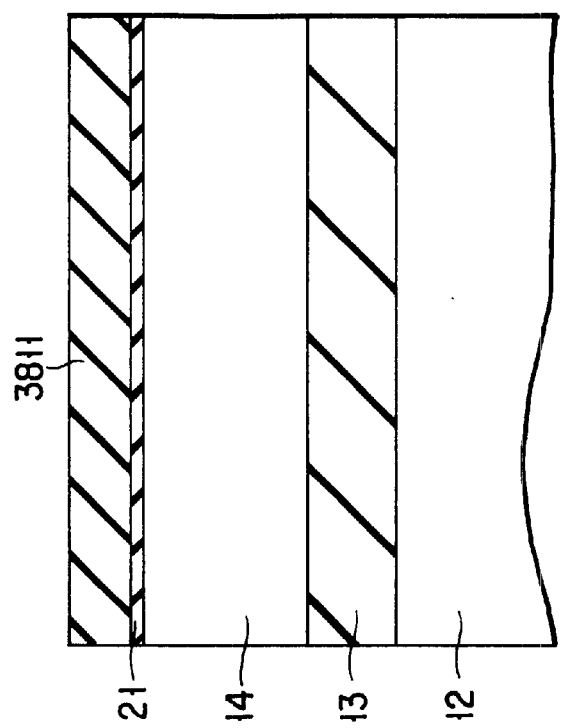
Figure 25C:
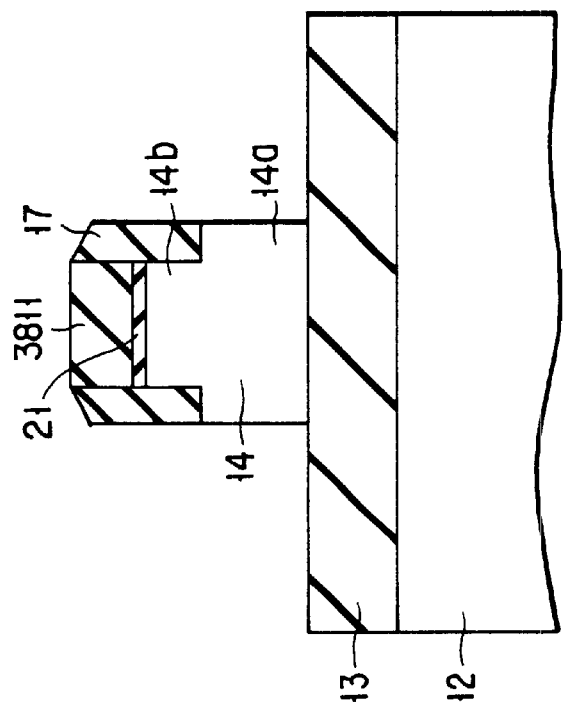

As shown in FIGS. 24C and 25C, the 30-nm thick sidewall insulating film 17 formed from an $Si_3N_4$ film is formed on the side surface of the upper structure 14b of the Si-body. The Si semiconductor layer 14 is etched using the sidewall insulating film 17 formed from the $Si_3N_4$ film and the $Si_3N_4$ film 3811 as a mask until the buried insulating film is exposed, thereby forming the lower structure 14a under the upper structure 14b of the Si-body 14.

Figure 25D:
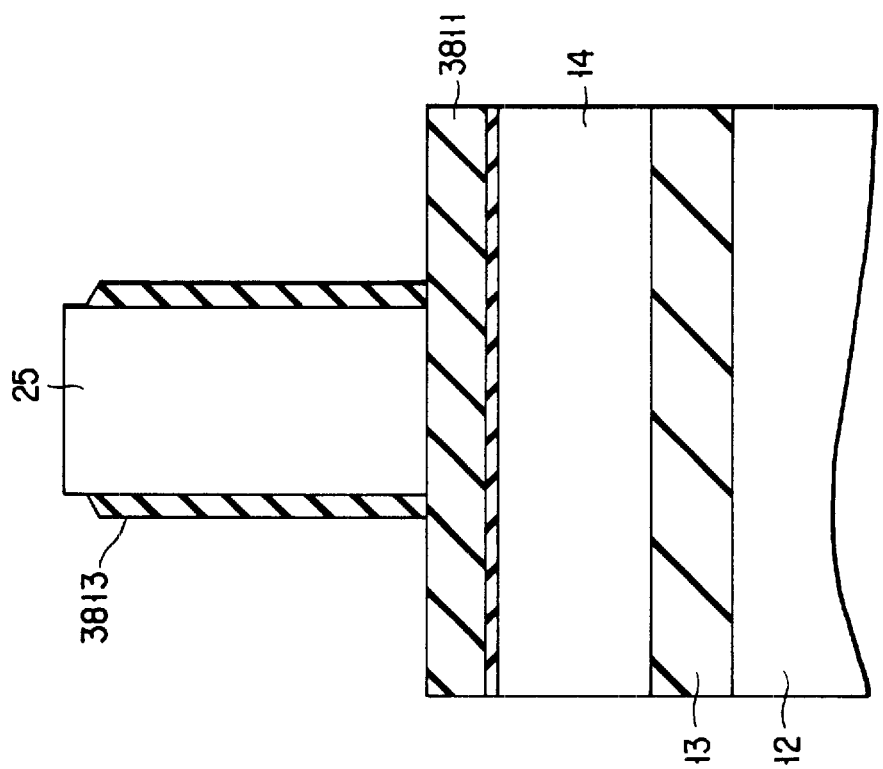
Figure 24D:
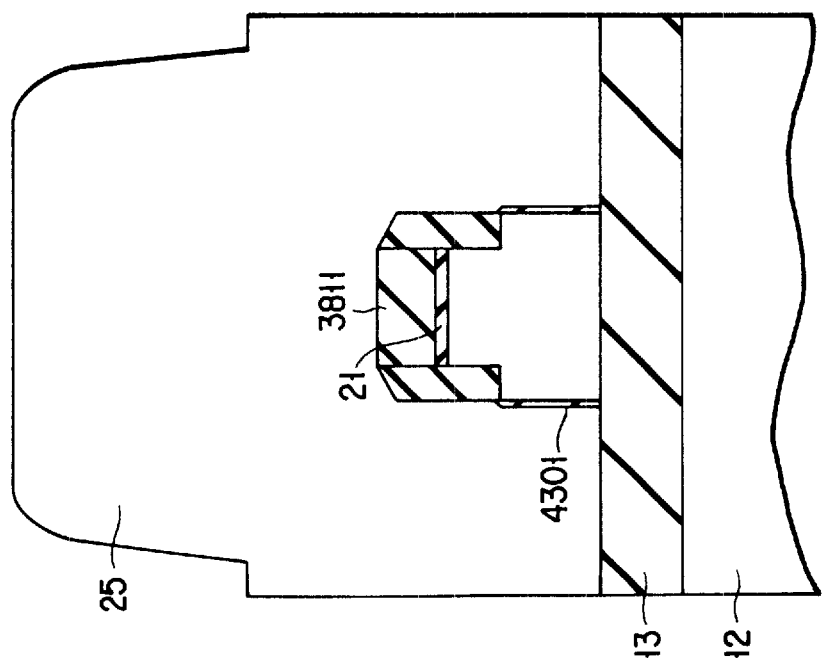

As shown in FIGS. 24D and 25D, the side surface of the lower structure 14a of the Si-body 14 is oxidized to form an oxide film 4301. After that, a 400-nm thick polysilicon film 25 is deposited on the entire surface as the material of a gate (to be called as a disposable gate) that will be removed later. A resist pattern (not shown) used to form the disposable gate is formed, and the polysilicon film 25 is etched. If necessary, the polysilicon film 25 may be etched after the convex is planarized by CMP (Chemical Mechanical Polishing). After that, the resist is removed, and a 20-nm thick $Si_3N_4$ film 3813 is formed on the sidewall of the polysilicon film 25.

Figure 25E:
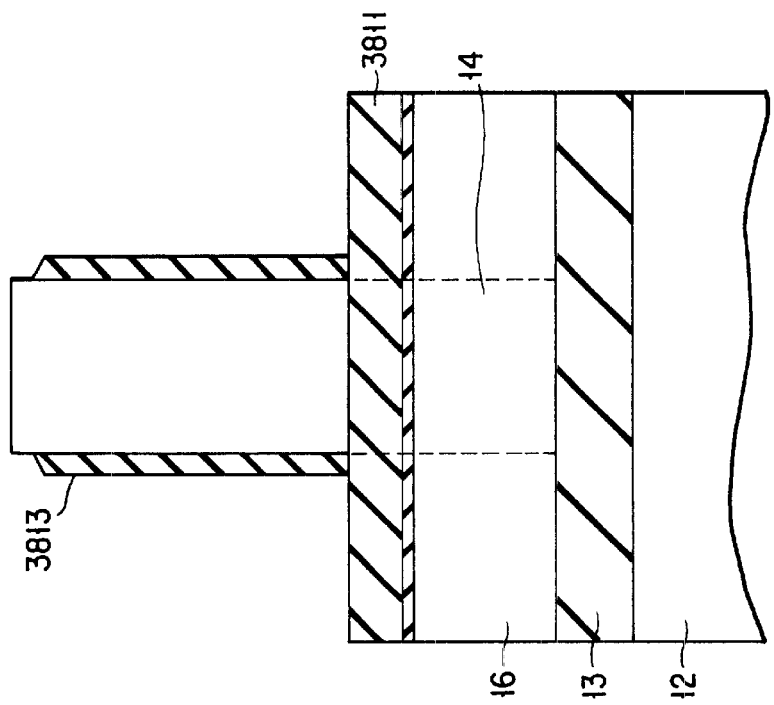
Figure 24E:
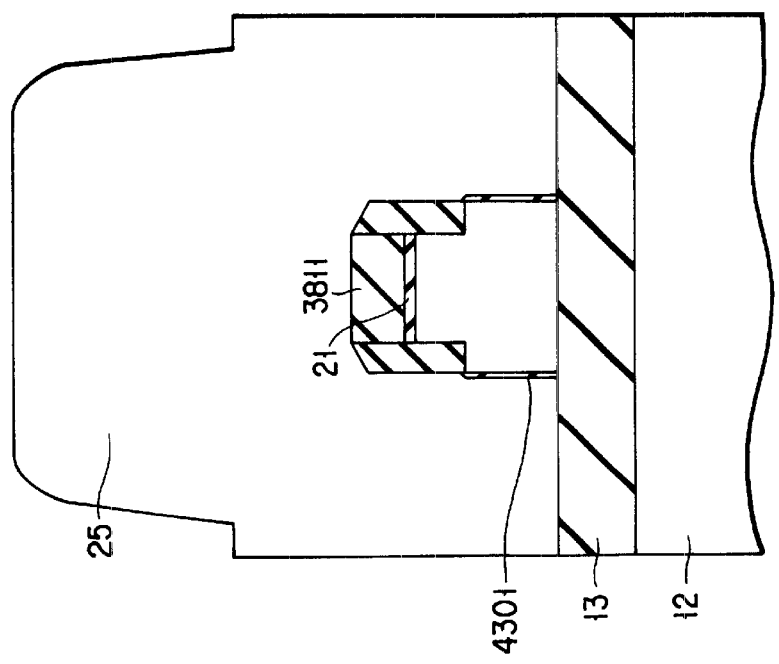

As shown in FIGS. 24E and 25E, an extension or deep-junction is formed in the side surface of the lower structure 14a of the Si-body by oblique ion implantation, thereby forming a source and drain 16 sandwiching two gate electrodes formed on the opposite side surfaces of the lower structure 14a of the Si-body.

When the width of the Si-body 14 and conditions of oblique ion implantation are adjusted, and activation is performed after impurity ions are implanted into the opposite side surfaces of the lower structure 14a of the Si-body, the source and drain diffusion layers formed on the side surfaces come into contact with each other.

Extension-n⁻ implantation conditions are, e.g., As, 15 keV, and $3\times10^{14}$ cm⁻². Deep-n⁺ diffusion layer implantation conditions are, e.g., As, 45 keV, and $3\times10^{15}$ cm⁻². The source and drain are also activated (1,000° C. at maximum) at this time.

After the source and drain 16 are formed, a high-temperature process at 600° C. or more is no longer present. Hence, as the gate insulating film of the MISFET, not only an $SiO_2$ film but also a high-permittivity film (high-k film) such as a $Ta_2O_5$ film, $TiO_2$ film, $HfO_2$ film, $ZrO_2$ film, or (Ba, Si)$TiO_3$ film can be used. As the gate electrode of the MISFET, a metal material can be used. When the gate insulating film is formed from a high-permittivity film, the gate electrode material need be selected in accordance with the used gate insulating film, and polysilicon, TiN, Al, W, Ru, or the like can be used. In many cases, a TiN or WN film is preferably formed between the gate insulating film and the gate electrode material as a barrier metal.

Figure 25F:
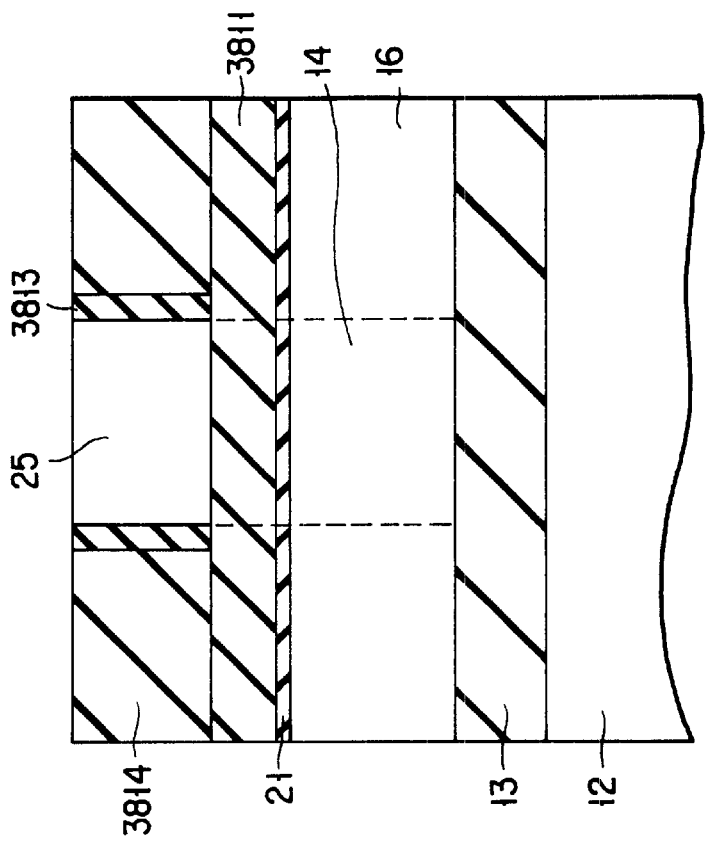
Figure 24F:
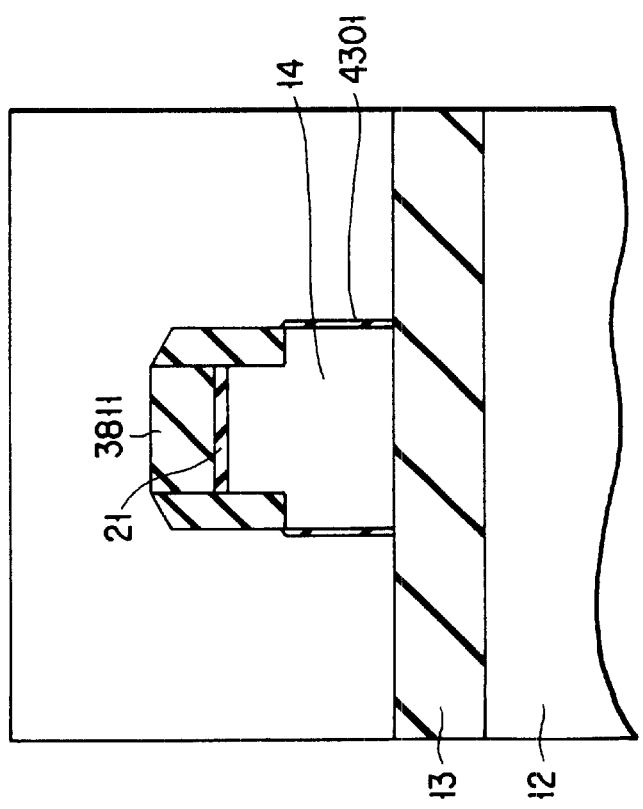

As shown in FIGS. 24F and 25F, a TEOS-$SiO_2$ film 3814 is deposited on the entire surface and planarized by CMP to expose the upper surface of the polysilicon film 25.

Figure 25G:
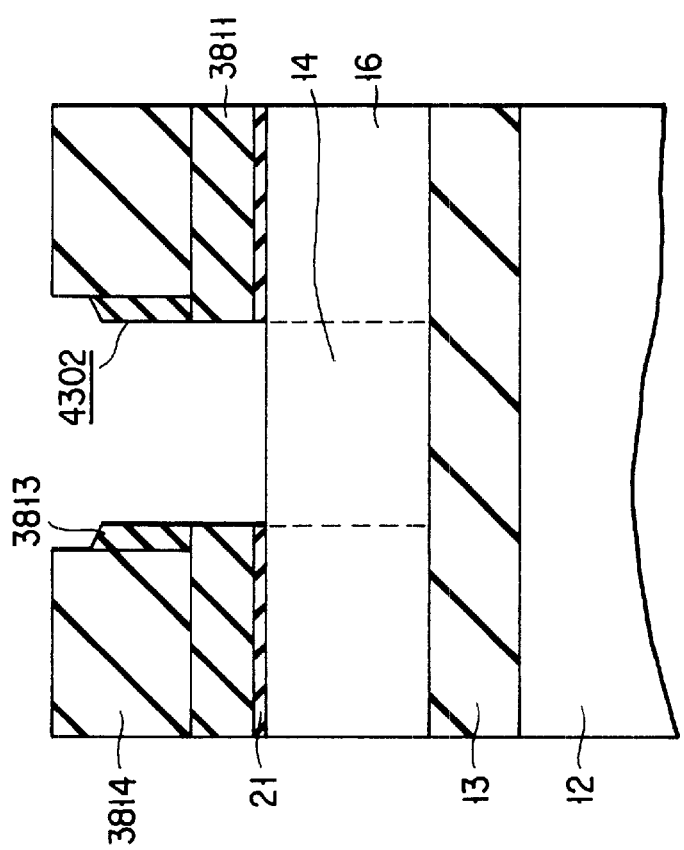
Figure 24G:
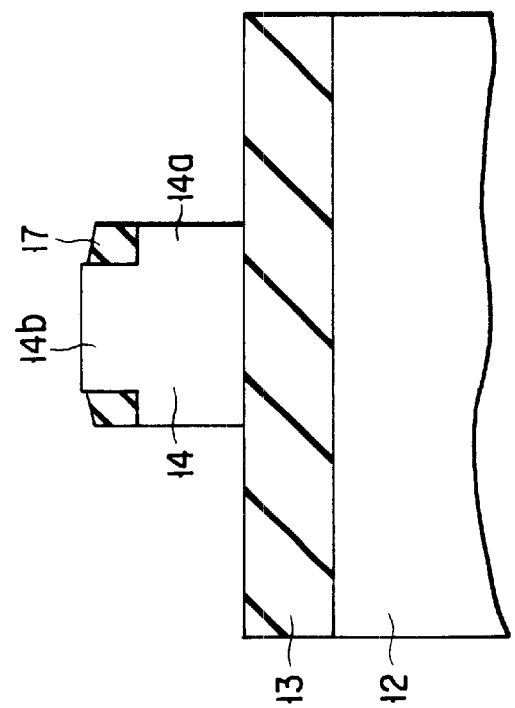

As shown in FIGS. 24G and 25G, the polysilicon film 25 is removed by CDE to form a trench 4302 in which the gate material is to be buried in the gate formation region. The process conditions at this time are set not to remove the $Si_3N_4$ film 3813 and sidewall insulating film 17 formed from the $Si_3N_4$ film. The $SiO_2$ films 21 and 4301 at the bottom portion of the trench 4302 are removed by HF-based wet etching.

Figure 25H:
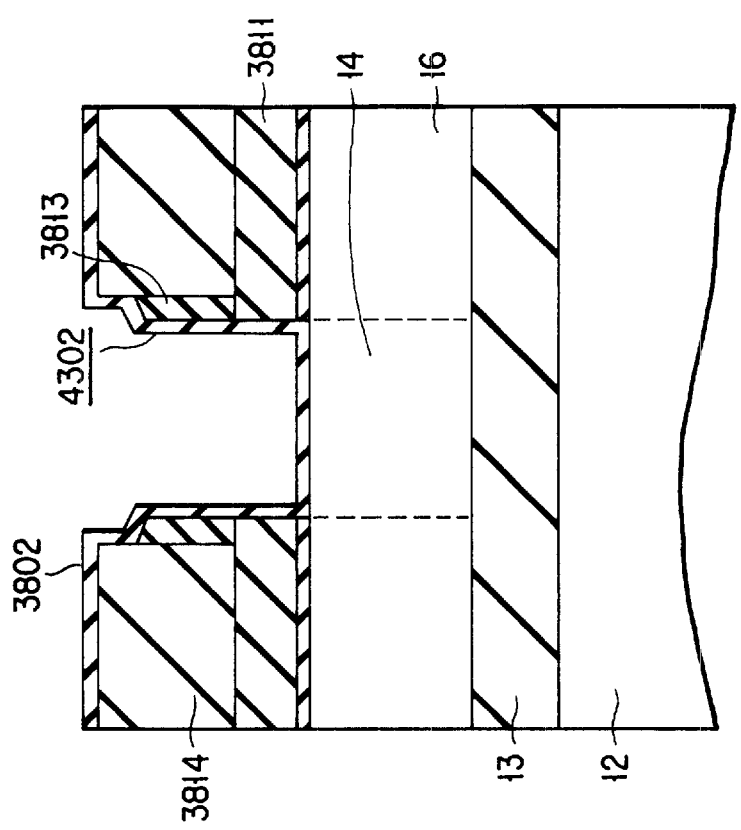
Figure 24H:
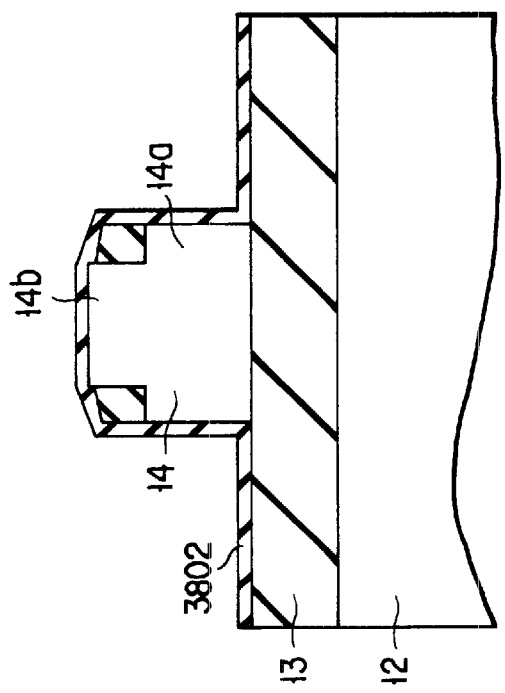
Figure 25I:
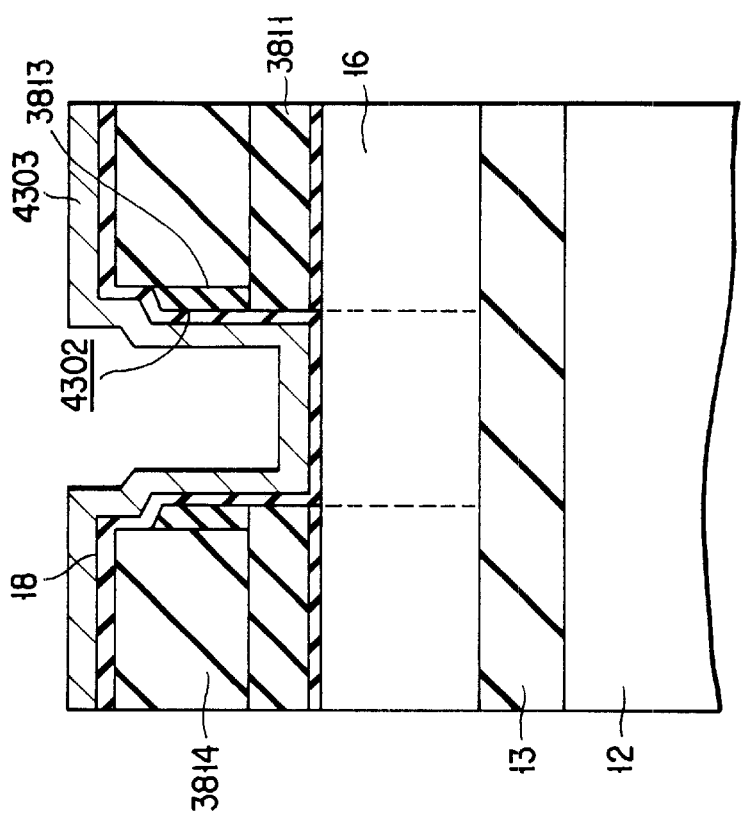
Figure 24I:
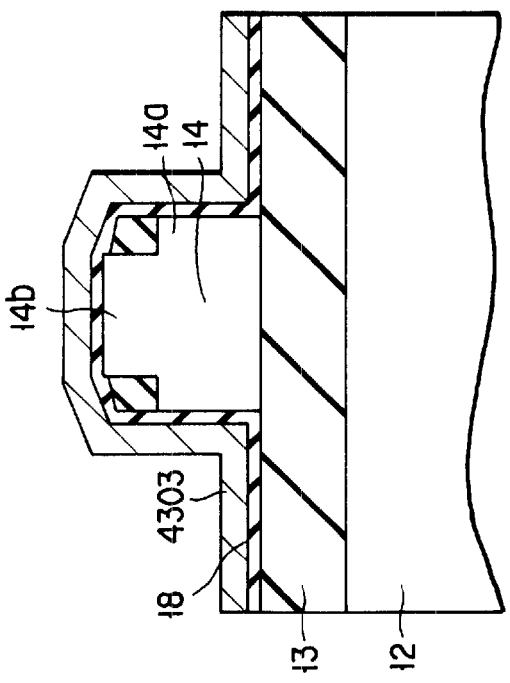
Figure 25J:
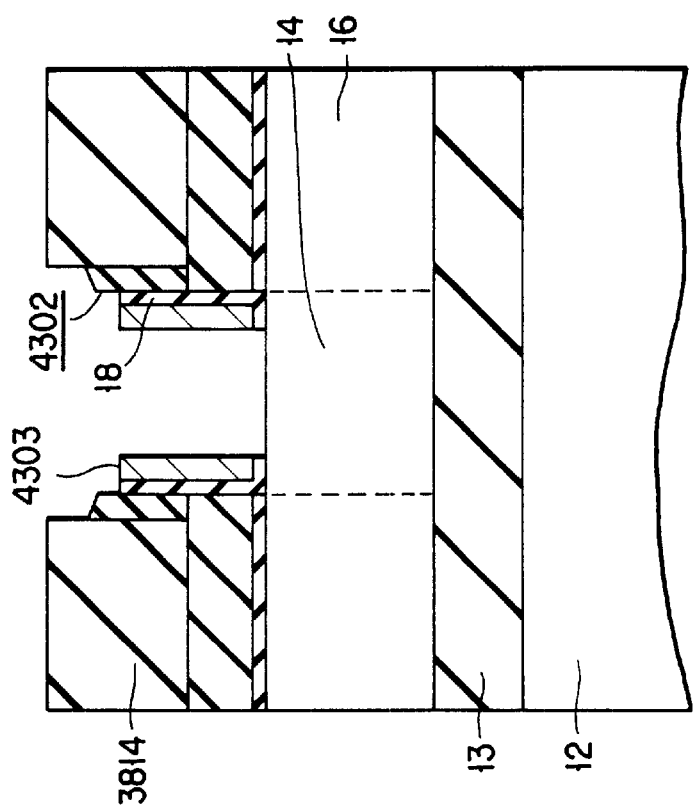
Figure 24J:
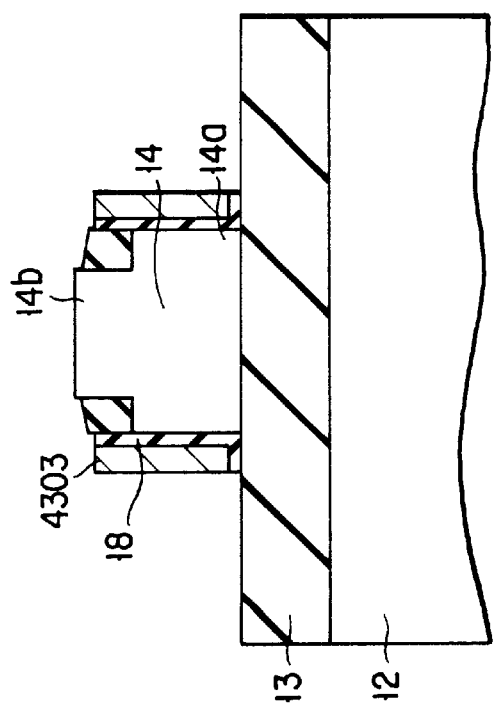

As shown in FIGS. 24H and 25H, the $Ta_2O_5$ film 3802 is formed by CVD as a gate insulating film. Next, as shown in FIGS. 24I and 25I, a 15-nm thick barrier metal TiN film 4303 is formed by CVD as a metal gate electrode. Next, as shown in FIGS. 24J and 25J, the TiN film 4303 and $Ta_2O_5$ film 3802 are etched by RIE to leave the $Ta_2O_5$ film 3802 and TiN film 4303 only on the sidewall of the trench 4302. The upper surface of the upper structure 14b of the Si-body is exposed. To electrically connect the gate and Si-body 14, ion implantation may be performed to form a p⁺-type diffusion layer in the upper surface of the upper structure 14b of the Si-body (not shown).

Figure 25K:
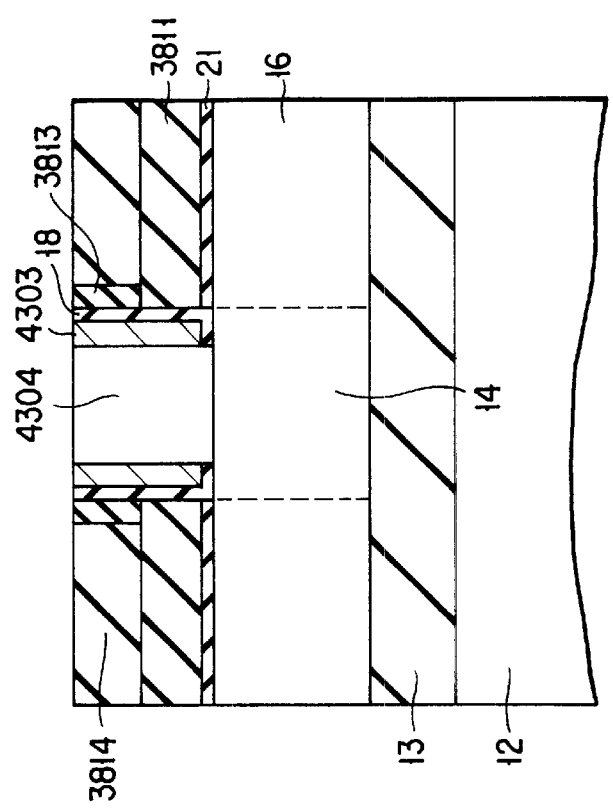
Figure 24K:
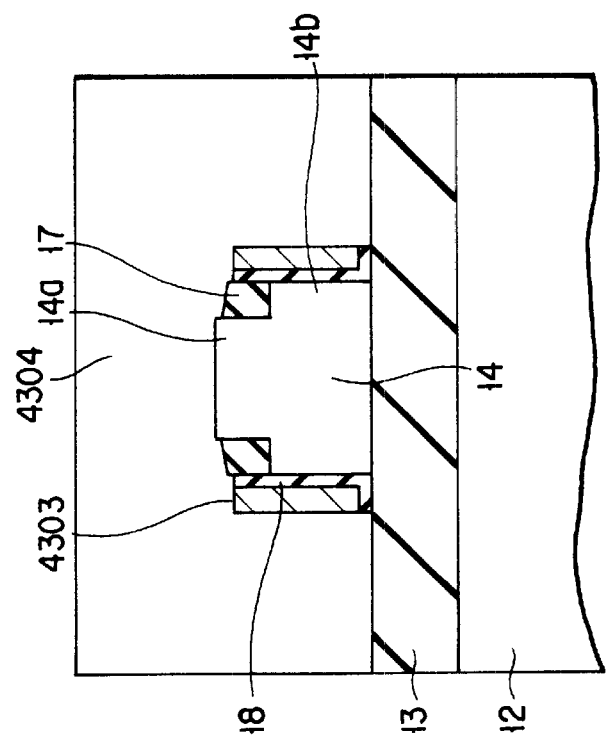
Figure 26A:
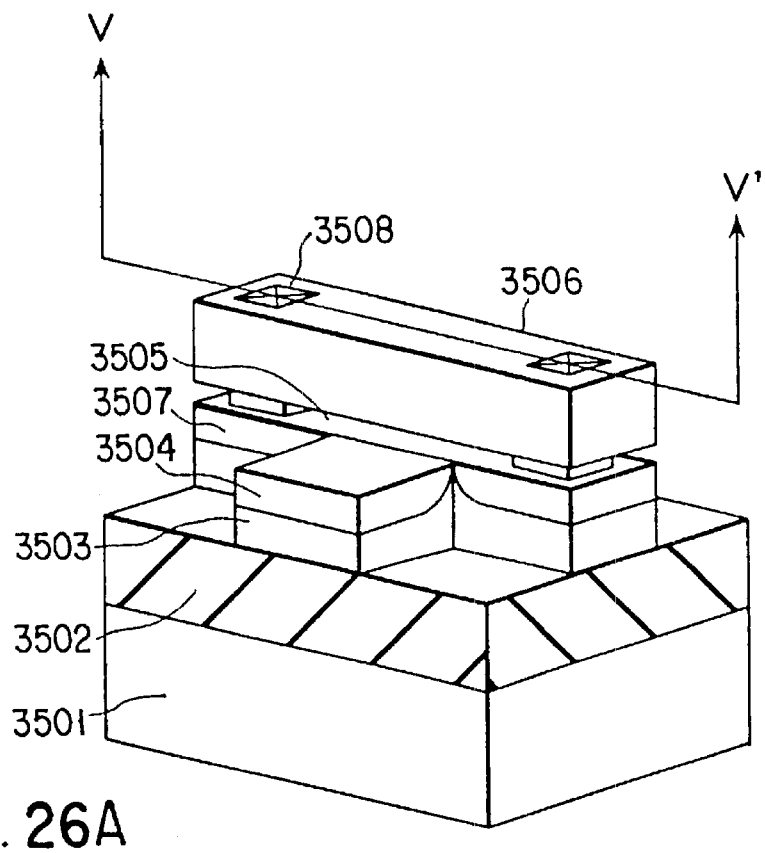
FIG. 26A is a perspective view showing the structure of a conventional DTMISFET.
Figure 26B:
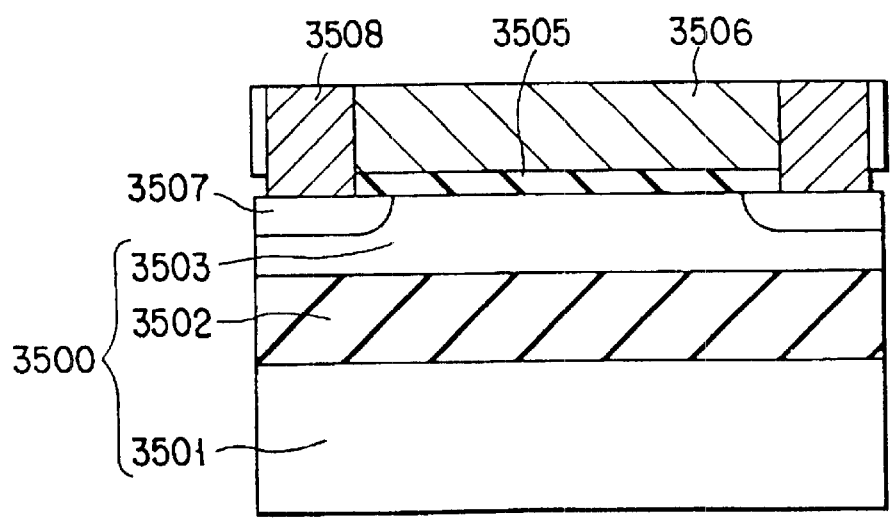
Figure 27:
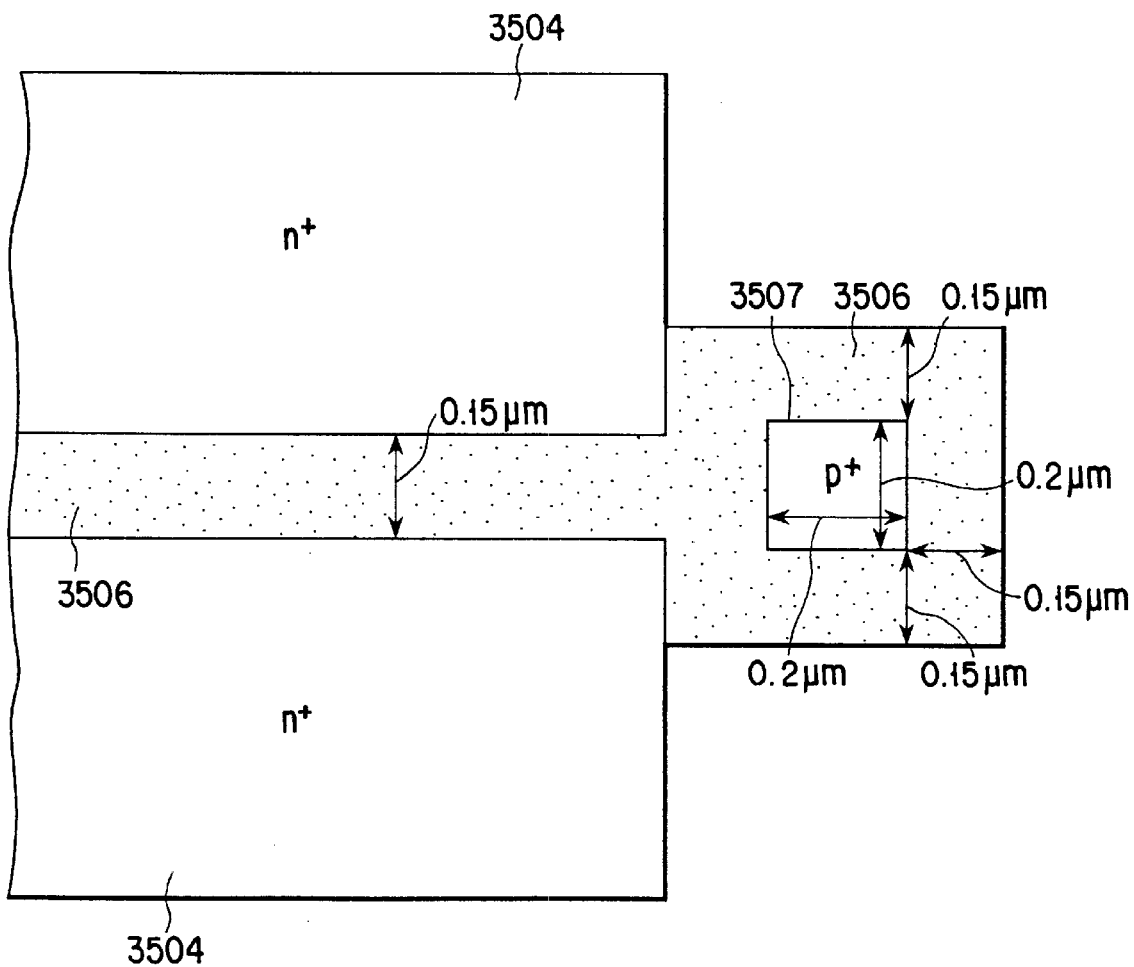
FIG. 27 is a plan view showing the connection portion between the gate and the well region of the DTMISFET shown in FIGS. 26A and 26B.

As shown in FIGS. 24K and 25K, a 400-nm thick W film 4304 is formed by CVD and planarized by CMP. With this process, the metal gates 4303 and 4304 are connected by self-alignment at part of the upper surface of the upper structure 14b of the Si-body, so MIS transistors are formed on part of the side surfaces of the lower structure 14a of the Si-body.

The process after formation of the metal gates 4303 and 4304 is the same as the normal LSI manufacturing process. A TEOS-based interlayer insulating film is deposited by CVD, contact holes are formed on the source and drain and the gate electrode, and upper metal interconnections are formed (not shown).

As described above, according to this embodiment, MOSFETs are formed on both side surfaces of the lower structure 14a of the Si-body, and the gate and Si-body are electrically connected on the upper surface of the upper structure of the Si-body. For this reason, the device occupation area can be largely reduced, and the device is easy to manufacture. In addition, according to this embodiment, the source and drain formed on both side surfaces of the island (wall)-shaped Si-body are formed such that the source and drain diffusion layers of the MIS transistor, which are formed on the opposite surfaces of the lower structure of the Si-body are formed with their bottom surfaces in contact with each other. For this reason, the p-n junction area is reduced, and the leakage current between the source/drain and the Si-body can be made much smaller than that of the conventional DTMISFET.

According to this embodiment, since the gate and Si-body can be connected by self-alignment, the area can be reduced, and the process can be simplified. In addition, since a DTMISFET is formed, low threshold voltage $V_{th}$ (0.2 V at maximum) that is suggested to be unrealizable by a MISFET using a metal gate with a midgap work function can be realized.

In this embodiment, the source and drain regions are formed to sandwich the two gate electrodes formed on the side portions of the lower structure. However, each gate electrode may have a source and drain. In this case, although the leakage current cannot be reduced, device area reduction and process simplification as objects of the present invention can be achieved.

The present invention is not limited to the above embodiments, and various changes and modifications can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device in which a gate electrode of a MISFET formed on a semiconductor substrate is electrically connected to a well region under a channel of said MISFET;

wherein said MISFET is formed in an island-shaped element region formed on said semiconductor substrate, the gate electrode of the MSFET contains a metallic material, and electrical connection between said gate electrode of said MISFET and the well region in said semiconductor substrate are electrically connected on the side of the island-shaped element.

2. A semiconductor device comprising:

a semiconductor substrate including an island-shaped element region comprised of a lower structure and an upper structure formed on said lower structure and having a smaller cross-sectional area parallel to a surface of said substrate than that of said lower structure;

a gate insulating film formed on an upper surface of said upper structure of the element;

a sidewall insulating film formed on an upper surface of said lower structure and on a side surface of said upper structure of the element; and a gate electrode connected to an upper surface of said gate insulating film, an upper surface of said sidewall insulating film, and a side surface of said lower structure of the element.

3. A device according to claim 2, wherein said gate electrode is composed of a metal material.

4. A semiconductor device, comprising:

a semiconductor substrate including an island-shaped element region composed of a lower structure and an upper structure formed on said lower structure and having a smaller cross-sectional area parallel to a surface of said substrate than that of said lower structure;

a gate insulating film formed on an upper surface of said upper structure of the element;

a gate electrode formed on said gate insulating film;

a sidewall insulating film formed on a side surface of said upper structure of the element region and a side surface of said gate electrode so as to have an upper surface lower than an upper surface of said gate electrode; and a contact electrode formed on a side surface of said lower structure of the element region and a side surface of said element sidewall insulating film and electrically connected to the side surfaces of said gate electrode and said lower structure of the element.

5. A semiconductor device according to claim 4, wherein said gate electrode is composed of a metal material.

\* \* \* \* \*